United States Patent
Masuoka et al.

(10) Patent No.: US 9,536,927 B2
(45) Date of Patent: Jan. 3, 2017

(54) METHOD FOR PRODUCING SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD, Peninsula Plaza (SG)

( * ) Notice: Subject to any disclaimer, the term of this patent is extended or adjusted under 35 U.S.C. 154(b) by 0 days.

(21) Appl. No.: 15/222,334

(22) Filed: Jul. 28, 2016

(65) Prior Publication Data

US 2016/0336377 A1     Nov. 17, 2016

Related U.S. Application Data

(60) Continuation of application No. 14/959,902, filed on Dec. 4, 2015, now abandoned, which is a division of
(Continued)

(51) Int. Cl.
*H01L 21/00* (2006.01)
*H01L 21/336* (2006.01)
(Continued)

(52) U.S. Cl.
CPC ..... *H01L 27/2454* (2013.01); *H01L 29/42392* (2013.01); *H01L 29/66545* (2013.01);
(Continued)

(58) Field of Classification Search
CPC ............. H01L 29/66545; H01L 29/66795; H01L 29/785; H01L 29/7889; H01L 29/7827; H01L 29/66666; H01L 27/0924; H01L 27/10826; H01L 27/10879; H01L 27/11521; H01L 27/2454
(Continued)

(56) References Cited

U.S. PATENT DOCUMENTS 6,891,234 B1    5/2005  Connelly et al.
8,735,971 B2    5/2014  Masuoka et al.
(Continued)

FOREIGN PATENT DOCUMENTS

JP    10-209404 A     8/1998
JP    11-297984      10/1999
(Continued)

OTHER PUBLICATIONS

International Search Report for PCT/JP2013/080721 dated Nov. 13, 2013, 4 pages.
(Continued)

*Primary Examiner* — Hsien Ming Lee
(74) *Attorney, Agent, or Firm* — Brinks Gilson & Lione

(57) ABSTRACT

A method for producing a semiconductor device includes forming a fin-shaped semiconductor layer on a semiconductor substrate and a first pillar-shaped semiconductor layer, a first dummy gate layer and a second pillar-shaped semiconductor layer, and a second dummy gate layer. Third and fourth dummy gate layers are formed on sidewalls of the first dummy layer gate, the first pillar-shaped semiconductor layer, the second dummy gate layer and the second pillar-shaped semiconductor layer. An interlayer insulating film is deposited, the dummy gate layers are removed, and a gate insulator is formed film around the first and second pillar-shaped semiconductor layers. A first metal is deposited and a gate electrode and a gate line are formed around the first pillar-shaped semiconductor layer. Second and third metals are deposited and a first contact and a pillar-shaped resistance-changing layer, a lower electrode, and a reset gate are formed.

6 Claims, 62 Drawing Sheets

Related U.S. Application Data application No. 14/482,750, filed on Sep. 10, 2014, now Pat. No. 9,252,190, which is a continuation of application No. PCT/JP2013/080721, filed on Nov. 13, 2013.

(51) Int. Cl.
   *H01L 29/76* (2006.01)
   *H01L 27/24* (2006.01)
   *H01L 29/66* (2006.01)
   *H01L 29/786* (2006.01)
   *H01L 29/423* (2006.01)
   *H01L 45/00* (2006.01)

(52) U.S. Cl.
   CPC .. *H01L 29/66666* (2013.01); *H01L 29/78642* (2013.01); *H01L 45/065* (2013.01); *H01L 45/126* (2013.01); *H01L 45/1233* (2013.01); *H01L 45/144* (2013.01); *H01L 45/1608* (2013.01)

(58) Field of Classification Search
   USPC ........ 438/149, 156, 197, 279, 286; 257/288, 257/350, 401, 618
   See application file for complete search history.

(56) References Cited

U.S. PATENT DOCUMENTS

| | | |
|---|---|---|
| 8,823,085 B2 | 9/2014 | Masuoka et al. |
| 8,829,619 B2 | 9/2014 | Masuoka et al. |
| 2004/0262681 A1 | 12/2004 | Masuoka et al. |
| 2009/0283737 A1 | 11/2009 | Kiyotoshi |
| 2010/0290277 A1 | 11/2010 | Happ et al. |
| 2011/0006278 A1 | 1/2011 | Takahashi |
| 2011/0253965 A1 | 10/2011 | Liu |
| 2012/0243307 A1 | 9/2012 | Takashima |
| 2015/0123063 A1 | 5/2015 | Masuoka et al. |
| 2015/0144866 A1 | 5/2015 | Masuoka et al. |

FOREIGN PATENT DOCUMENTS

| | | |
|---|---|---|
| JP | 2004-356314 | 12/2004 |
| JP | 2005-260014 A | 9/2005 |
| JP | 2008-21781 A | 1/2008 |
| JP | 2009-123847 A | 6/2009 |
| JP | 2009-283498 | 12/2009 |
| JP | 2010-10508 A | 1/2010 |
| JP | 2012-185884 | 9/2012 |
| JP | 2012-204404 | 10/2012 |
| JP | 2013-528935 | 7/2013 |
| WO | WO 2009/096363 | 8/2009 |
| WO | WO 2013/038553 A1 | 3/2013 |

OTHER PUBLICATIONS

Mistry et al., "A 45nm Logic Technology with High-k+Metal Gate Transistors, Strained Silicon, 9 Cu Interconnect Layers, 193nm Dry Patterning, and 100% Pb-free Packaging", IEEE, pp. 247-250, 2007.
Office Action for U.S. Appl. No. 14/482,750 dated Jul. 29, 2015, 11 pages.
Notice of Allowance for U.S. Appl. No. 14/482,750 dated Nov. 3, 2015, 9 pages.
Office Action for U.S. Appl. No. 14/960,706, dated Jan. 28, 2016, 7 pages.
Notice of Allowance for U.S. Appl. No. 14/960,706, dated Apr. 26, 2016, 7 pages.
Office Action for U.S. Appl. No. 14/959,902, dated Jan. 29, 2016, 20 pages.
Notice of Allowance for U.S. Appl. No. 14/959,902, dated May 23, 2016, 8 pages.
English translation of International Preliminary Report on Patentability in corresponding International Application No. PCT/JP203/080721, date May 26, 2016, 7 pages.

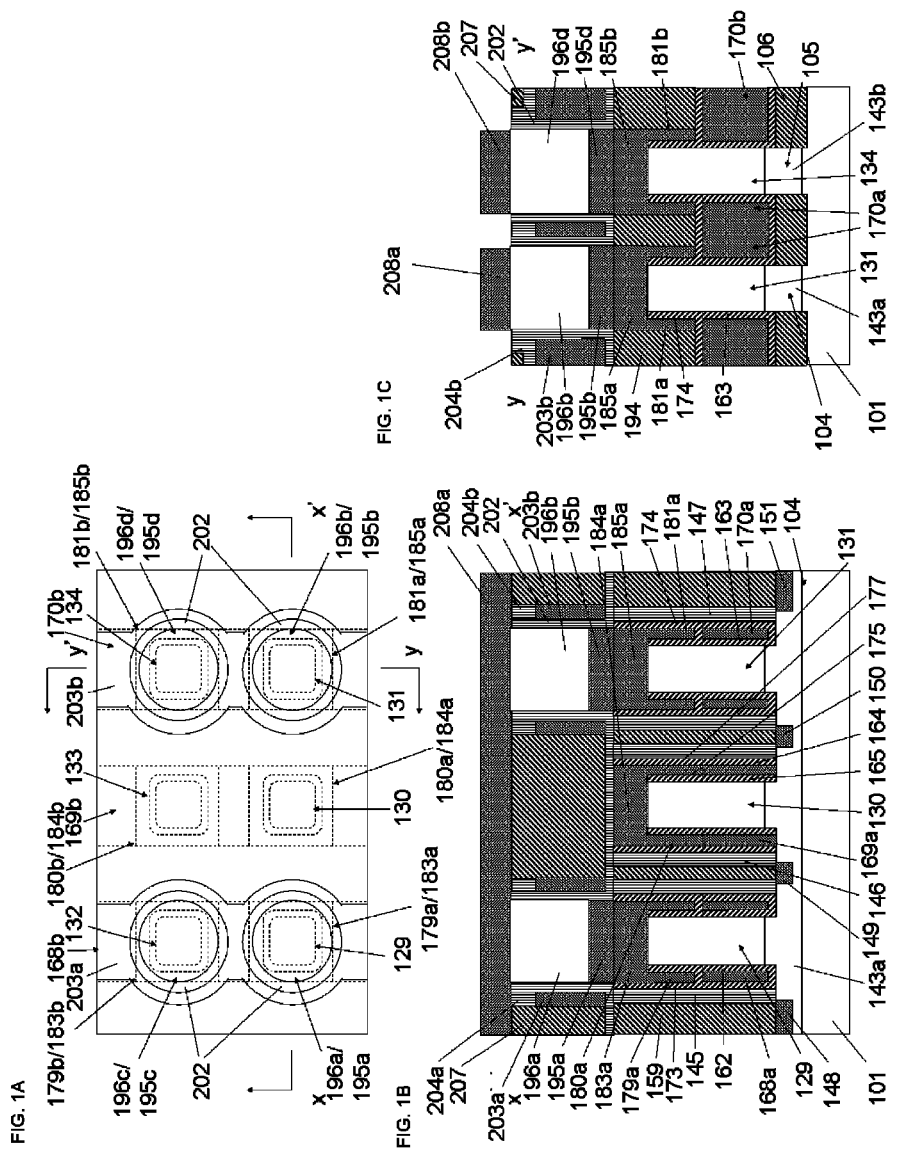

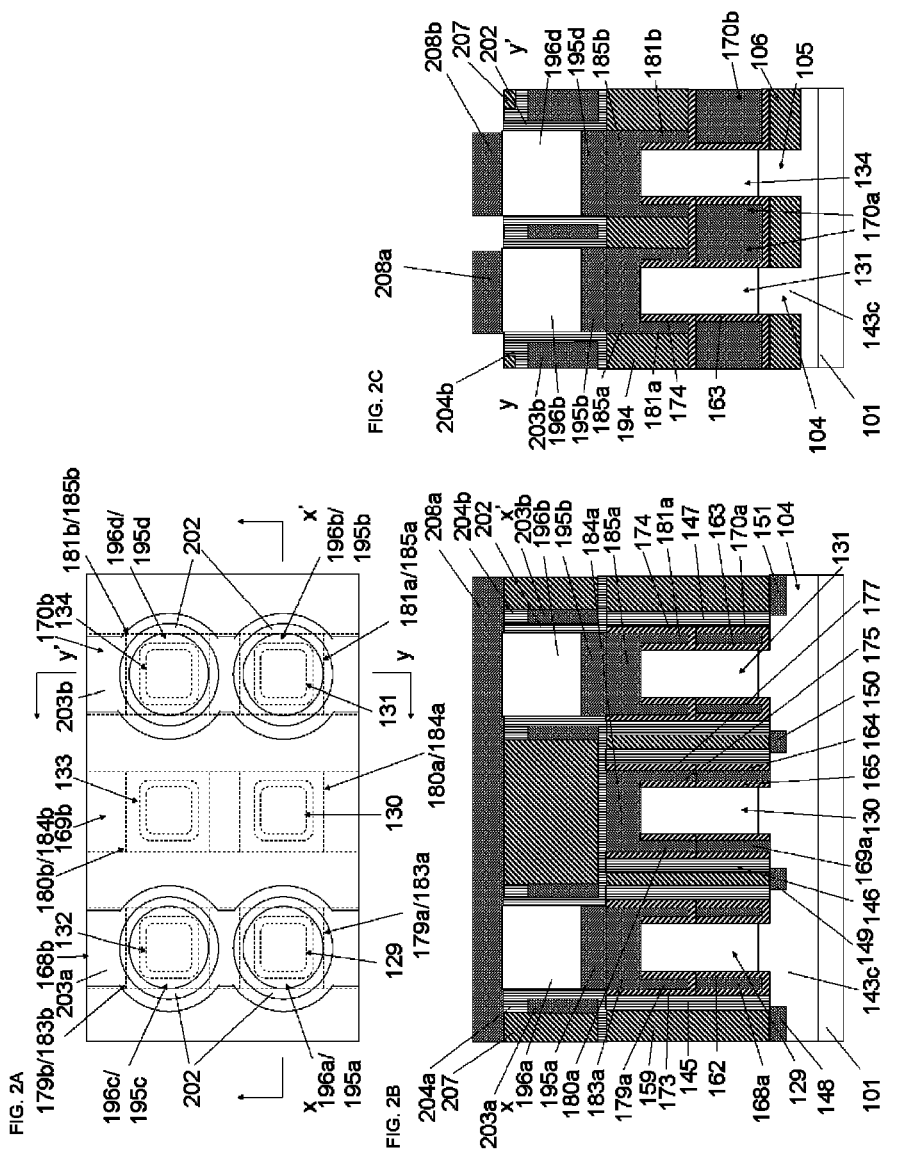

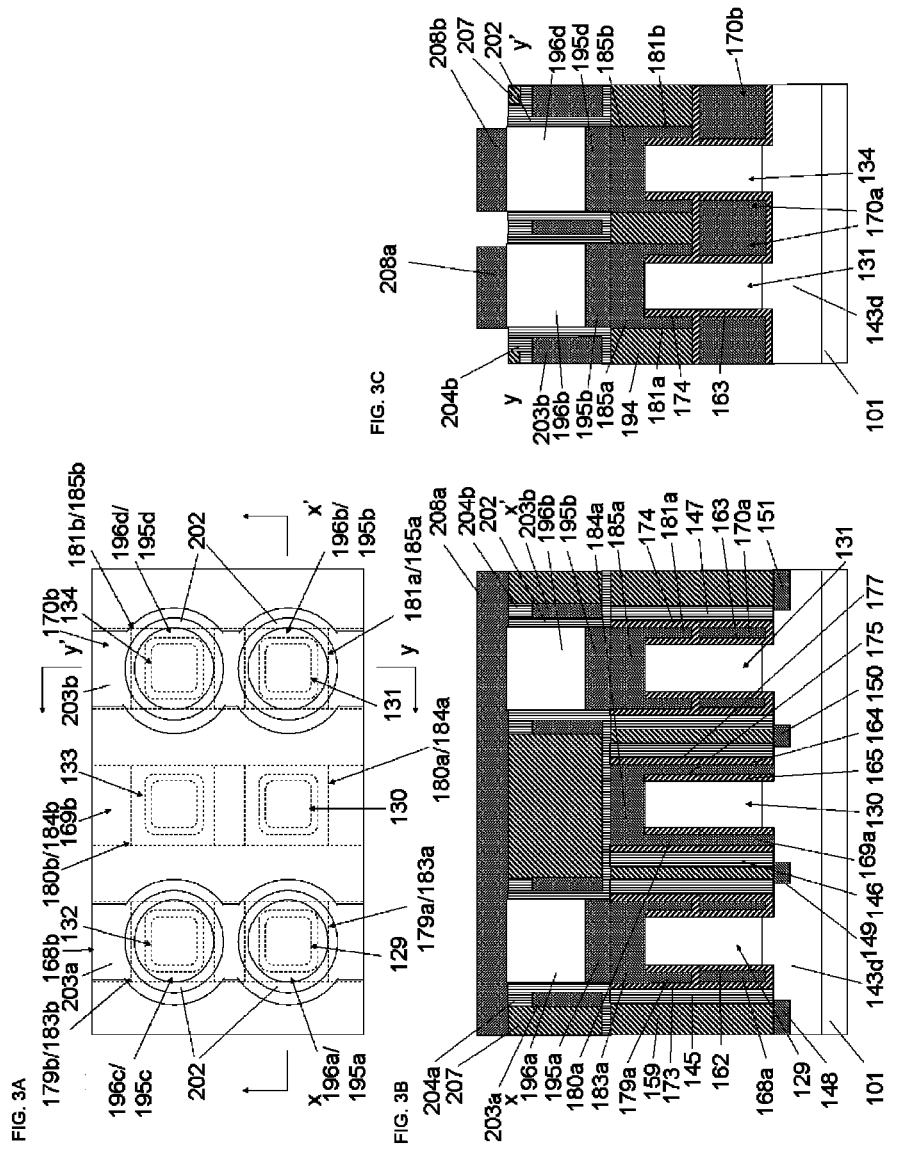

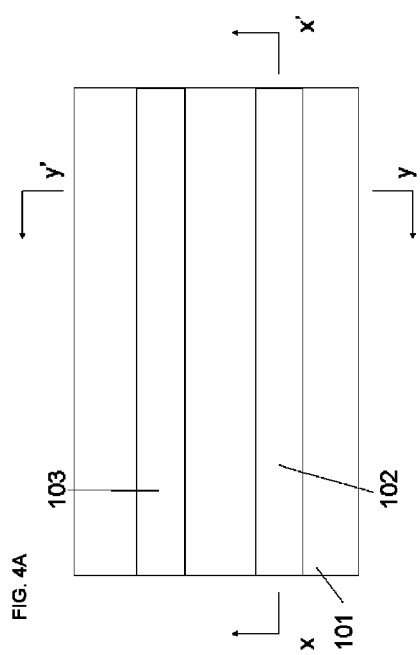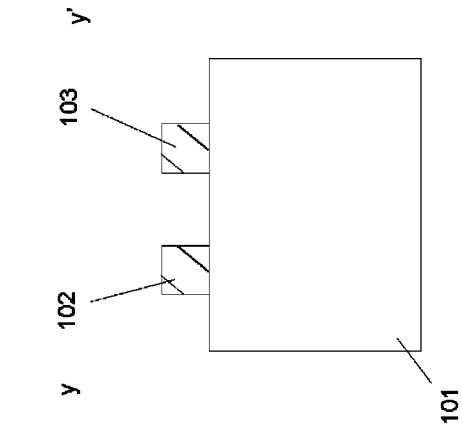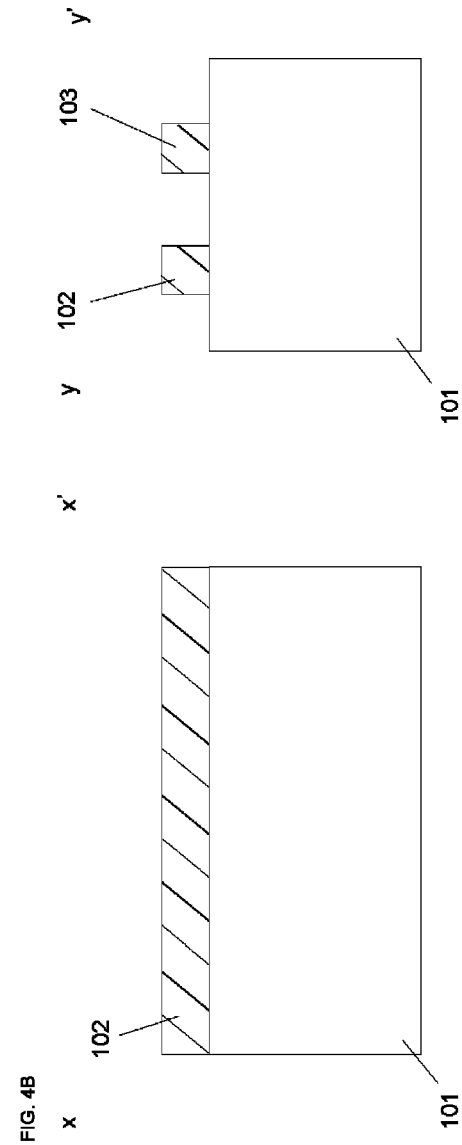

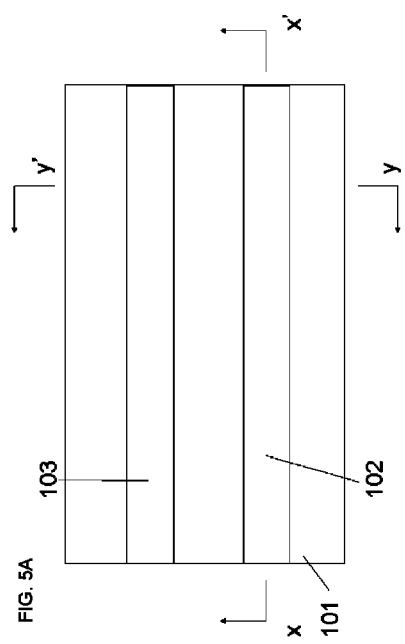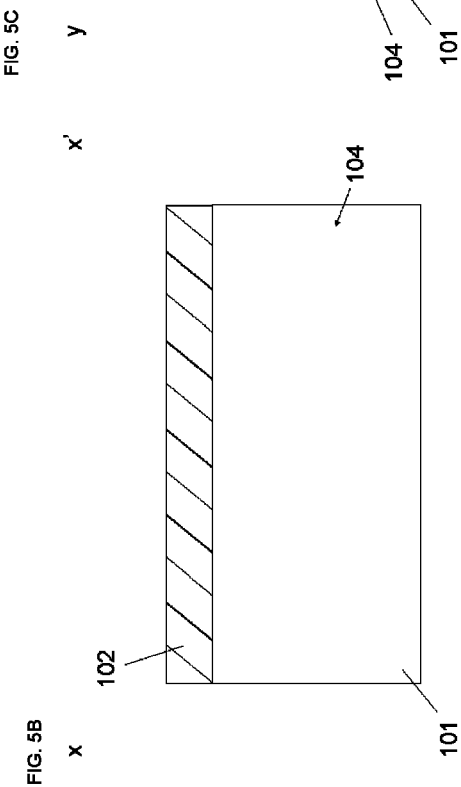

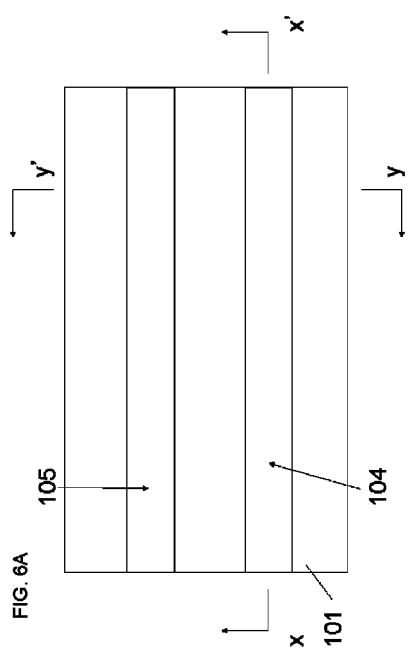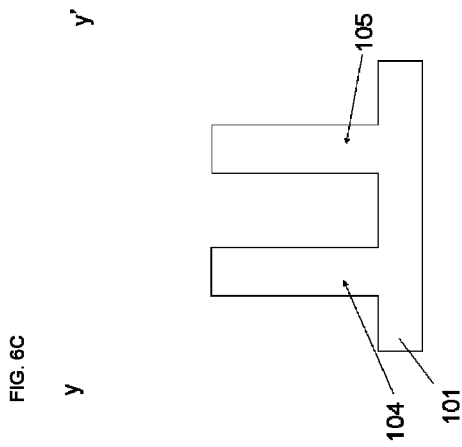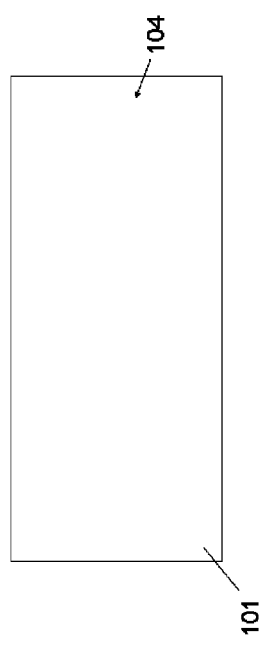

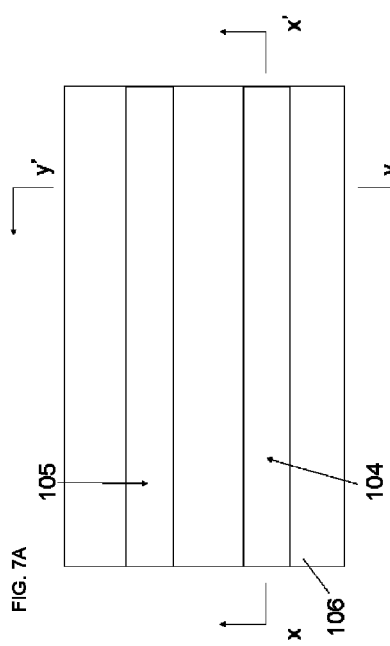
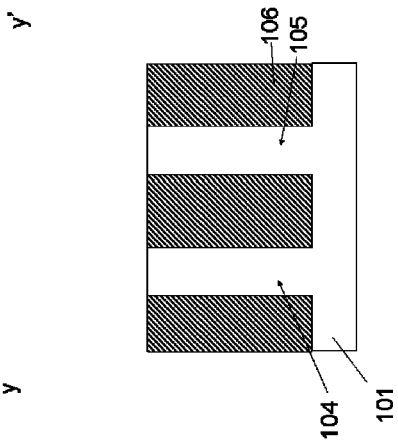
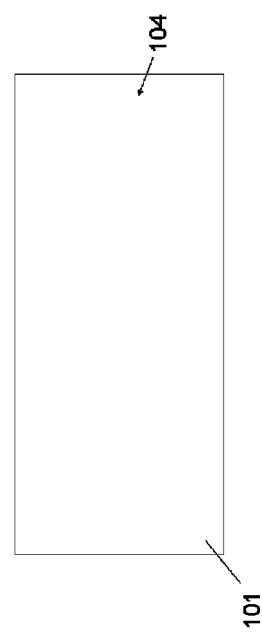
FIG. 7A
FIG. 7B
FIG. 7C

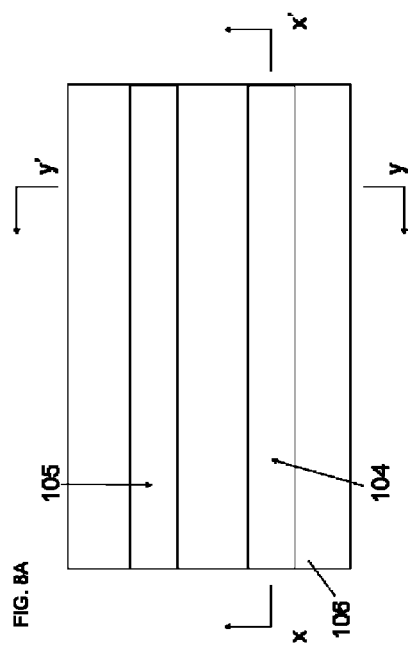
FIG. 8A
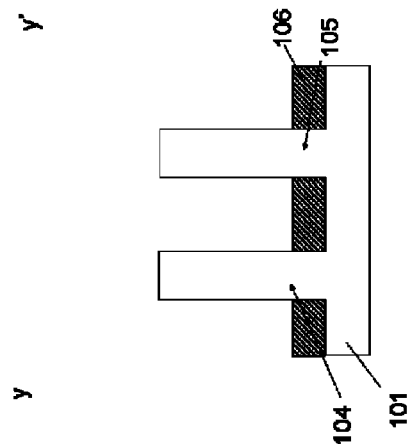
FIG. 8C
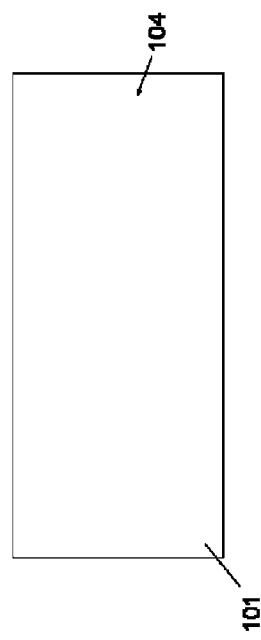
FIG. 8B

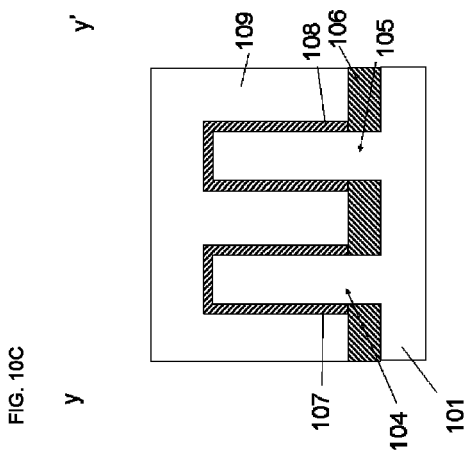
FIG. 10C
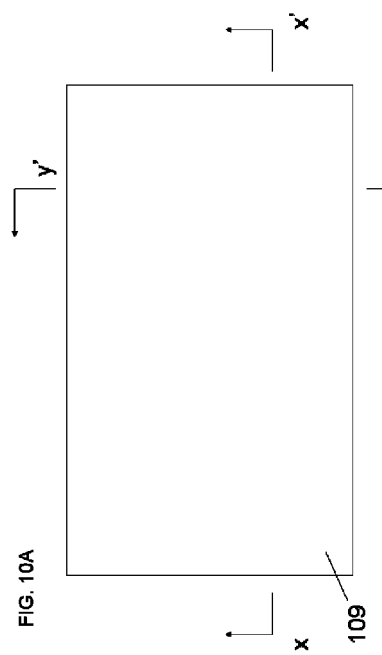
FIG. 10A
FIG. 10B

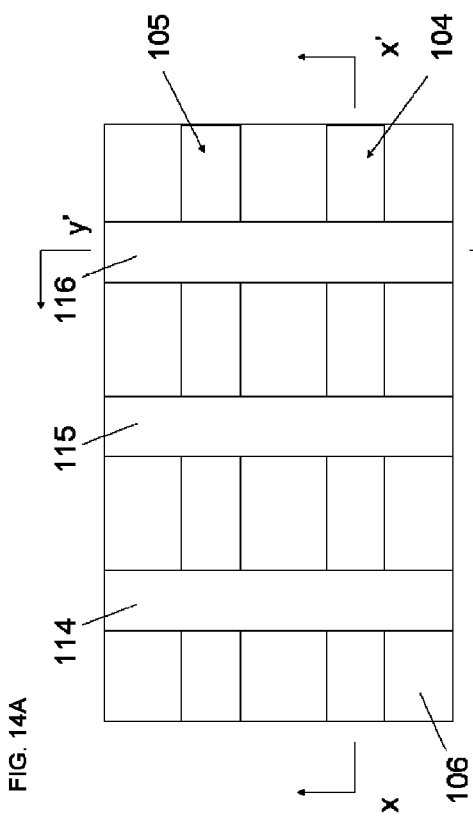
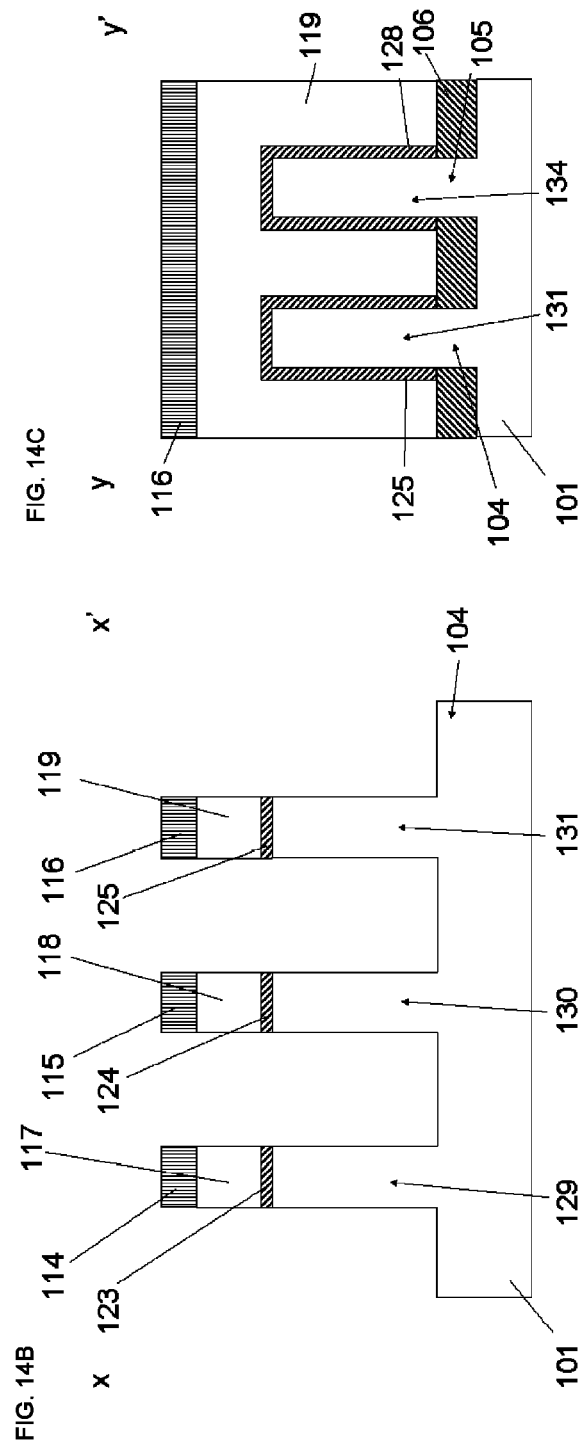
FIG. 14A
FIG. 14B
FIG. 14C

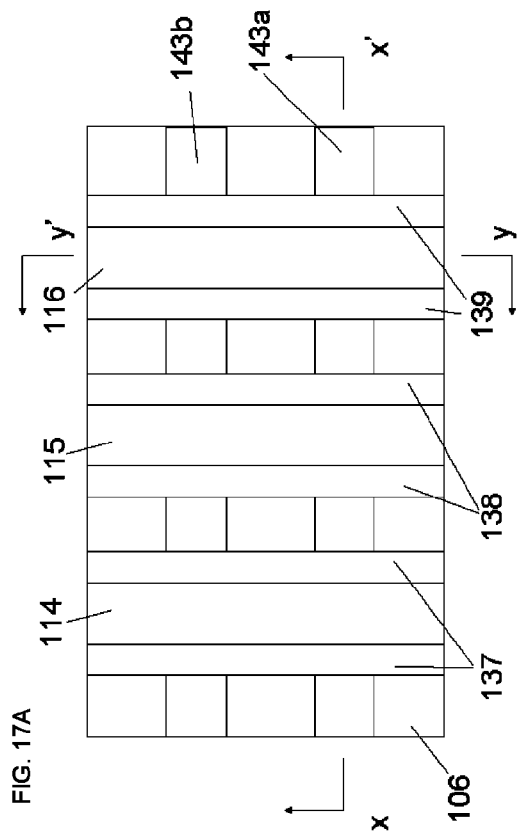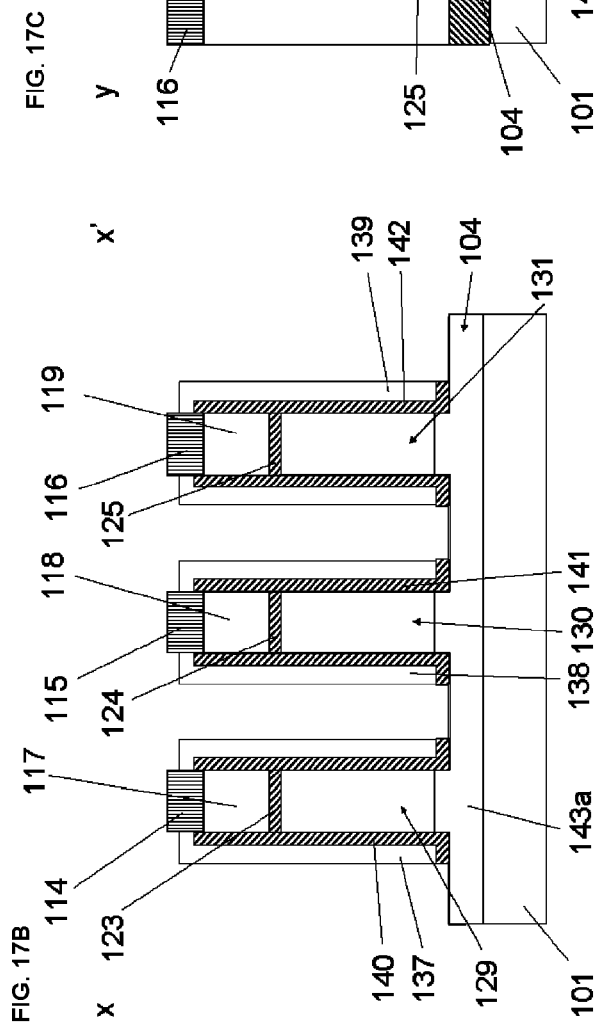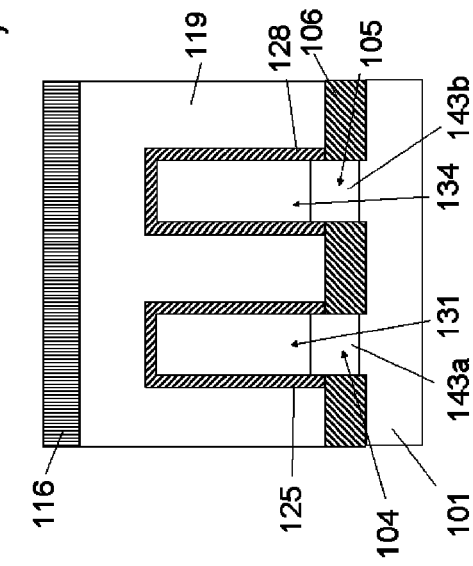
FIG. 17A
FIG. 17B
FIG. 17C

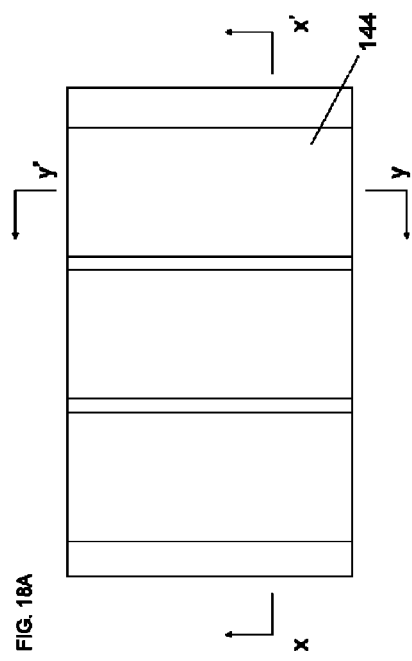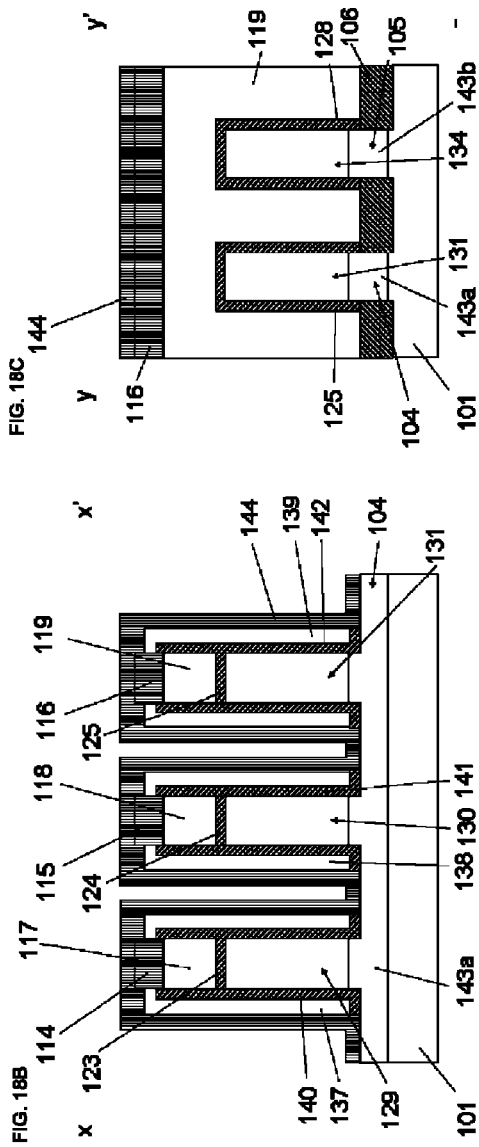

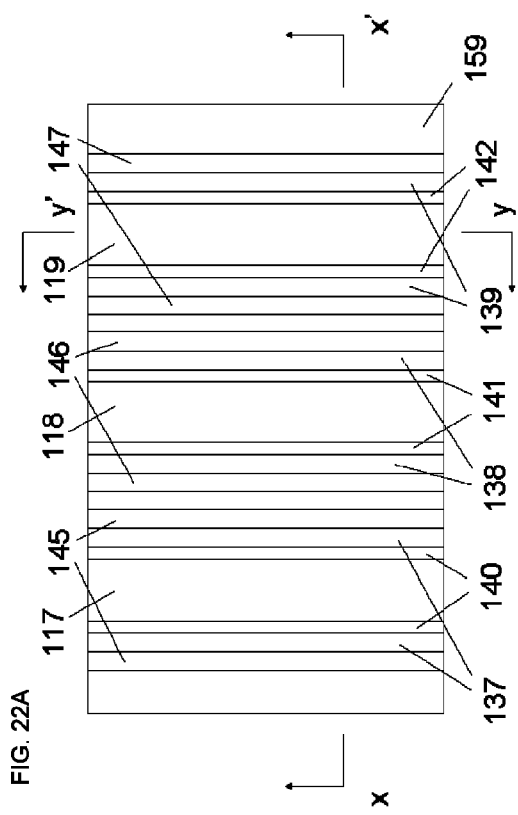
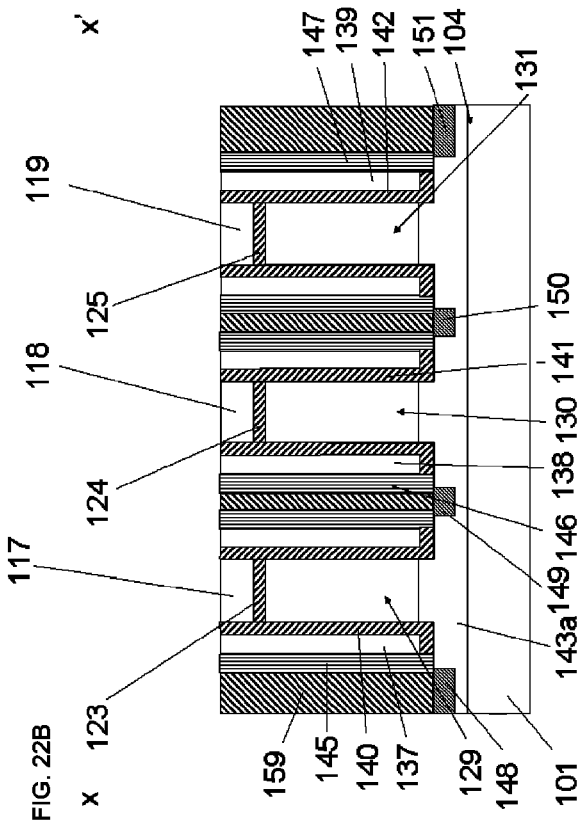
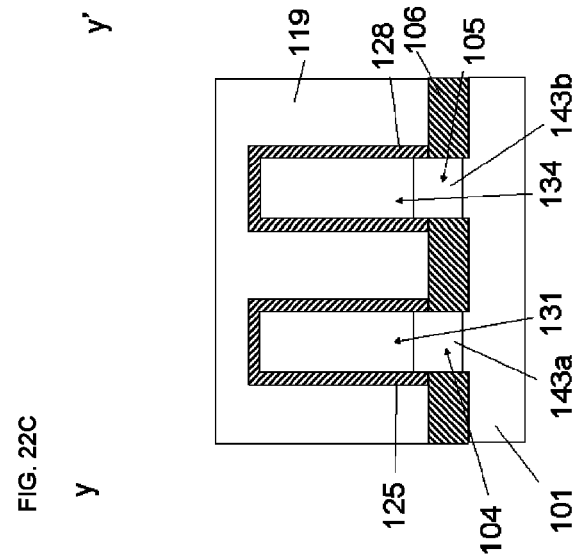
FIG. 22A
FIG. 22B
FIG. 22C

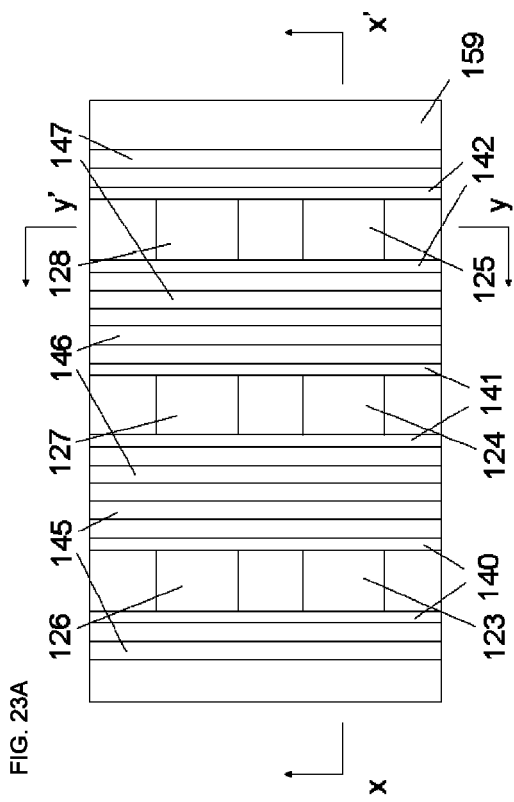
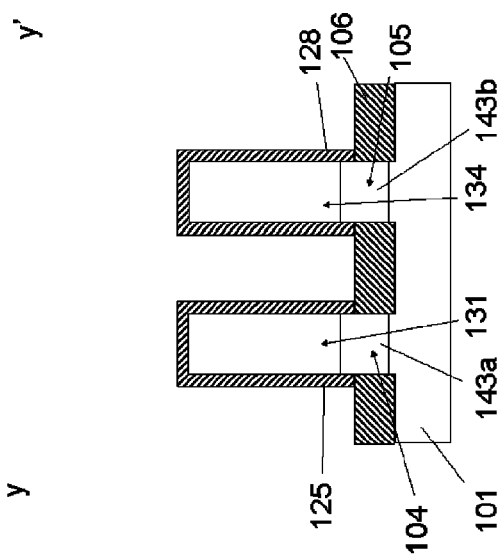
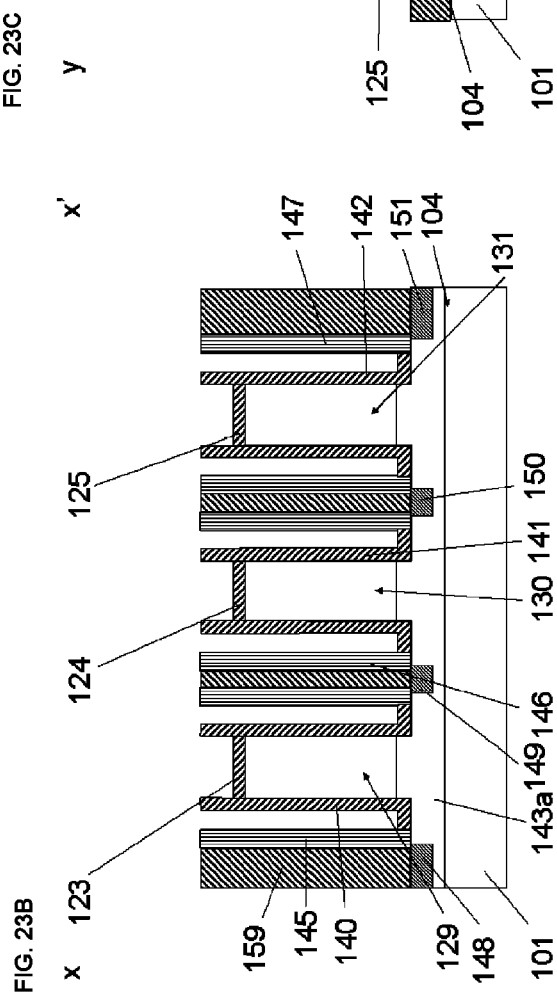

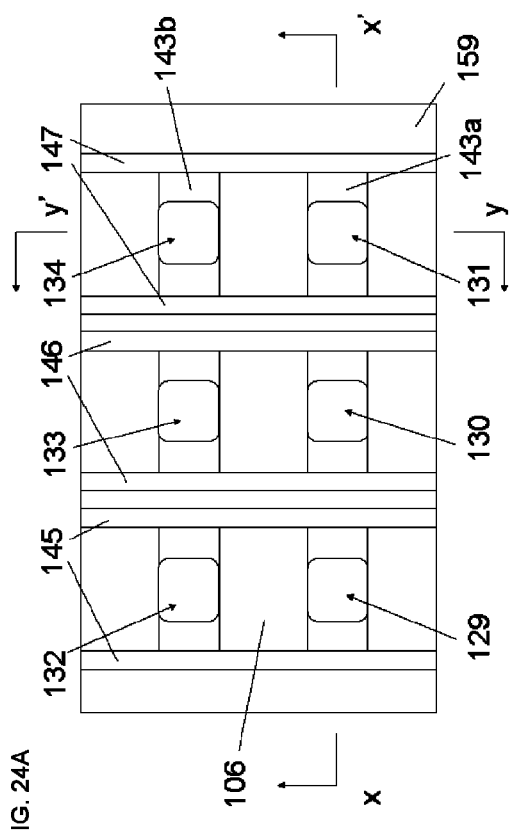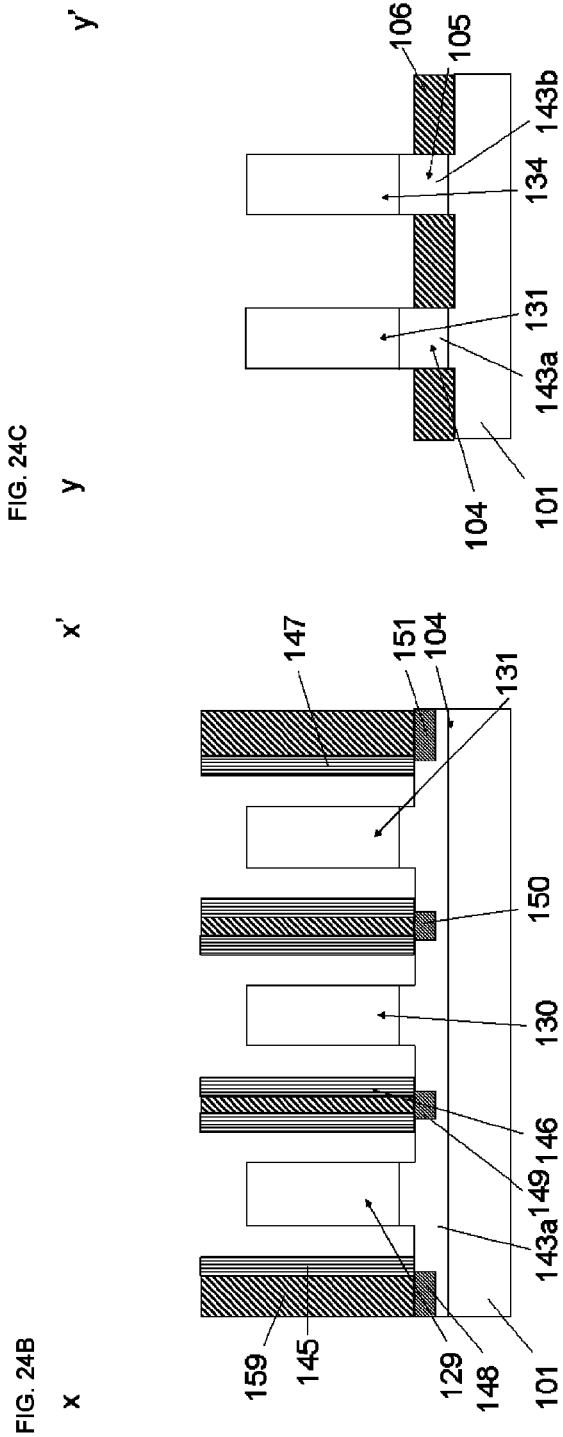

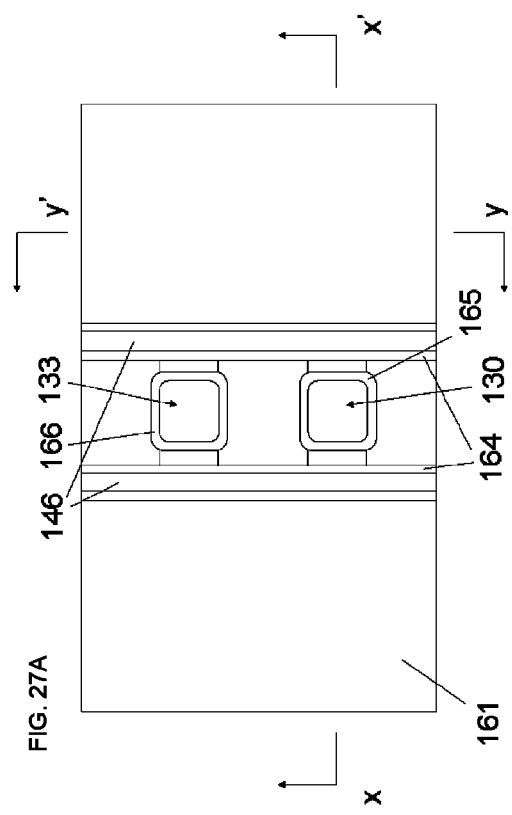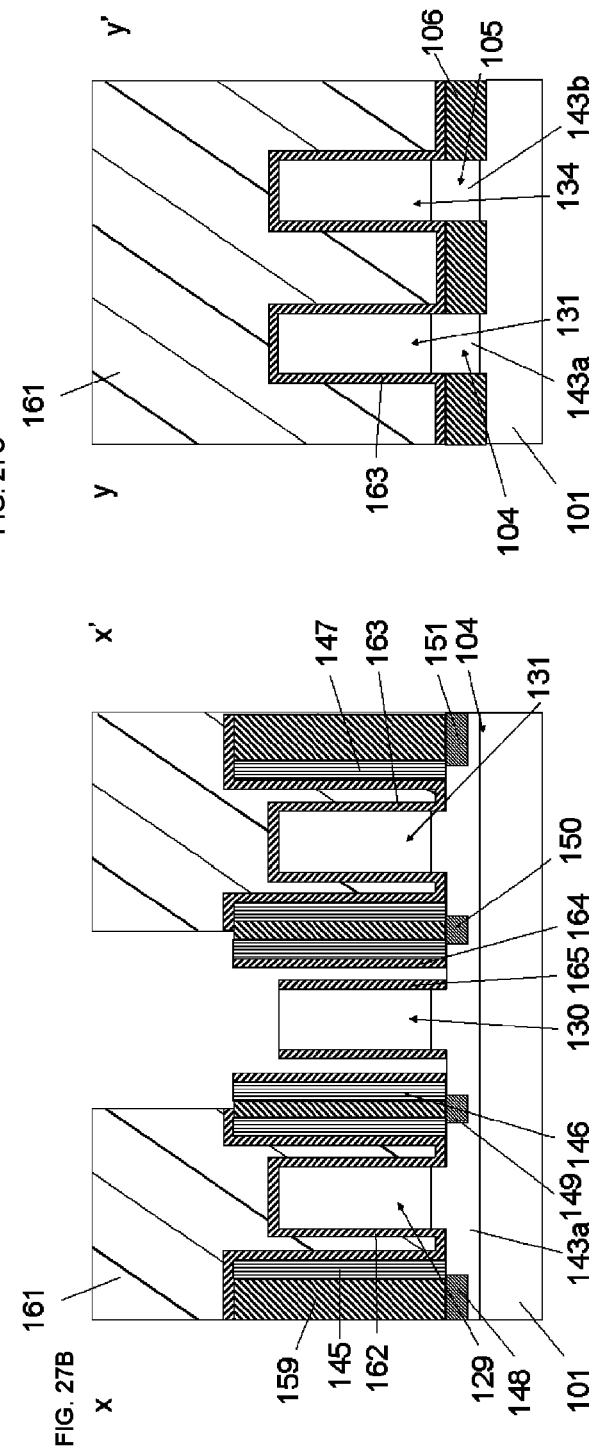

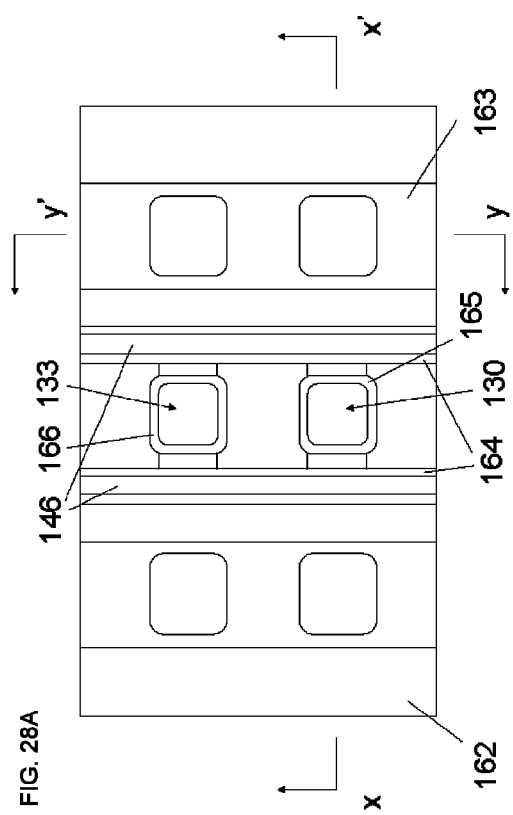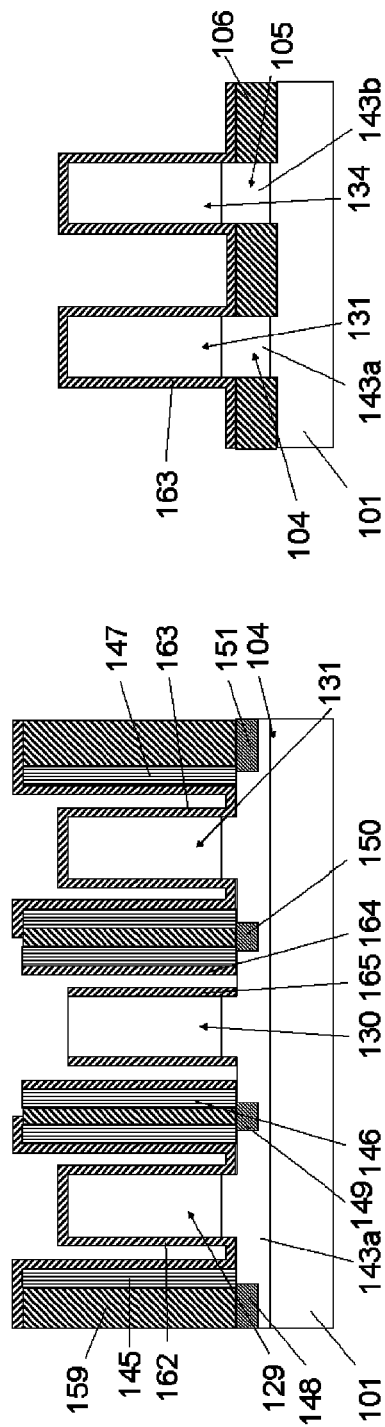

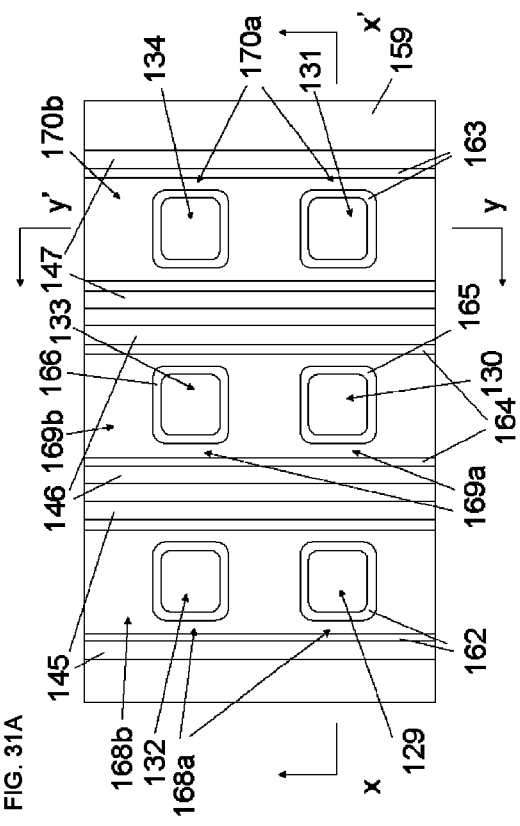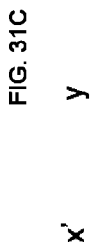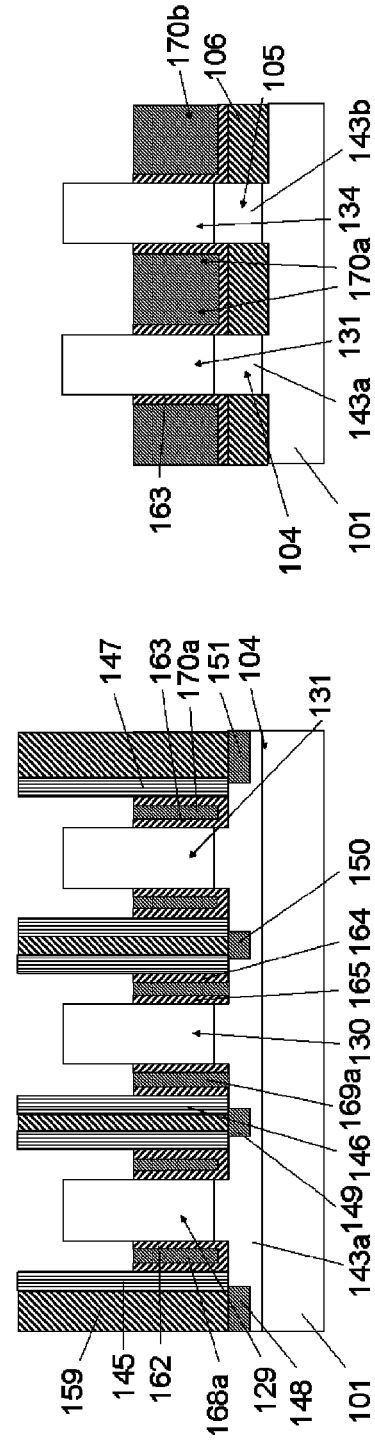

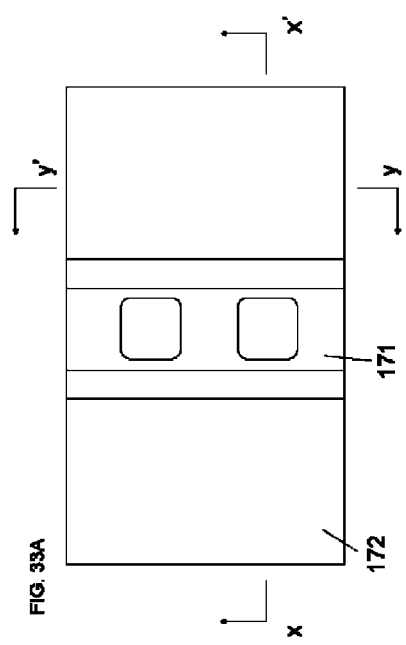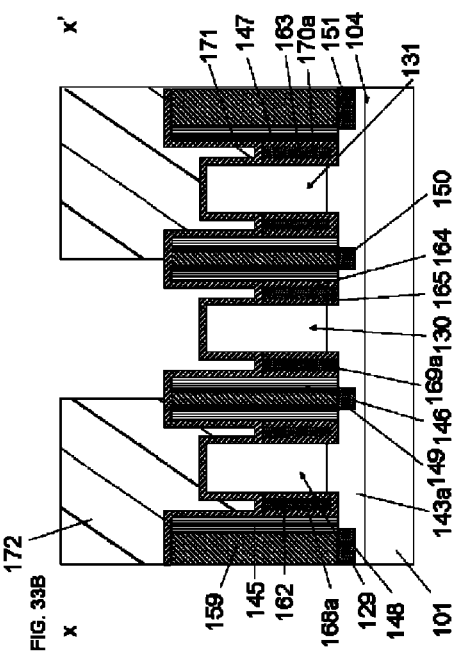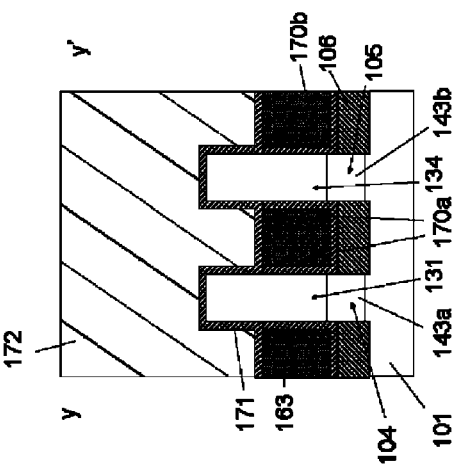

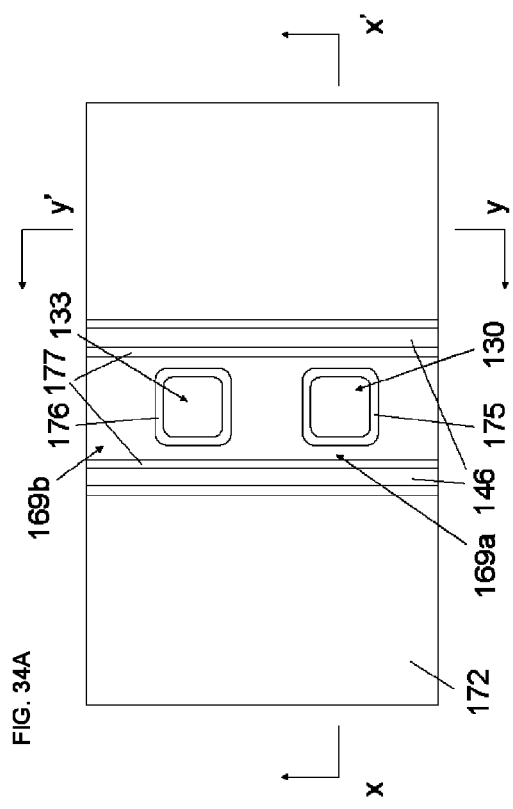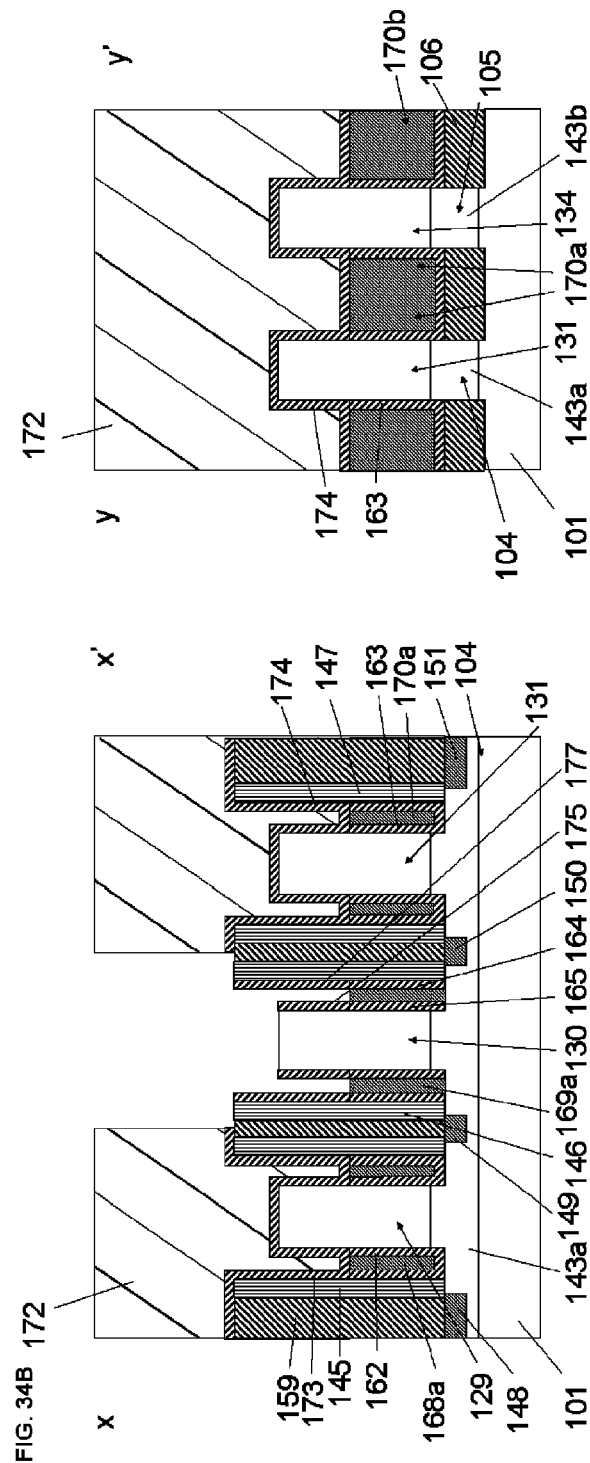

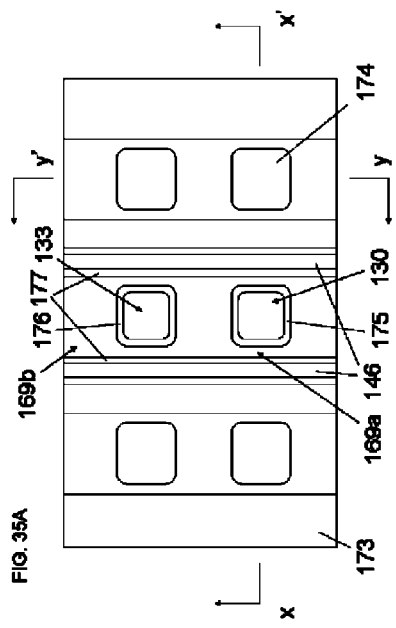
FIG. 35A
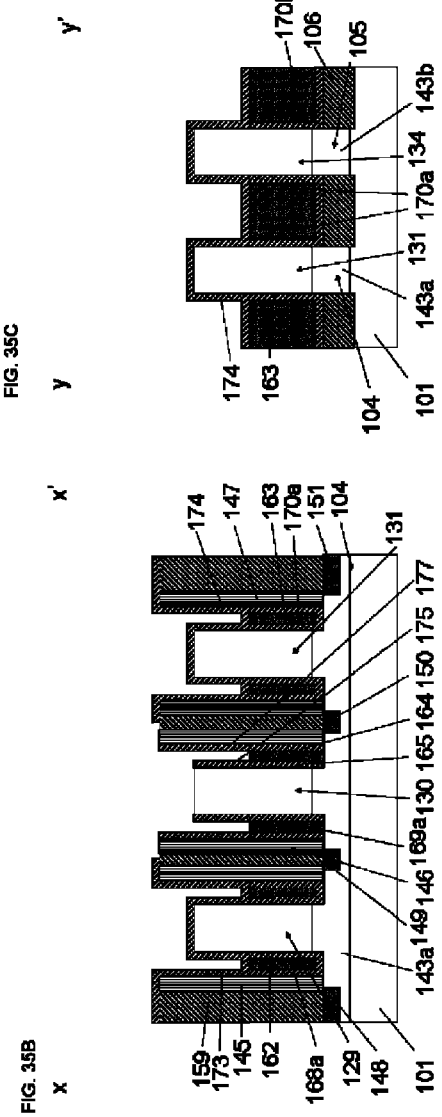
FIG. 35C
FIG. 35B

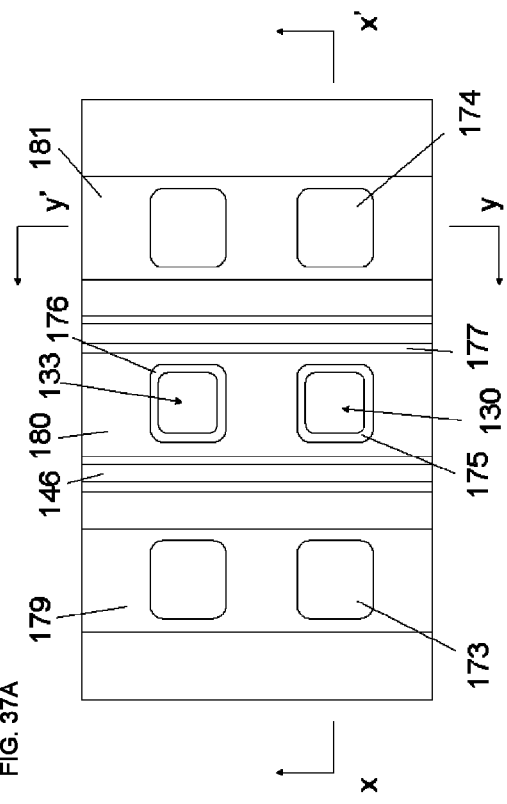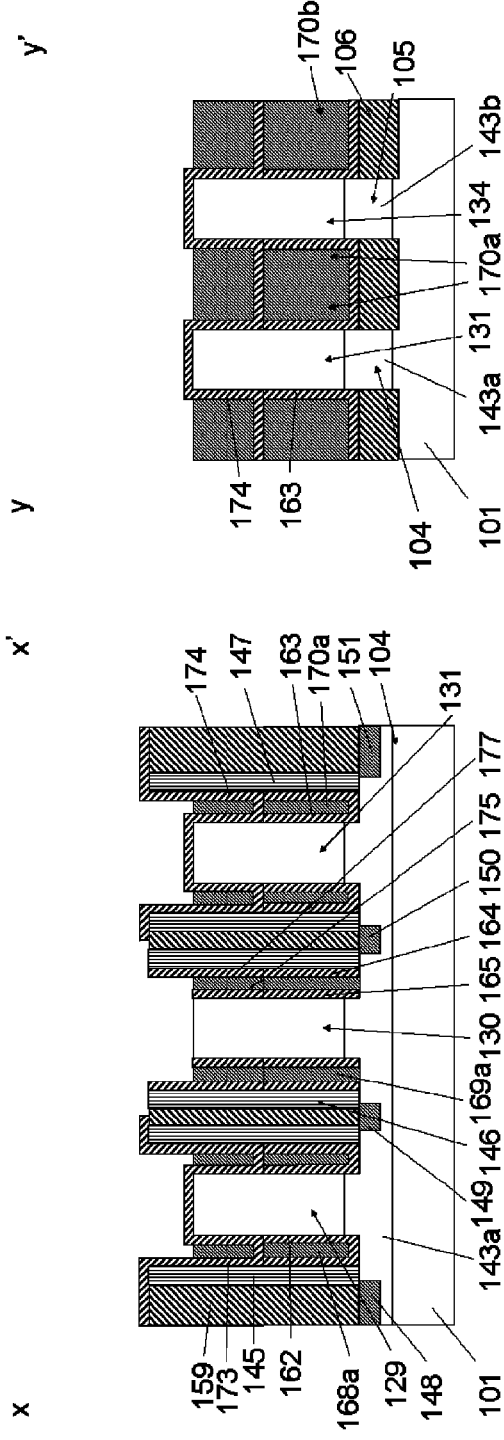

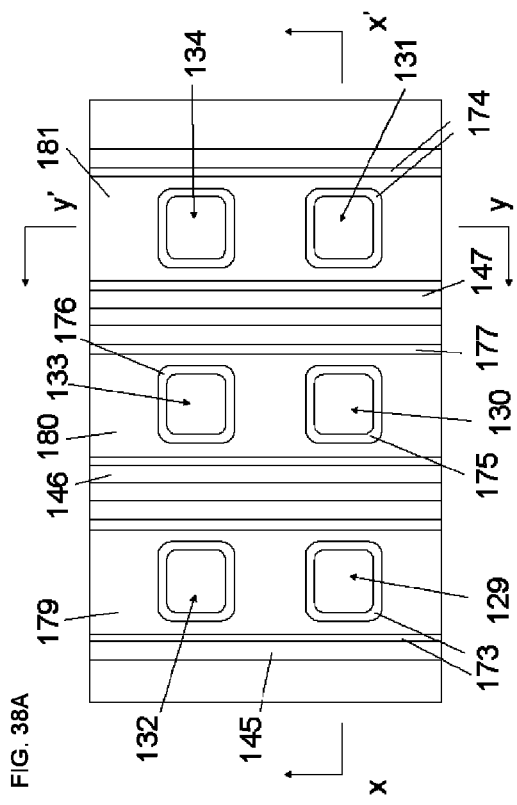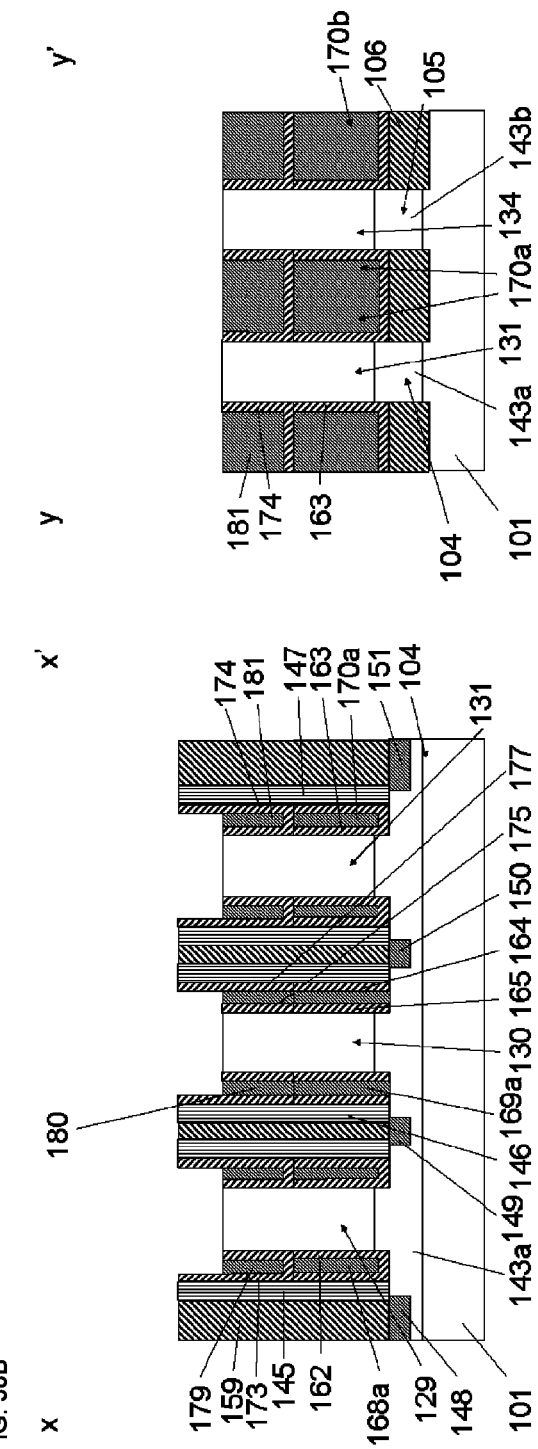

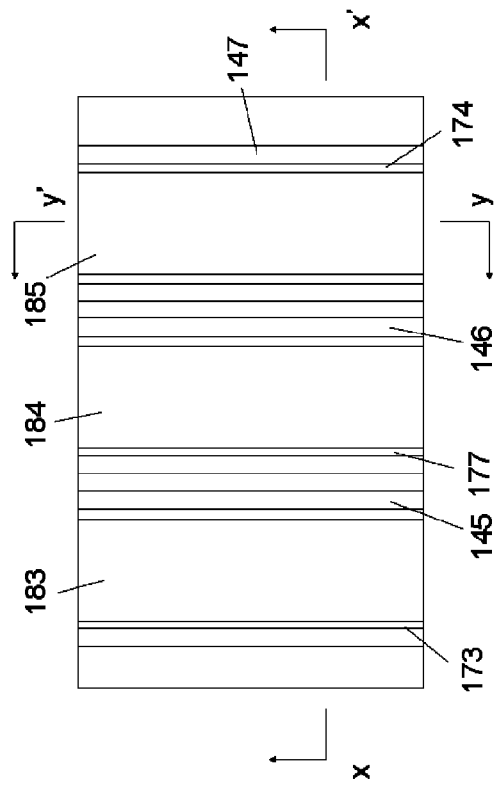
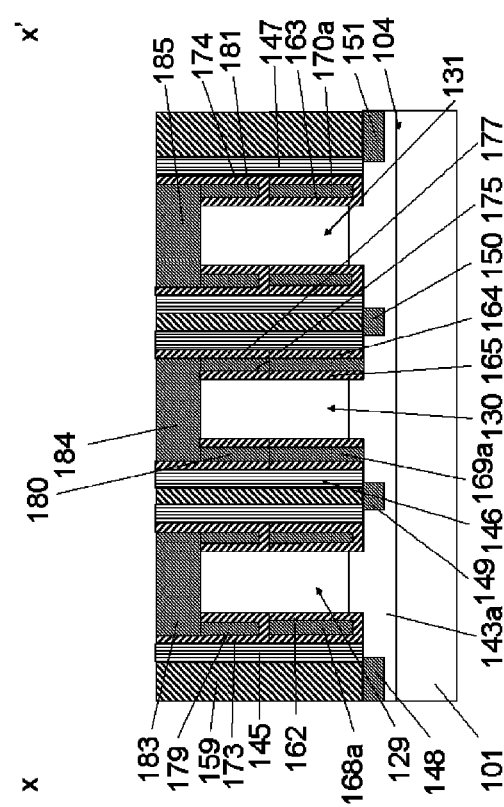
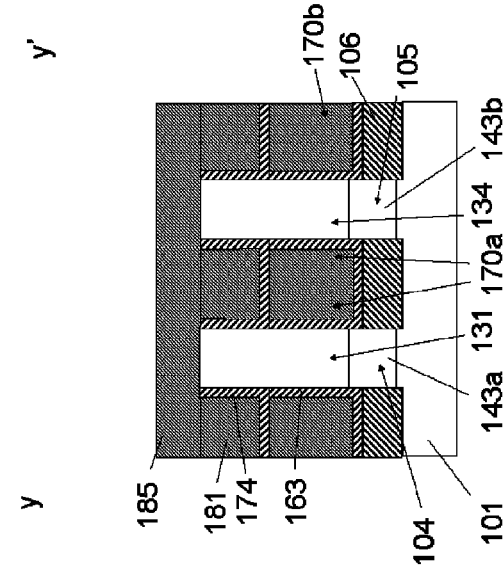
FIG. 40A
FIG. 40B
FIG. 40C

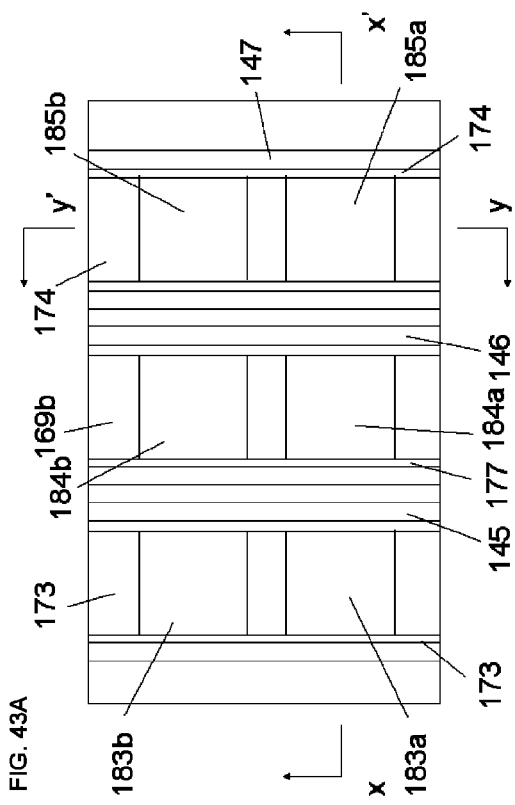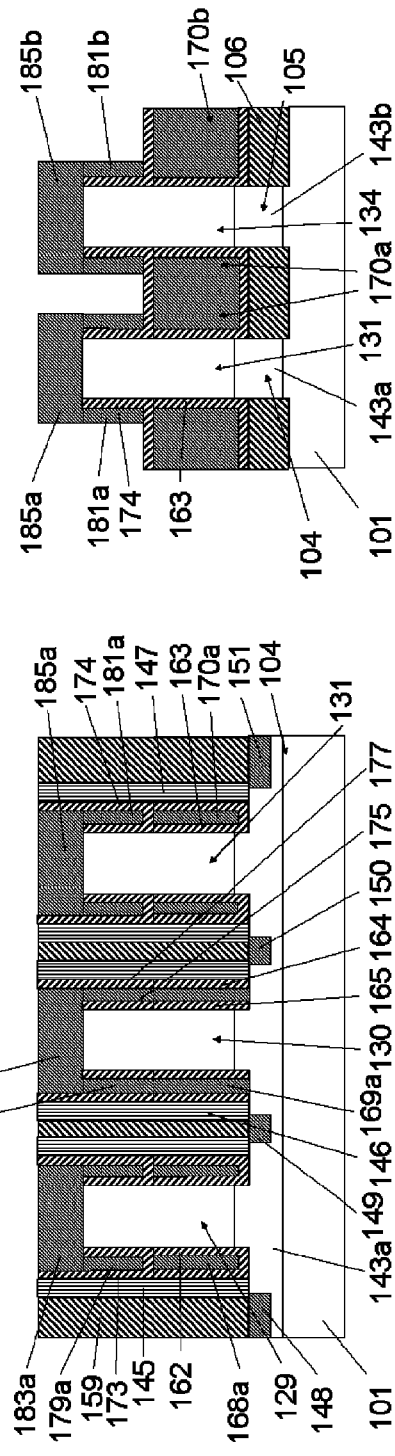
FIG. 43A
FIG. 43B
FIG. 43C

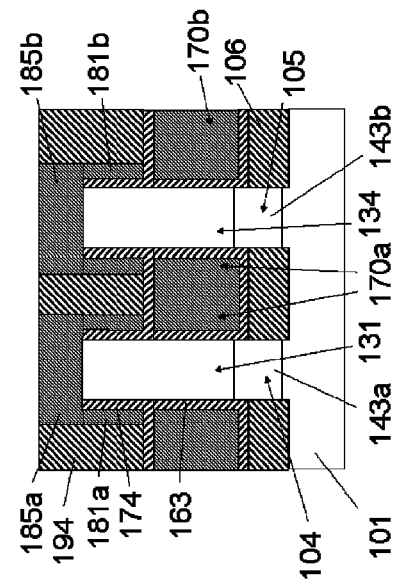
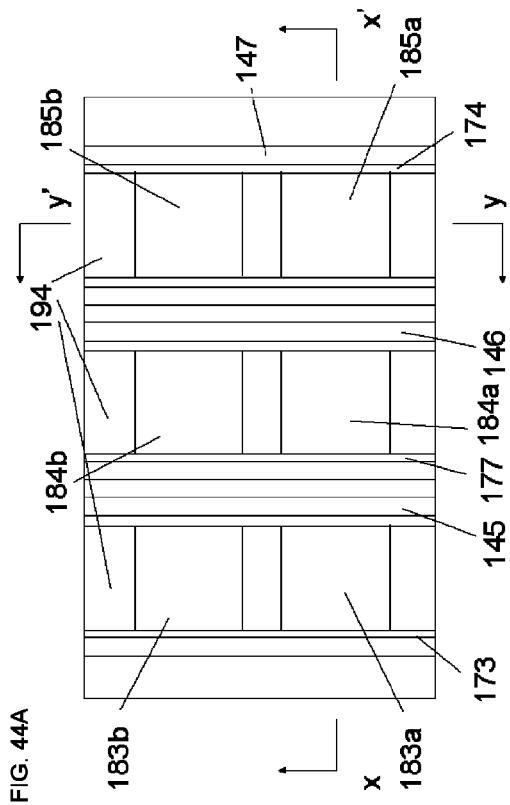
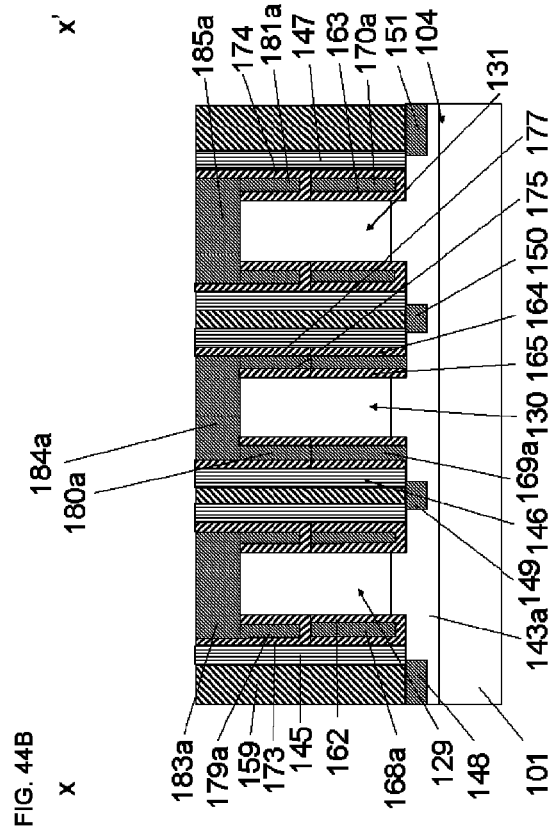

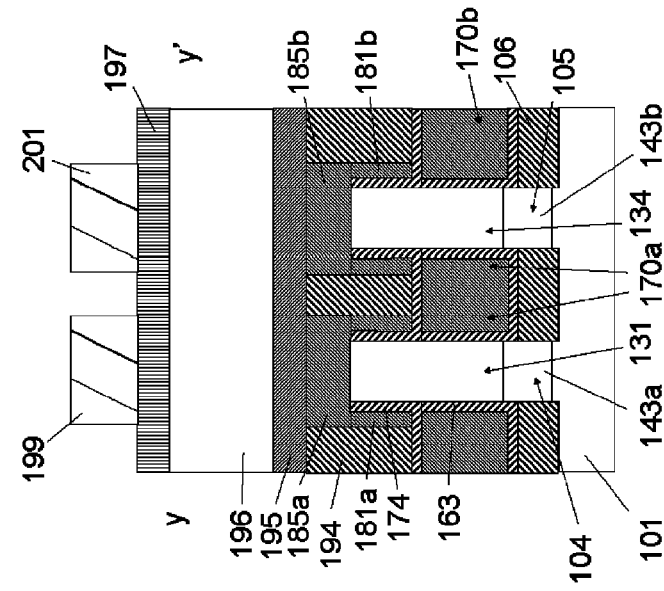
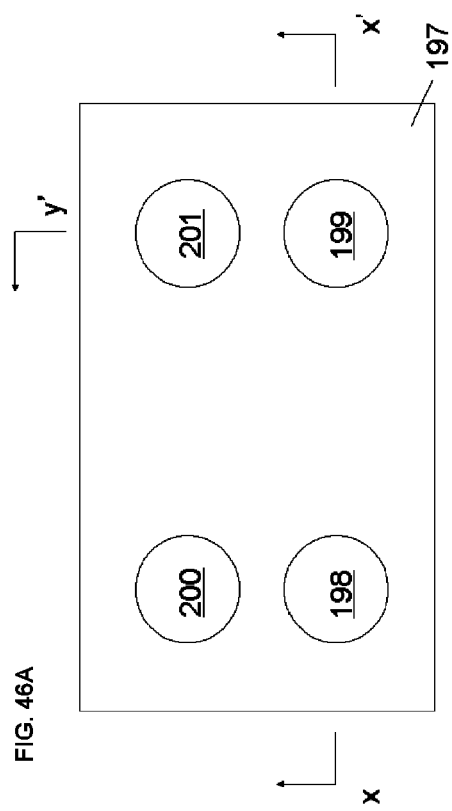
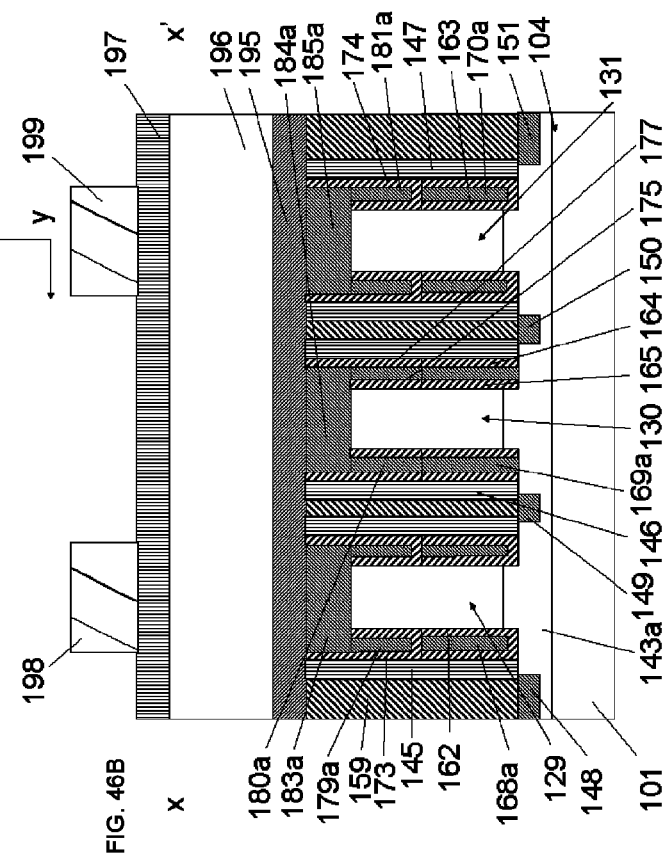

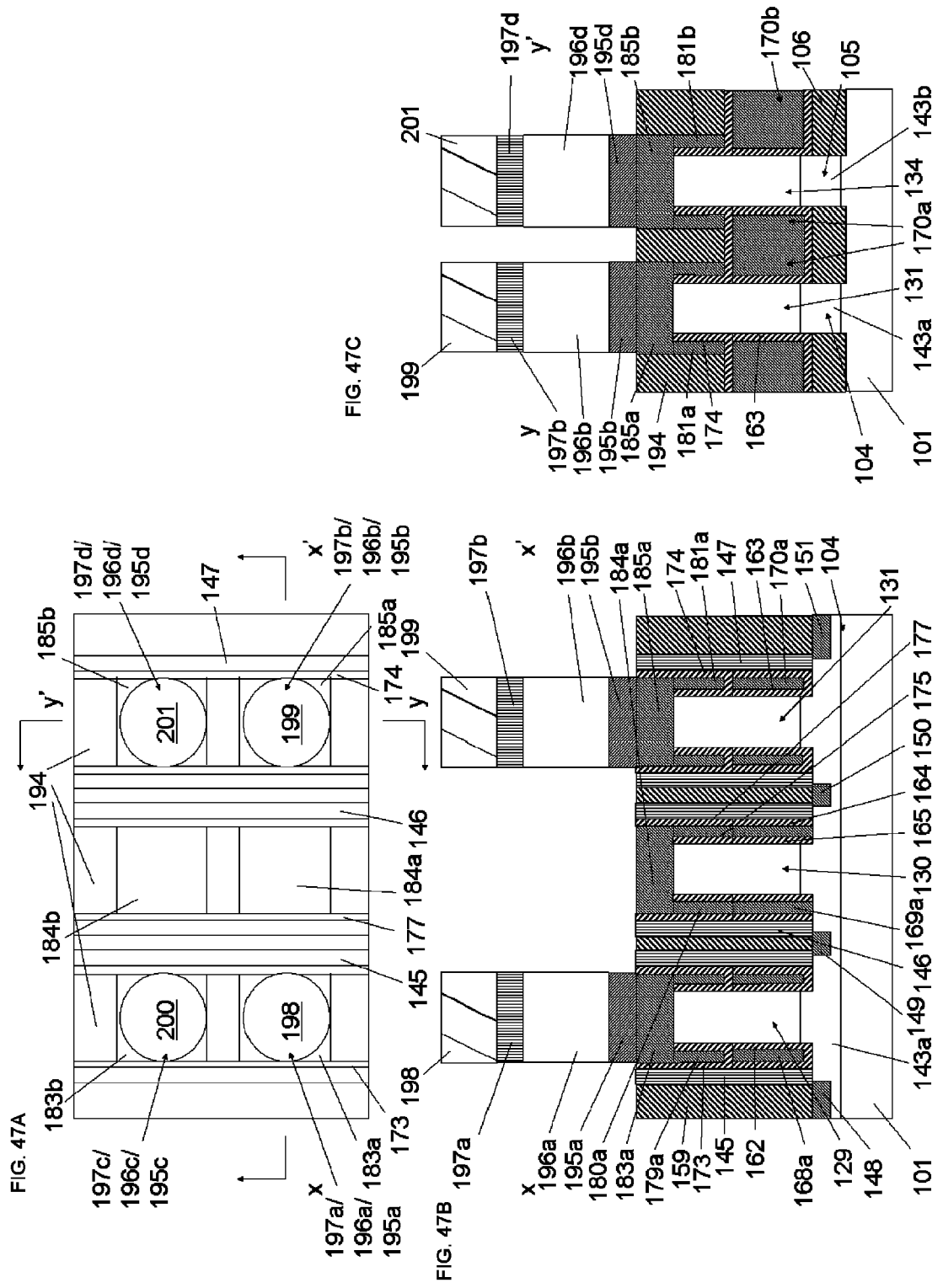

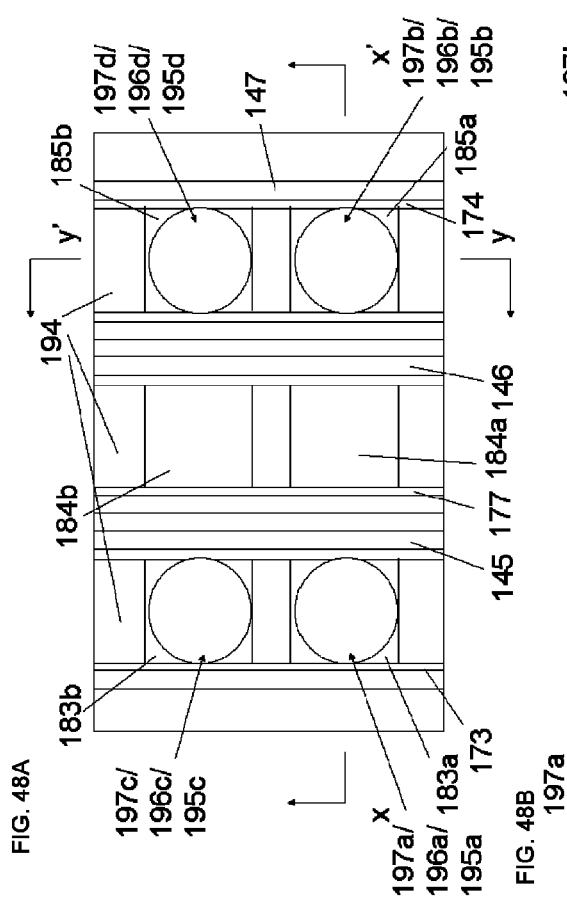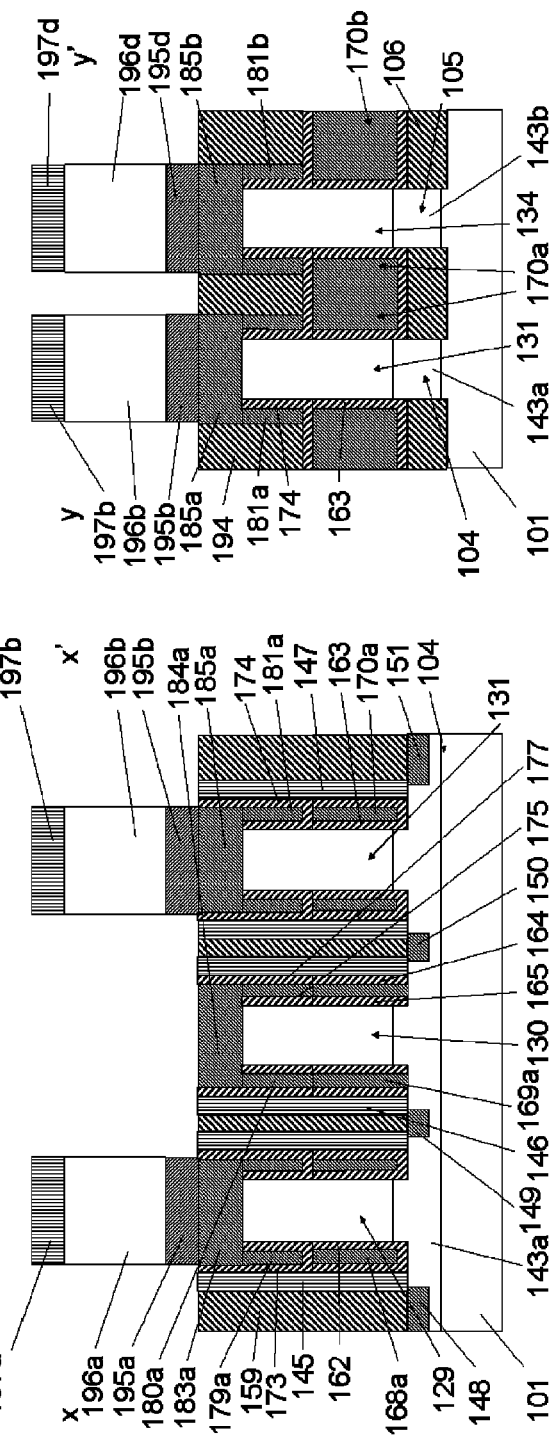

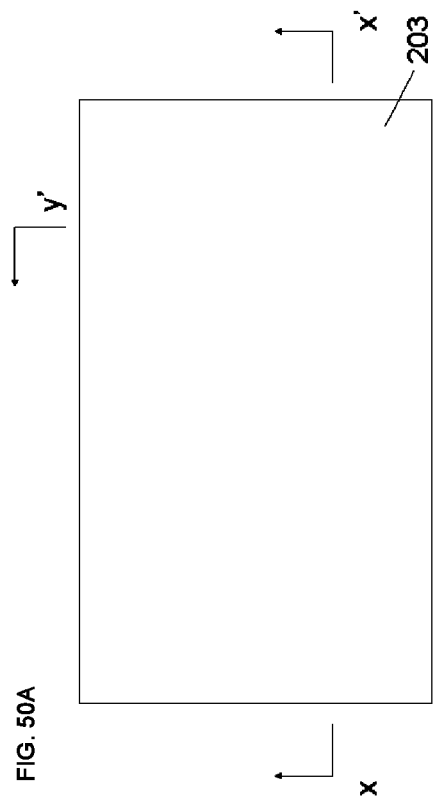
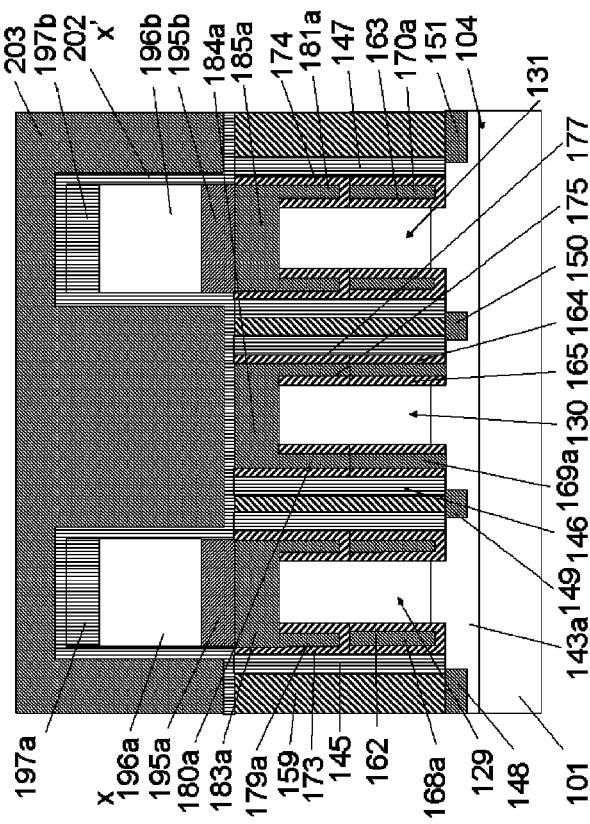
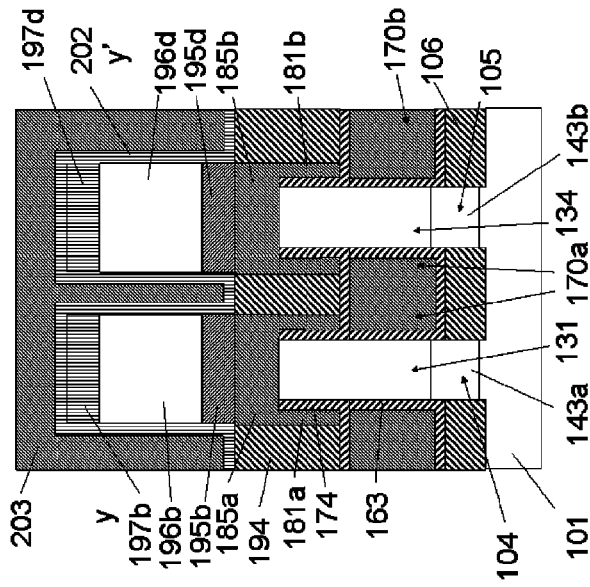

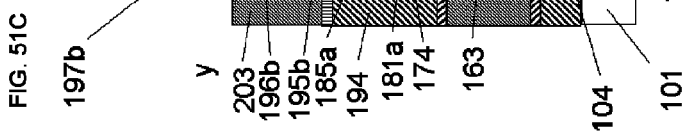
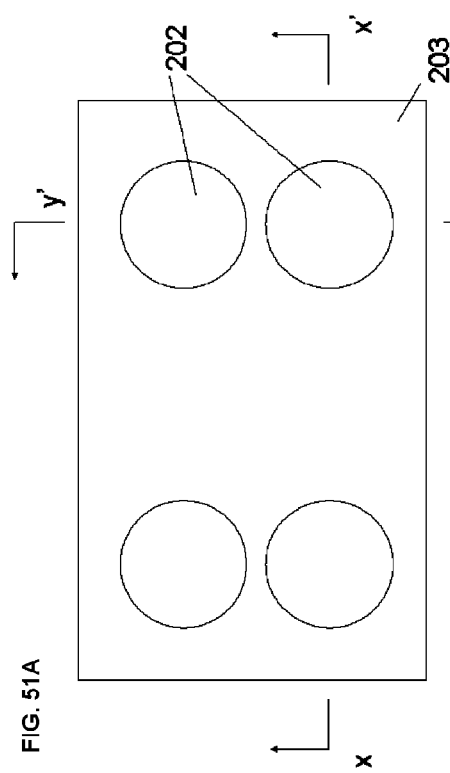
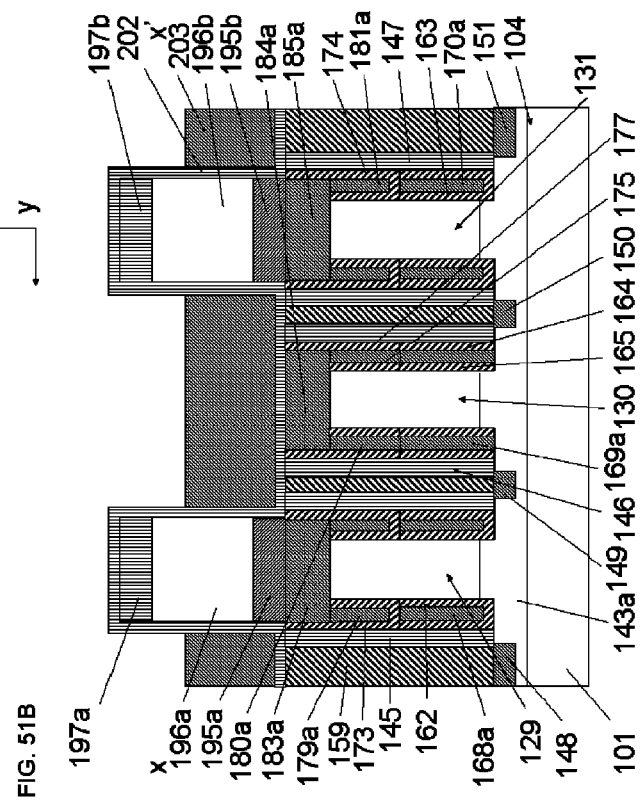

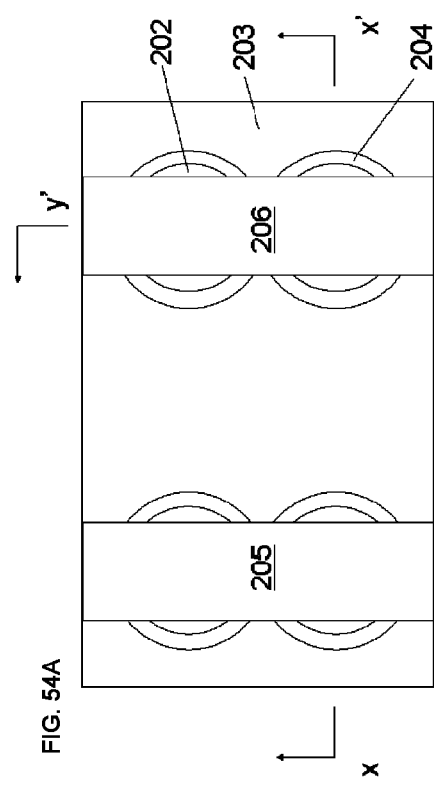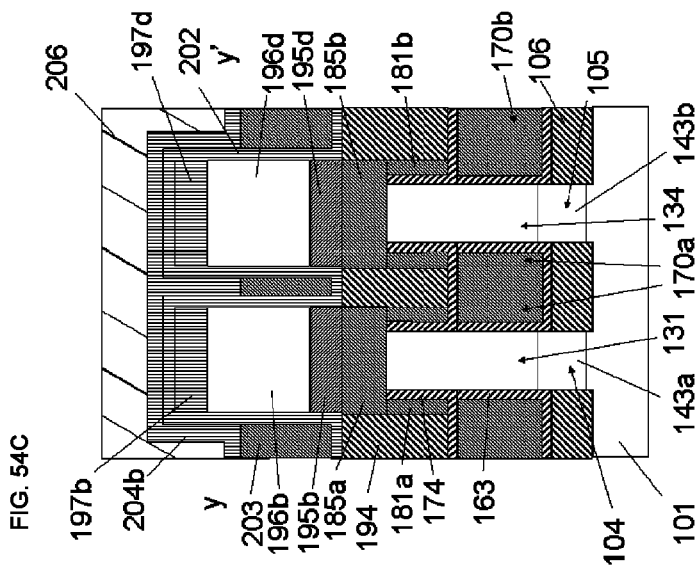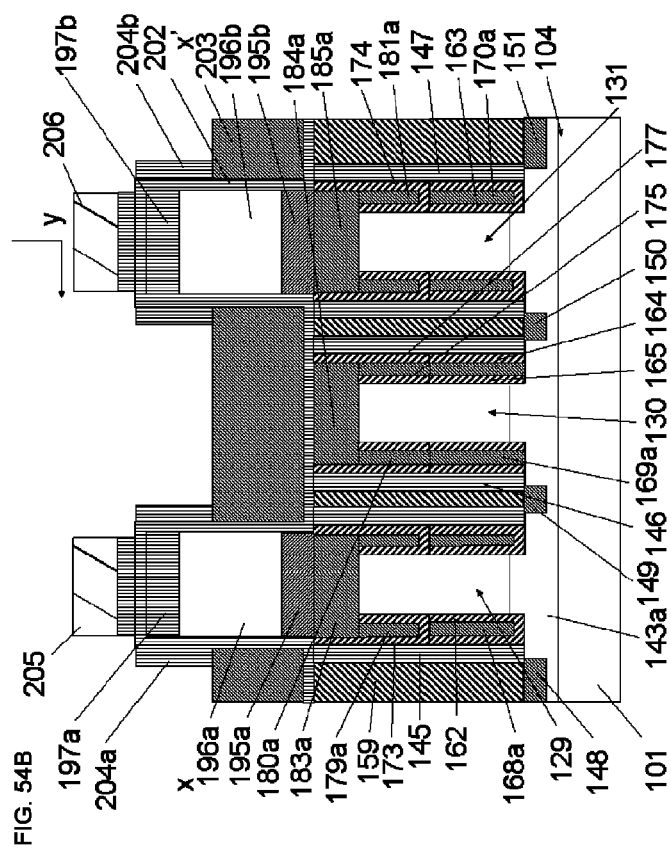

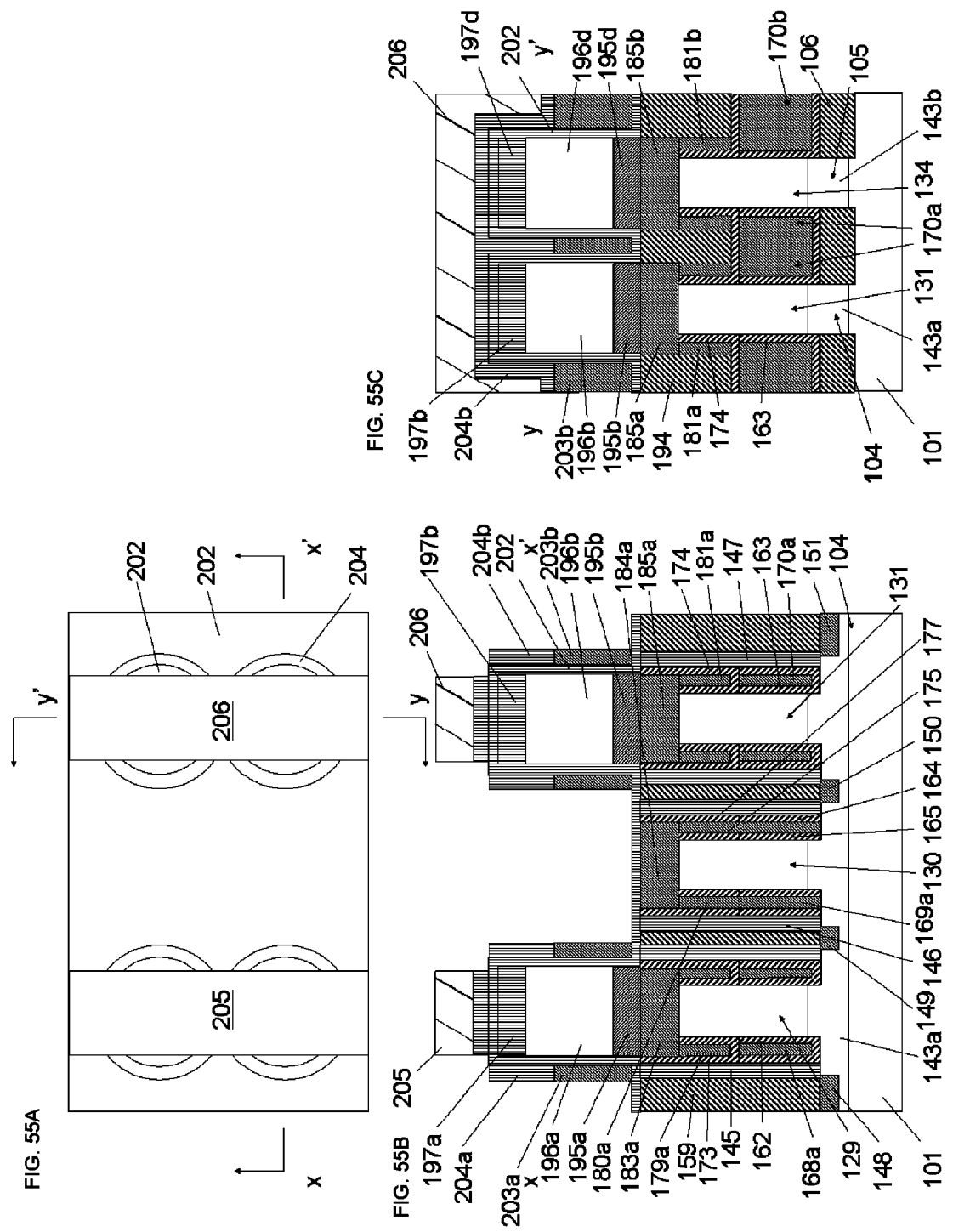

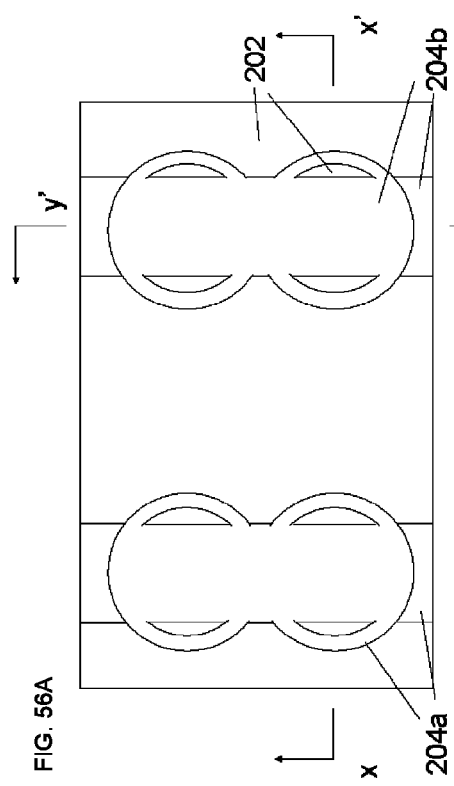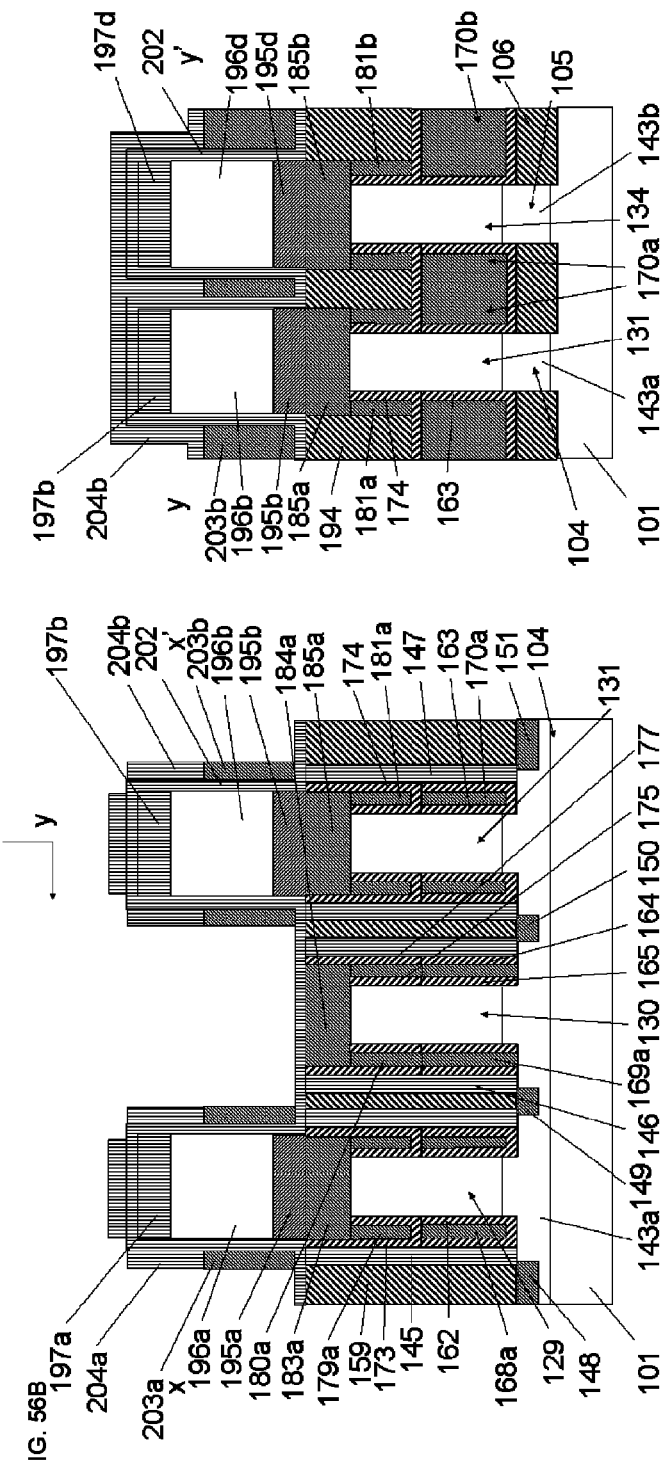

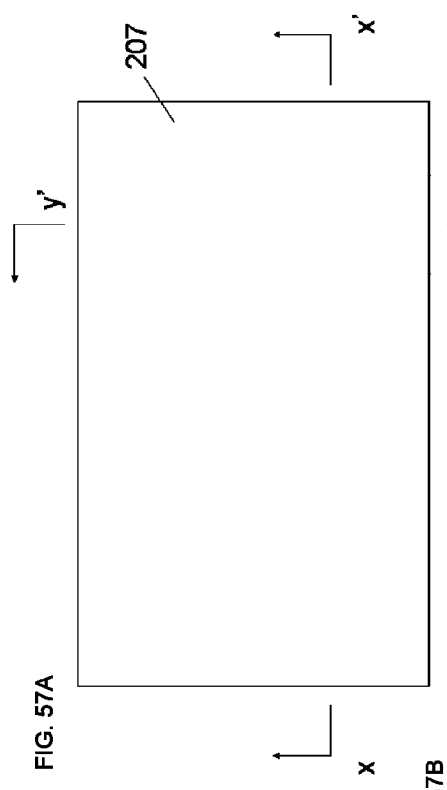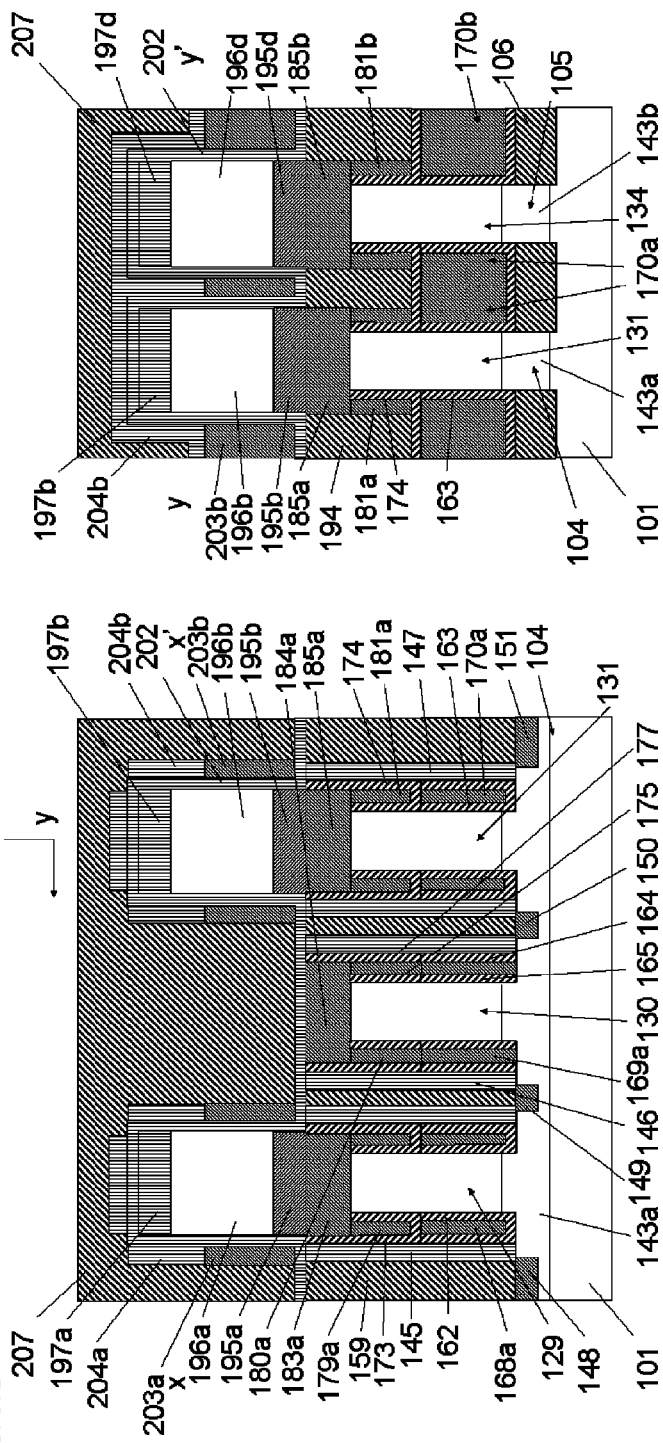

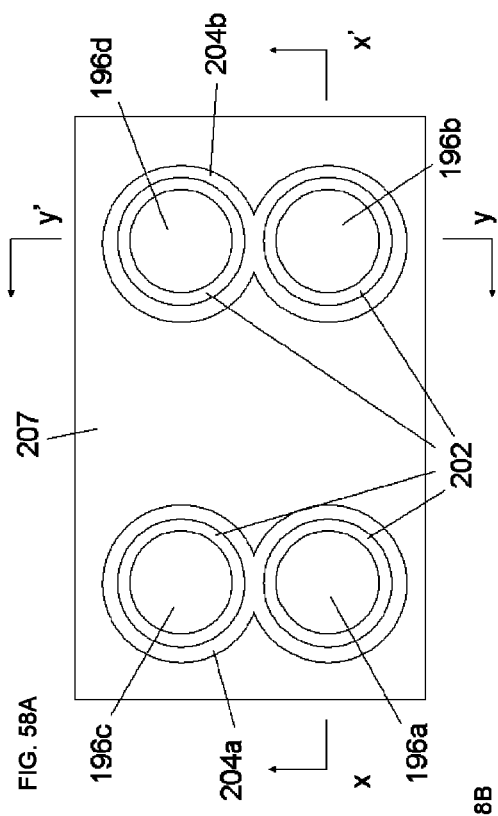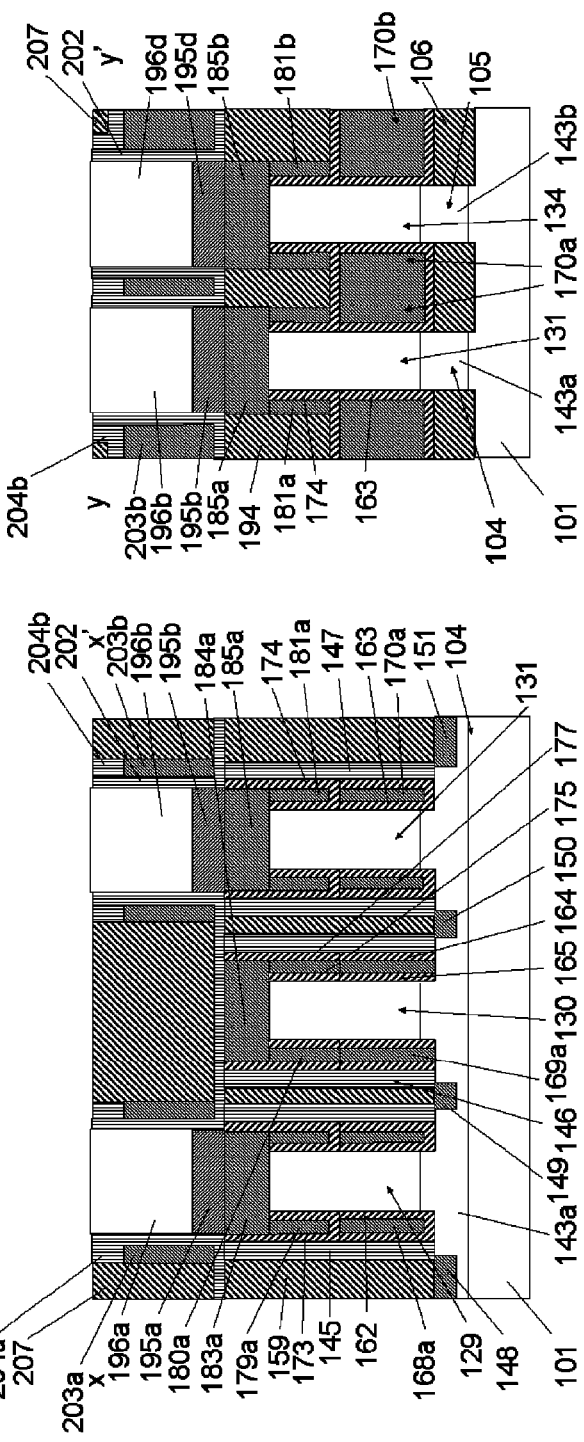

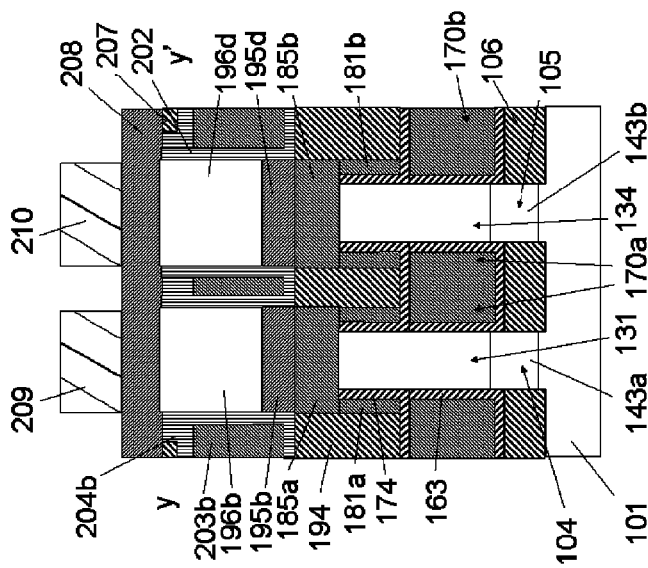
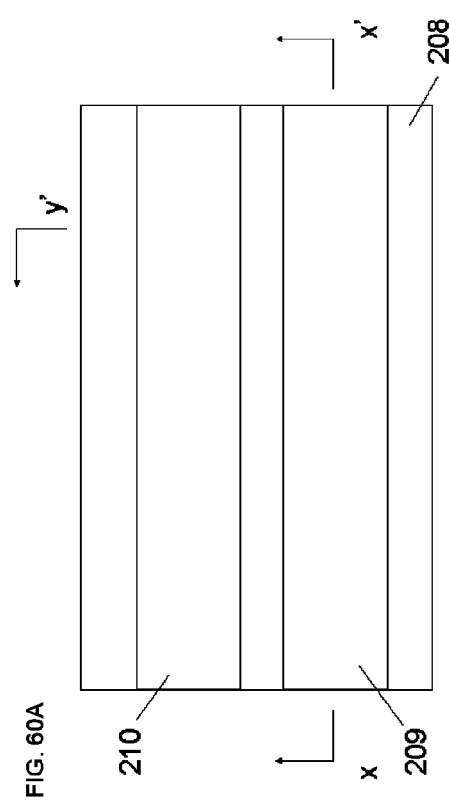
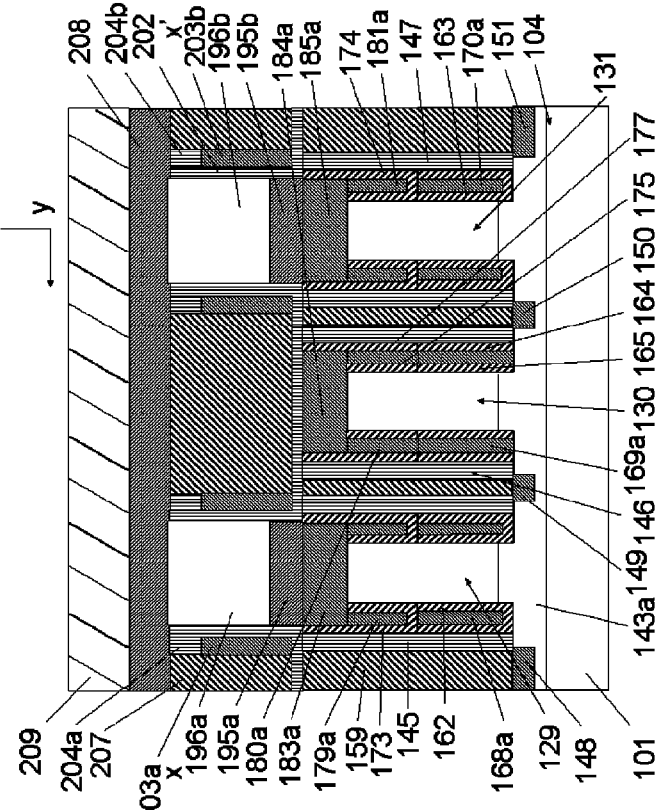

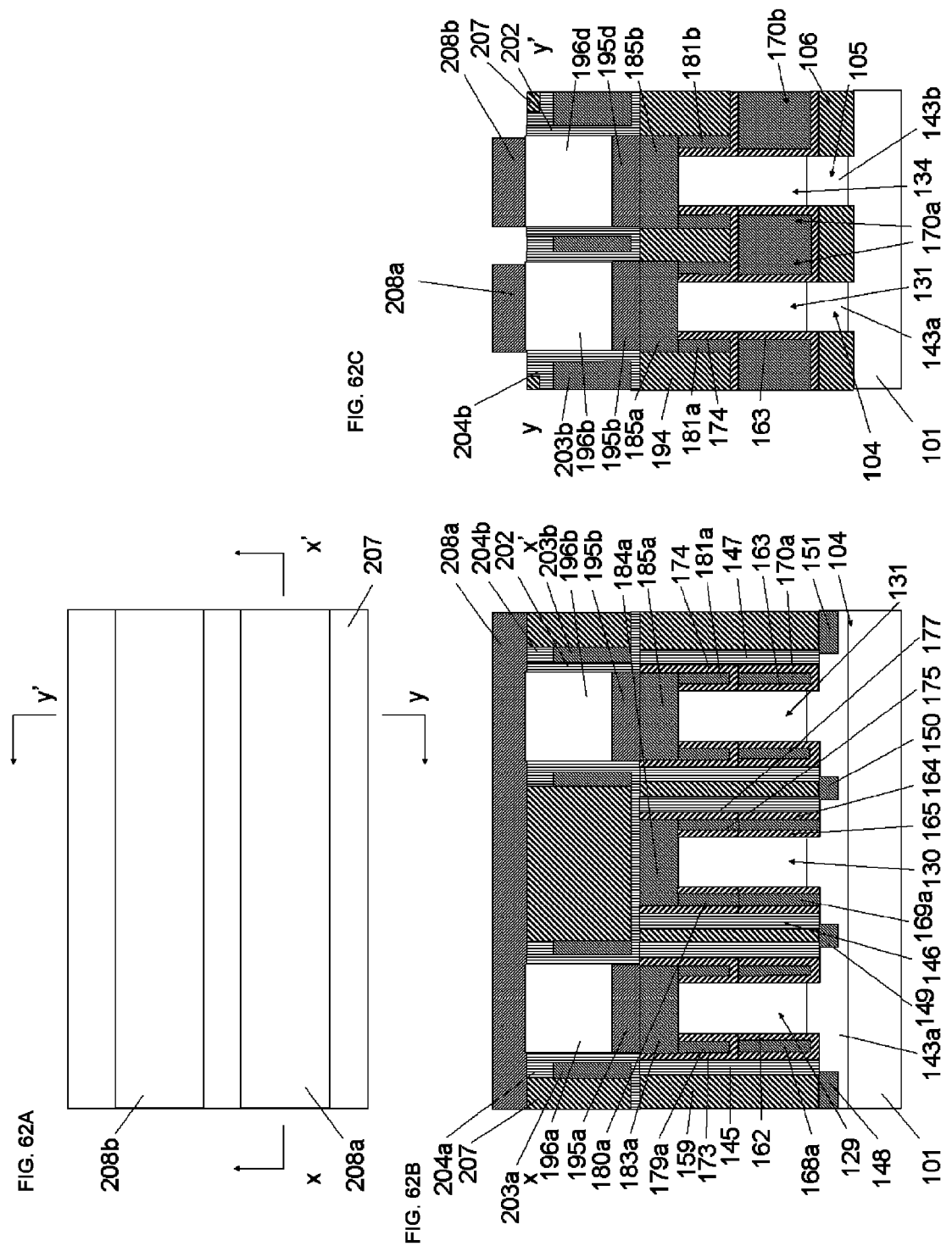

METHOD FOR PRODUCING SEMICONDUCTOR DEVICE

RELATED APPLICATIONS

This application is continuation of U.S. patent application Ser. No. 14/959,902, filed Dec. 4, 2015, which is a divisional patent application of U.S. patent application Ser. No. 14/482,750, filed Sep. 10, 2014, now U.S. Pat. No. 9,252,190 issued on Feb. 2, 2016, which is a continuation application of International Application No. PCT/JP2013/080721 filed on Nov. 13, 2013, the entire contents of which are incorporated by reference herein.

TECHNICAL FIELD

The present invention relates to a semiconductor device and a method for producing a semiconductor device.

BACKGROUND ART

In recent years, a phase-change memory has been developed (e.g., refer to PTL 1). A phase-change memory stores information by changing and recording the resistance of an information storage element of a memory cell.

This is caused by a mechanism in which, when an electric current is caused to flow between a bit line and a source line by turning ON a cell transistor, heat is generated by a high-resistance element serving as a heater, chalcogenide glass (GST: $Ge_2Sb_2Te_5$) that is in contact with the heater is melted, and a state transition occurs. When chalcogenide glass is melted at high temperature (high current) and cooled rapidly (the application of an electric current is stopped), the chalcogenide glass is brought into an amorphous state (reset operation). When chalcogenide glass is melted at relatively-low high temperature (low current) and cooled slowly (the amount of an electric current is gradually decreased), the chalcogenide glass is crystallized (set operation). Thus, in the readout, information of "0" or information of "1" is determined in accordance with the case where the amount of an electric current that flows between the bit line and the source line is large (low resistance, that is, crystalline state) or the case where the amount is small (high resistance, that is, amorphous state) (e.g., refer to PTL 1).

In this case, the reset current is very high, namely, 200 μA. To cause such a high reset current to flow through the cell transistor, the size of a memory cell needs to be considerably large. To cause a high current to flow, a selection element such as a bipolar transistor or a diode can be used (e.g., refer to PTL 1).

Diodes are two-terminal elements. Therefore, in the selection of memory cells, if a single source line is selected, electric currents of all memory cells connected to the single source line flow through the single source line. As a result, the IR drop increases due to the resistance of the source line.

Bipolar transistors are three-terminal elements. In bipolar transistors, an electric current flows through a gate and thus it is difficult to connect many transistors to word lines.

A surrounding gate transistor (hereafter referred to as "SGT") having a structure in which a source, a gate, and a drain are arranged vertically with respect to a substrate and a gate electrode surrounds a pillar-shaped semiconductor layer has been proposed (e.g., refer to PTL 2). Since a source, a gate, and a drain are arranged vertically with respect to a substrate, a small cell area can be realized.

In known MOS transistors, a metal gate last process in which a metal gate is formed after a high-temperature process has been employed in actual products in order to perform both a metal gate process and a high-temperature process (NPL 1). A polysilicon gate is formed, an interlayer insulating film is deposited, the polysilicon gate is exposed by performing chemical mechanical polishing, the polysilicon gate is etched, and then a metal is deposited. Therefore, in order to perform both the metal gate process and the high-temperature process, such a metal gate last process in which a metal gate is formed after a high-temperature process also needs to be employed in SGTs.

In the metal gate last process, a polysilicon gate is formed and then a diffusion layer is formed by ion implantation. In SGTs, an upper portion of a pillar-shaped silicon layer is covered with a polysilicon gate, and thus some schemes are required.

As the width of a silicon pillar decreases, it becomes more difficult to make an impurity be present in the silicon pillar because the density of silicon is $5 \times 10^{22}$/cm'.

In known SGTs, it has been proposed that the channel concentration is set to be a low impurity concentration of $10^{17}$ cm$^{-3}$ or less and the threshold voltage is determined by changing the work function of a gate material (e.g., refer to PTL 3).

It has been disclosed that, in planar MOS transistors, the sidewall of an LDD region is formed of a polycrystalline silicon having the same conductivity type as a low-concentration layer, surface carriers of the LDD region are induced by the difference in work function, and thus the impedance of the LDD region can be reduced compared with LDD MOS transistors with an oxide film sidewall (e.g., refer to PTL 4). It has also been disclosed that the polycrystalline silicon sidewall is electrically insulated from a gate electrode. The drawings show that the polycrystalline silicon sidewall is insulated from a source and a drain by an interlayer insulating film.

CITATION LIST

Patent Literature

PTL 1: Japanese Unexamined Patent Application Publication No. 2012-204404
PTL 2: Japanese Unexamined Patent Application Publication No. 2004-356314
PTL 3: Japanese Unexamined Patent Application Publication No. 2004-356314
PTL 4: Japanese Unexamined Patent Application Publication No. 11-297984

Non Patent Literature

NPL 1: IEDM 2007 K. Mistry et. al, pp 247-250

SUMMARY

Accordingly, it is an object to provide a memory structure including a resistance-changing layer, which enables a reset operation with a reset gate, and a method for producing the memory structure.

A semiconductor device of the present invention includes a first pillar-shaped semiconductor layer; a gate insulating film formed around the first pillar-shaped semiconductor layer; a gate electrode made of a metal and formed around the gate insulating film; a gate line made of a metal and connected to the gate electrode; a second gate insulating film formed around an upper portion of the first pillar-shaped semiconductor layer; a first contact made of a second metal and formed around the second gate insulating film; a second contact which is made of a third metal and which connects an upper portion of the first contact to an upper portion of the first pillar-shaped semiconductor layer; a second diffusion layer formed in a lower portion of the first pillar-shaped semiconductor layer; a pillar-shaped resistance-changing layer formed on the second contact; a reset gate insulating film that surrounds the pillar-shaped resistance-changing layer; and a reset gate that surrounds the reset gate insulating film.

A lower electrode is disposed below the pillar-shaped resistance-changing layer.

The reset gate is made of titanium nitride.

The reset gate insulating film is a nitride film.

The lower electrode is made of titanium nitride.

The resistance-changing layer is reset by causing an electric current to flow through the reset gate.

The second metal of the first contact has a work function of 4.0 eV to 4.2 eV.

The second metal of the first contact has a work function of 5.0 eV to 5.2 eV.

The semiconductor device includes a fin-shaped semiconductor layer formed on a semiconductor substrate and a first insulating film formed around the fin-shaped semiconductor layer, wherein the first pillar-shaped semiconductor layer is formed on the fin-shaped semiconductor layer, the gate insulating film is formed around the gate electrode and the gate line and on bottom portions of the gate electrode and the gate line, the gate line extends in a direction perpendicular to a direction in which the fin-shaped semiconductor layer extends, and the second diffusion layer is further formed in the fin-shaped semiconductor layer.

The second diffusion layer is further formed in the semiconductor substrate.

The semiconductor device includes a contact line which is parallel to the gate line and is connected to the second diffusion layer.

The semiconductor device includes the fin-shaped semiconductor layer formed on the semiconductor substrate; the first insulating film formed around the fin-shaped semiconductor layer; a second pillar-shaped semiconductor layer formed on the fin-shaped semiconductor layer; and a contact electrode made of a metal and formed around the second pillar-shaped semiconductor layer, wherein the contact line is made of a metal and extends in a direction perpendicular to a direction in which the fin-shaped semiconductor layer connected to the contact electrode extends, the second diffusion layer is formed in the fin-shaped semiconductor layer and in a lower portion of the second pillar-shaped semiconductor layer, and the contact electrode is connected to the second diffusion layer.

An outer width of the gate electrode is equal to a width of the gate line, and a width of the first pillar-shaped semiconductor layer in a direction perpendicular to a direction in which the fin-shaped semiconductor layer extends is equal to a width of the fin-shaped semiconductor layer in a direction perpendicular to a direction in which the fin-shaped semiconductor layer extends.

The gate insulating film is formed between the second pillar-shaped semiconductor layer and the contact electrode.

A width of the second pillar-shaped semiconductor layer in a direction perpendicular to a direction in which the fin-shaped semiconductor layer extends is equal to a width of the fin-shaped semiconductor layer in a direction perpendicular to a direction in which the fin-shaped semiconductor layer extends.

The gate insulating film is formed around the contact electrode and the contact line.

An outer width of the contact electrode is equal to a width of the contact line.

The first pillar-shaped semiconductor layer is formed on a semiconductor substrate, the gate insulating film is formed around the gate electrode and the gate line and on bottom portions of the gate electrode and the gate line, and the second diffusion layer is further formed in the semiconductor substrate.

A method for producing a semiconductor device according to the present invention includes a first step of forming a fin-shaped semiconductor layer on a semiconductor substrate and forming a first insulating film around the fin-shaped semiconductor layer; after the first step, a second step of forming a first pillar-shaped semiconductor layer, a first dummy gate constituted by a first polysilicon, a second pillar-shaped semiconductor layer, and a second dummy gate constituted by a first polysilicon; after the second step, a third step of forming a third dummy gate and a fourth dummy gate on side walls of the first dummy gate, the first pillar-shaped semiconductor layer, the second dummy gate, and the second pillar-shaped semiconductor layer; after the third step, a fourth step of forming a second diffusion layer in an upper portion of the fin-shaped semiconductor layer, a lower portion of the first pillar-shaped semiconductor layer, and a lower portion of the second pillar-shaped semiconductor layer; after the fourth step, a fifth step of depositing an interlayer insulating film, exposing upper portions of the first dummy gate, the second dummy gate, the third dummy gate, and the fourth dummy gate, removing the first dummy gate, the second dummy gate, the third dummy gate, and the fourth dummy gate, forming a gate insulating film around the first pillar-shaped semiconductor layer and the second pillar-shaped semiconductor layer, removing a portion of the gate insulating film located in a periphery of a bottom portion of the second pillar-shaped semiconductor layer, depositing a first metal, exposing an upper portion of the first pillar-shaped semiconductor layer and an upper portion of the second pillar-shaped semiconductor layer, forming a gate electrode and a gate line around the first pillar-shaped semiconductor layer, and forming a contact electrode and a contact line around the second pillar-shaped semiconductor layer; after the fifth step, a sixth step of depositing a second gate insulating film around the first pillar-shaped semiconductor layer, on the gate electrode and the gate line, around the second pillar-shaped semiconductor layer, and on the contact electrode and the contact line, depositing a second metal, exposing an upper portion of the first pillar-shaped semiconductor layer and an upper portion of the second pillar-shaped semiconductor layer, removing a portion of the second gate insulating film on the first pillar-shaped semiconductor layer, depositing a third metal, and etching portions of the third metal and the second metal to form a first contact in which the second metal surrounds an upper side wall of the first pillar-shaped semiconductor layer and a second contact which connects an upper portion of the first contact to an upper portion of the first pillar-shaped semiconductor layer; and after the sixth step, a seventh step of depositing a second interlayer insulating film and planarizing the second interlayer insulating film to expose an upper portion of the second contact, forming a pillar-shaped resistance-changing layer and a lower electrode, forming a reset gate insulating film so that the reset gate insulating film surrounds the pillar-shaped resistance-changing layer and the lower electrode, and forming a reset gate.

The second step includes forming a second insulating film around the fin-shaped semiconductor layer; depositing a first polysilicon on the second insulating film and planarizing the first polysilicon; forming a second resist for forming a first gate line, a first pillar-shaped semiconductor layer, a first contact line, and a second pillar-shaped semiconductor layer so that the second resist extends in a direction perpendicular to a direction in which the fin-shaped semiconductor layer extends; and etching the first polysilicon, the second insulating film, and the fin-shaped semiconductor layer to form a first pillar-shaped semiconductor layer, a first dummy gate constituted by the first polysilicon, a second pillar-shaped semiconductor layer, and a second dummy gate constituted by the first polysilicon.

The method for producing a semiconductor device further includes, after depositing the first polysilicon on the second insulating film and planarizing the first polysilicon, forming a third insulating film on the first polysilicon.

The method for producing a semiconductor device includes a third step of, after the second step, forming a fourth insulating film around the first pillar-shaped semiconductor layer, the second pillar-shaped semiconductor layer, the first dummy gate, and the second dummy gate, depositing a second polysilicon around the fourth insulating film, and forming a third dummy gate and a fourth dummy gate by etching the second polysilicon so that the second polysilicon is left on side walls of the first dummy gate, the first pillar-shaped semiconductor layer, the second dummy gate, and the second pillar-shaped semiconductor layer.

The method for producing a semiconductor device includes a fourth step of forming a second diffusion layer in an upper portion of the fin-shaped semiconductor layer and lower portions of the first pillar-shaped semiconductor layer and the second pillar-shaped semiconductor layer, forming a fifth insulating film around the third dummy gate and the fourth dummy gate, etching the fifth insulating film to make the fifth insulating film remain as a side wall, and forming a metal and semiconductor compound in an upper portion of the second diffusion layer.

The method for producing a semiconductor device includes a fifth step of, after the fourth step, depositing an interlayer insulating film, performing chemical mechanical polishing to expose upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film around the first pillar-shaped semiconductor layer and the second pillar-shaped semiconductor layer and on an inner side of the fifth insulating film, forming a third resist for removing a portion of the gate insulating film located in a periphery of a bottom portion of the second pillar-shaped semiconductor layer, removing the portion of the gate insulating film located in the periphery of the bottom portion of the second pillar-shaped semiconductor layer, and depositing a first metal and etching back the first metal to expose an upper portion of the first pillar-shaped semiconductor layer and an upper portion of the second pillar-shaped semiconductor layer, to form a gate electrode and a gate line around the first pillar-shaped semiconductor layer, and to form a contact electrode and a contact line around the second pillar-shaped semiconductor layer.

According to the present invention, there can be provided a memory structure including a resistance-changing layer, which enables a reset operation with a reset gate, and a method for producing the memory structure.

When the pillar-shaped resistance-changing layer, the reset gate insulating film that surrounds the pillar-shaped resistance-changing layer, and the reset gate that surrounds the reset gate insulating film are included, heat is generated in the reset gate serving as a heater as a result of current flow through the reset gate. This melts chalcogenide glass (GST: $Ge_2Sb_2Te_5$) that is in contact with the heater and thus a state transition occurs.

Since the reset gate surrounds the pillar-shaped resistance-changing layer, the pillar-shaped resistance-changing layer is easily heated.

Since a reset operation is performed as a result of current flow through the reset gate, a high current is not necessarily caused to flow through a selection element. The selection element may be a selection element through which only a low current for a set operation can be caused to flow.

The second gate insulating film formed around the upper portion of the pillar-shaped semiconductor layer, the first contact made of a second metal and formed around the second gate insulating film, and the second contact which is made of a third metal and which connects the upper portion of the first contact to the upper portion of the pillar-shaped semiconductor layer can provide an SGT having a structure in which the upper portion of the pillar-shaped semiconductor layer is made to function as an n-type semiconductor layer or a p-type semiconductor layer by a difference in work function between metal and semiconductor. Thus, a step of forming a diffusion layer in the upper portion of the pillar-shaped semiconductor layer is omitted.

The gate electrode is made of a metal and the gate line is made of a metal. Furthermore, there are the first contact made of a metal and formed around the second gate insulating film and the second contact that connects the upper portion of the first contact to the upper portion of the pillar-shaped semiconductor layer. Since a large amount of metal is used, the cooling can be accelerated. In addition, since the gate insulating film is formed around the gate electrode and the gate line and on bottom portions of the gate electrode and the gate line, a metal gate is formed through a gate last process. Therefore, both a metal gate process and a high-temperature process can be performed.

The semiconductor device includes a fin-shaped semiconductor layer formed on a semiconductor substrate, a first insulating film formed around the fin-shaped semiconductor layer, the first pillar-shaped semiconductor layer formed on the fin-shaped semiconductor layer, and the gate insulating film formed around the gate electrode and the gate line and on bottom portions of the gate electrode and the gate line. The gate electrode is made of a metal and the gate line is made of a metal, the gate line extending in a direction perpendicular to a direction in which the fin-shaped semiconductor layer extends. The second diffusion layer is further formed in the fin-shaped semiconductor layer. The outer width of the gate electrode is equal to the width of the gate line. The width of the first pillar-shaped semiconductor layer is equal to the width of the fin-shaped semiconductor layer. Thus, the fin-shaped semiconductor layer, the pillar-shaped semiconductor layer, the gate electrode, and the gate line of this semiconductor device are formed through a self-aligned process with two masks. This can reduce the number of steps.

The presence of the contact line which is parallel to the gate line and is connected to the second diffusion layer can reduce the resistance of a source line and can suppress an increase in the source voltage caused by electric current at the time of the set operation. Regarding the contact line which is parallel to the gate line, one contact line is preferably disposed for every 2 memory cells, 4 memory cells, 8 memory cells, 16 memory cells, 32 memory cells, or 64 memory cells arranged in a row in a direction in which the bit line extends.

A structure constituted by the second pillar-shaped semiconductor layer, the contact electrode formed around the second pillar-shaped semiconductor layer, and the contact line is the same as a transistor structure, except that the contact electrode is connected to the second diffusion layer. All source lines which extend in a direction parallel to a direction in which the gate line extends are connected to the contact line. This can reduce the number of steps.

BRIEF DESCRIPTION OF THE DRAWING

FIG. 1A is a plan view of a semiconductor device according to the present invention. FIG. 1B is a sectional view taken along line X-X' of FIG. 1A. FIG. 1C is a sectional view taken along line Y-Y' of FIG. 1A.

FIG. 2A is a plan view of a semiconductor device according to the present invention. FIG. 2B is a sectional view taken along line X-X' of FIG. 2A. FIG. 2C is a sectional view taken along line Y-Y' of FIG. 2A.

FIG. 3A is a plan view of a semiconductor device according to the present invention. FIG. 3B is a sectional view taken along line X-X' of FIG. 3A. FIG. 3C is a sectional view taken along line Y-Y' of FIG. 3A.

FIG. 4A is a plan view showing a method for producing a semiconductor device according to the present invention. FIG. 4B is a sectional view taken along line X-X' of FIG. 4A. FIG. 4C is a sectional view taken along line Y-Y' of FIG. 4A.

FIG. 5A is a plan view showing a method for producing a semiconductor device according to the present invention. FIG. 5B is a sectional view taken along line X-X' of FIG. 5A. FIG. 5C is a sectional view taken along line Y-Y' of FIG. 5A.

FIG. 6A is a plan view showing a method for producing a semiconductor device according to the present invention. FIG. 6B is a sectional view taken along line X-X' of FIG. 6A. FIG. 6C is a sectional view taken along line Y-Y' of FIG. 6A.

FIG. 7A is a plan view showing a method for producing a semiconductor device according to the present invention. FIG. 7B is a sectional view taken along line X-X' of FIG. 7A. FIG. 7C is a sectional view taken along line Y-Y' of FIG. 7A.

FIG. 8A is a plan view showing a method for producing a semiconductor device according to the present invention. FIG. 8B is a sectional view taken along line X-X' of FIG. 8A. FIG. 8C is a sectional view taken along line Y-Y' of FIG. 8A.

FIG. 10A is a plan view showing a method for producing a semiconductor device according to the present invention. FIG. 10B is a sectional view taken along line X-X' of FIG. 10A. FIG. 10C is a sectional view taken along line Y-Y' of FIG. 10A.

FIG. 14A is a plan view showing a method for producing a semiconductor device according to the present invention. FIG. 14B is a sectional view taken along line X-X' of FIG. 14A. FIG. 14C is a sectional view taken along line Y-Y' of FIG. 14A.

FIG. 17A is a plan view showing a method for producing a semiconductor device according to the present invention. FIG. 17B is a sectional view taken along line X-X' of FIG. 17A. FIG. 17C is a sectional view taken along line Y-Y' of FIG. 17A.

FIG. 18A is a plan view showing a method for producing a semiconductor device according to the present invention. FIG. 18B is a sectional view taken along line X-X' of FIG. 18A. FIG. 18C is a sectional view taken along line Y-Y' of FIG. 18A.

FIG. 22A is a plan view showing a method for producing a semiconductor device according to the present invention. FIG. 22B is a sectional view taken along line X-X' of FIG. 22A. FIG. 22C is a sectional view taken along line Y-Y' of FIG. 22A.

FIG. 23A is a plan view showing a method for producing a semiconductor device according to the present invention. FIG. 23B is a sectional view taken along line X-X' of FIG. 23A. FIG. 23C is a sectional view taken along line Y-Y' of FIG. 23A.

FIG. 24A is a plan view showing a method for producing a semiconductor device according to the present invention. FIG. 24B is a sectional view taken along line X-X' of FIG. 24A. FIG. 24C is a sectional view taken along line Y-Y' of FIG. 24A.

FIG. 27A is a plan view showing a method for producing a semiconductor device according to the present invention. FIG. 27B is a sectional view taken along line X-X' of FIG. 27A. FIG. 27C is a sectional view taken along line Y-Y' of FIG. 27A.

FIG. 28B is a sectional view taken along line X-X' of FIG. 28A.

FIG. 29A is a plan view showing a method for producing a semiconductor device according to the present invention. FIG. 29C is a sectional view taken along line Y-Y' of FIG. 29A.

FIG. 31A is a plan view showing a method for producing a semiconductor device according to the present invention. FIG. 31B is a sectional view taken along line X-X' of FIG. 31A. FIG. 31C is a sectional view taken along line Y-Y' of FIG. 31A.

FIG. 33A is a plan view showing a method for producing a semiconductor device according to the present invention. FIG. 33B is a sectional view taken along line X-X' of FIG. 33A. FIG. 33C is a sectional view taken along line Y-Y' of FIG. 33A.

FIG. 34A is a plan view showing a method for producing a semiconductor device according to the present invention. FIG. 34B is a sectional view taken along line X-X' of FIG. 34A. FIG. 34C is a sectional view taken along line Y-Y' of FIG. 34A.

FIG. 35A is a plan view showing a method for producing a semiconductor device according to the present invention. FIG. 35B is a sectional view taken along line X-X' of FIG. 35A. FIG. 35C is a sectional view taken along line Y-Y' of FIG. 35A.

FIG. 37A is a plan view showing a method for producing a semiconductor device according to the present invention. FIG. 37B is a sectional view taken along line X-X' of FIG. 37A. FIG. 37C is a sectional view taken along line Y-Y' of FIG. 37A.

FIG. 38A is a plan view showing a method for producing a semiconductor device according to the present invention. FIG. 38B is a sectional view taken along line X-X' of FIG. 38A. FIG. 38C is a sectional view taken along line Y-Y' of FIG. 38A.

FIG. 40A is a plan view showing a method for producing a semiconductor device according to the present invention. FIG. 40B is a sectional view taken along line X-X' of FIG. 40A. FIG. 40C is a sectional view taken along line Y-Y' of FIG. 40A.

FIG. 43A is a plan view showing a method for producing a semiconductor device according to the present invention. FIG. 43B is a sectional view taken along line X-X' of FIG. 43A. FIG. 43C is a sectional view taken along line Y-Y' of FIG. 43A.

FIG. 44A is a plan view showing a method for producing a semiconductor device according to the present invention. FIG. 44B is a sectional view taken along line X-X' of FIG. 44A. FIG. 44C is a sectional view taken along line Y-Y' of FIG. 44A.

FIG. 46A is a plan view showing a method for producing a semiconductor device according to the present invention. FIG. 46B is a sectional view taken along line X-X' of FIG. 46A. FIG. 46C is a sectional view taken along line Y-Y' of FIG. 46A.

FIG. 47A is a plan view showing a method for producing a semiconductor device according to the present invention. FIG. 47B is a sectional view taken along line X-X' of FIG. 47A. FIG. 47C is a sectional view taken along line Y-Y' of FIG. 47A.

FIG. 48A is a plan view showing a method for producing a semiconductor device according to the present invention. FIG. 48B is a sectional view taken along line X-X' of FIG. 48A. FIG. 48C is a sectional view taken along line Y-Y' of FIG. 48A.

FIG. 50A is a plan view showing a method for producing a semiconductor device according to the present invention. FIG. 50B is a sectional view taken along line X-X' of FIG. 50A. FIG. 50C is a sectional view taken along line Y-Y' of FIG. 50A.

FIG. 51A is a plan view showing a method for producing a semiconductor device according to the present invention.

FIG. 51B is a sectional view taken along line X-X' of FIG. 51A. FIG. 51C is a sectional view taken along line Y-Y' of FIG. 51A.

FIG. 54A is a plan view showing a method for producing a semiconductor device according to the present invention. FIG. 54B is a sectional view taken along line X-X' of FIG. 54A. FIG. 54C is a sectional view taken along line Y-Y' of FIG. 54A.

FIG. 55A is a plan view showing a method for producing a semiconductor device according to the present invention. FIG. 55B is a sectional view taken along line X-X' of FIG. 55A. FIG. 55C is a sectional view taken along line Y-Y' of FIG. 55A.

FIG. 56A is a plan view showing a method for producing a semiconductor device according to the present invention. FIG. 56B is a sectional view taken along line X-X' of FIG. 56A. FIG. 56C is a sectional view taken along line Y-Y' of FIG. 56A.

FIG. 57A is a plan view showing a method for producing a semiconductor device according to the present invention. FIG. 57B is a sectional view taken along line X-X' of FIG. 57A. FIG. 57C is a sectional view taken along line Y-Y' of FIG. 57A.

FIG. 58A is a plan view showing a method for producing a semiconductor device according to the present invention. FIG. 58B is a sectional view taken along line X-X' of FIG. 58A. FIG. 58C is a sectional view taken along line Y-Y' of FIG. 58A.

FIG. 60A is a plan view showing a method for producing a semiconductor device according to the present invention. FIG. 60B is a sectional view taken along line X-X' of FIG. 60A. FIG. 60C is a sectional view taken along line Y-Y' of FIG. 60A.

FIG. 62A is a plan view showing a method for producing a semiconductor device according to the present invention. FIG. 62B is a sectional view taken along line X-X' of FIG. 62A. FIG. 62C is a sectional view taken along line Y-Y' of FIG. 62A.

DETAILED DESCRIPTION OF THE PREFERRED EMBODIMENTS

Figure 9A:
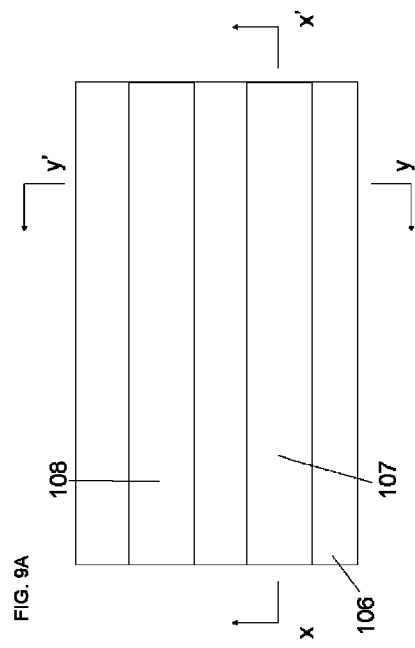
FIG. 9A is a plan view showing a method for producing a semiconductor device according to the present invention.

FIGS. 1A, 1B and 1C show a structure of a semiconductor device.

As shown in FIGS. 1A, 1B and 1C, memory cells serving as semiconductor devices of the present invention are arranged in a first row and a first column, in a first row and a third column, in a second row and a first column, and in a second row and a third column, and contact devices including a contact electrode and a contact line are arranged in a first row and a second column and in a second row and a second column in order to connect source lines to each other.

The memory cell in the second row and the first column includes a fin-shaped semiconductor layer 104 formed on a semiconductor substrate 101; a first insulating film 106 formed around the fin-shaped semiconductor layer 104; a first pillar-shaped semiconductor layer 129 formed on the fin-shaped semiconductor layer 104; a gate insulating film 162 formed around the first pillar-shaped semiconductor layer 129; a gate electrode 168a made of a metal and formed around the gate insulating film 162; a gate line 168b made of a metal and connected to the gate electrode 168a, the gate line 168b extending in a direction perpendicular to a direction in which the fin-shaped semiconductor layer 104 extends, the gate insulating film 162 being formed around the gate electrode 168a and the gate line 168b and on bottom portions of the gate electrode 168a and the gate line 168b; a second gate insulating film 173 formed around an upper portion of the first pillar-shaped semiconductor layer 129; a first contact 179a made of a second metal and formed around the second gate insulating film 173; a second contact 183a which is made of a third metal and which connects an upper portion of the first contact 179a to an upper portion of the first pillar-shaped semiconductor layer 129; and a second diffusion layer 143a formed in a lower portion of the first pillar-shaped semiconductor layer 129, the second diffusion layer 143a being further formed in the fin-shaped semiconductor layer 104.

A lower electrode 195a, a pillar-shaped resistance-changing layer 196a, a reset gate insulating film 202, and a reset gate 203a are formed on the second contact 183a.

The pillar-shaped resistance-changing layer 196a is preferably made of chalcogenide glass (GST: $Ge_2Sb_2Te_5$).

The reset gate 203a is made of any material that generates heat through current flow and is preferably made of titanium nitride.

The reset gate insulating film 202 is any highly thermally conductive insulating film and is preferably a nitride film.

The lower electrode 195a is made of any material that generates heat through current flow and is preferably made of titanium nitride.

As a result of current flow through the reset gate 203a, heat is generated in the reset gate 203a serving as a heater. This melts the pillar-shaped resistance-changing layer 196a that is in contact with the heater and thus a state transition can be made to occur.

The memory cell in the second row and the third column includes a fin-shaped semiconductor layer 104 formed on a semiconductor substrate 101; a first insulating film 106 formed around the fin-shaped semiconductor layer 104; a first pillar-shaped semiconductor layer 131 formed on the fin-shaped semiconductor layer 104; a gate insulating film 163 formed around the first pillar-shaped semiconductor layer 131; a gate electrode 170a made of a metal and formed around the gate insulating film 163; a gate line 170b made of a metal and connected to the gate electrode 170a, the gate line 170b extending in a direction perpendicular to a direction in which the fin-shaped semiconductor layer 104 extends, the gate insulating film 163 being formed around the gate electrode 170a and the gate line 170b and on bottom portions of the gate electrode 170a and the gate line 170b; a second gate insulating film 174 formed around an upper portion of the first pillar-shaped semiconductor layer 131; a first contact 181a made of a second metal and formed around the second gate insulating film 174; a second contact 185a which is made of a third metal and which connects an upper portion of the first contact 181a to an upper portion of the first pillar-shaped semiconductor layer 131; and a second diffusion layer 143a formed in a lower portion of the first pillar-shaped semiconductor layer 131, the second diffusion layer 143a being further formed in the fin-shaped semiconductor layer 104.

A lower electrode 195b, a pillar-shaped resistance-changing layer 196b, a reset gate insulating film 202, and a reset gate 203b are formed on the second contact 185a.

The upper portion of the pillar-shaped resistance-changing layer 196a and the upper portion of the pillar-shaped resistance-changing layer 196b are connected to each other through a bit line 208a.

The memory cell in the first row and the first column includes a fin-shaped semiconductor layer 105 formed on a semiconductor substrate 101; a first insulating film 106 formed around the fin-shaped semiconductor layer 105; a first pillar-shaped semiconductor layer 132 formed on the fin-shaped semiconductor layer 105; a gate insulating film 162 formed around the first pillar-shaped semiconductor layer 132; a gate electrode 168a made of a metal and formed around the gate insulating film 162; a gate line 168b made of a metal and connected to the gate electrode 168a, the gate line 168b extending in a direction perpendicular to a direction in which the fin-shaped semiconductor layer 105 extends, the gate insulating film 162 being formed around the gate electrode 168a and the gate line 168b and on bottom portions of the gate electrode 168a and the gate line 168b; a second gate insulating film 173 formed around an upper portion of the first pillar-shaped semiconductor layer 132; a first contact 179b made of a second metal and formed around the second gate insulating film 173; a second contact 183b which is made of a third metal and which connects an upper portion of the first contact 179b to an upper portion of the first pillar-shaped semiconductor layer 132; and a second diffusion layer 143b formed in a lower portion of the first pillar-shaped semiconductor layer 132, the second diffusion layer 143b being further formed in the fin-shaped semiconductor layer 105.

A lower electrode 195c, a pillar-shaped resistance-changing layer 196c, a reset gate insulating film 202, and a reset gate 203a are formed on the second contact 183b.

The memory cell in the first row and the third column includes a fin-shaped semiconductor layer 105 formed on a semiconductor substrate 101; a first insulating film 106 formed around the fin-shaped semiconductor layer 105; a first pillar-shaped semiconductor layer 134 formed on the fin-shaped semiconductor layer 105; a gate insulating film 163 formed around the first pillar-shaped semiconductor layer 134; a gate electrode 170a made of a metal and formed around the gate insulating film 163; a gate line 170b made of a metal and connected to the gate electrode 170a, the gate line 170b extending in a direction perpendicular to a direction in which the fin-shaped semiconductor layer 105 extends, the gate insulating film 163 being formed around the gate electrode 170a and the gate line 170b and on bottom portions of the gate electrode 170a and the gate line 170b; a second gate insulating film 174 formed around an upper portion of the first pillar-shaped semiconductor layer 134; a first contact 181b made of a second metal and formed around the second gate insulating film 174; a second contact 185b which is made of a third metal and which connects an upper portion of the first contact 181b to an upper portion of the first pillar-shaped semiconductor layer 134; and a second diffusion layer 143b formed in a lower portion of the first pillar-shaped semiconductor layer 134, the second diffusion layer 143b being further formed in the fin-shaped semiconductor layer 105.

A lower electrode 195d, a pillar-shaped resistance-changing layer 196d, a reset gate insulating film 202, and a reset gate 203b are formed on the second contact 185b.

The pillar-shaped resistance-changing layer 196c and the pillar-shaped resistance-changing layer 196d are connected to each other through a bit line 208b.

The gate electrodes 168a and 170a are made of a metal and the gate lines 168b and 170b are made of a metal. Furthermore, there are the first contacts 179a, 179b, 181a, and 181b made of a second metal and formed around the second gate insulating films 173 and 174 and the second contacts 183a, 183b, 185a, and 185b which are made of a third metal and which connect the upper portions of the first contacts 179a, 179b, 181a, and 181b to the upper portions of the pillar-shaped semiconductor layers 129, 131, 132, and 134. Since a large amount of metal is used, the cooling can be accelerated. In addition, since the gate insulating films 162 and 163 are formed around the gate electrodes 168a and 170a and the gate lines 168b and 170b and on bottom portions of the gate electrodes 168a and 170a and the gate lines 168b and 170b, a metal gate is formed through a gate last process. Therefore, both a metal gate process and a high-temperature process can be performed.

Furthermore, the gate insulating films 162 and 163 are formed around the gate electrodes 168a and 170a and the gate lines 168b and 170b and on bottom portions of the gate electrodes 168a and 170a and the gate lines 168b and 170b. The gate electrodes 168a and 170a are made of a metal. The gate lines 168b and 170b are made of a metal. The gate lines 168b and 170b extend in a direction perpendicular to a direction in which the fin-shaped semiconductor layers 104 and 105 extend. The second diffusion layers 143a and 143b are further formed in the fin-shaped semiconductor layers 104 and 105. The outer width of the gate electrodes 168a and 170a is equal to the width of the gate lines 168b and 170b. The width of the first pillar-shaped semiconductor layers 129, 131, 132, and 134 is equal to the width of the fin-shaped semiconductor layers 104 and 105. Thus, the fin-shaped semiconductor layers 104 and 105, the first pillar-shaped semiconductor layers 129, 131, 132, and 134, the gate electrodes 168a and 170a, and the gate lines 168b and 170b of the semiconductor device are formed through a self-aligned process with two masks. This can reduce the number of steps.

The contact device in the second row and the second column includes the fin-shaped semiconductor layer 104 formed on the semiconductor substrate 101; the first insulating film 106 formed around the fin-shaped semiconductor layer 104; a second pillar-shaped semiconductor layer 130 formed on the fin-shaped semiconductor layer 104, the width of the second pillar-shaped semiconductor layer 130 in a direction perpendicular to a direction in which the fin-shaped semiconductor layer 104 extends being equal to the width of the fin-shaped semiconductor layer 104 in a direction perpendicular to the direction in which the fin-shaped semiconductor layer 104 extends; a contact electrode 169a made of a metal and formed around the second pillar-shaped semiconductor layer 130; the gate insulating film 165 formed between the second pillar-shaped semiconductor layer 130 and the contact electrode 169a; the contact line 169b which is made of a metal and which extends in a direction perpendicular to a direction in which the fin-shaped semiconductor layer 104 connected to the contact electrode 169a extends; the gate insulating film 164 formed around the contact electrode 169a and the contact line 169b, the outer width of the contact electrode 169a being equal to the width of the contact line 169b; and the second diffusion layer 143a formed in the fin-shaped semiconductor layer 104 and in a lower portion of the second pillar-shaped semiconductor layer 130, the contact electrode 169a being connected to the second diffusion layer 143a.

The contact device also includes a second gate insulating film 175 formed around an upper portion of the second pillar-shaped semiconductor layer 130; a third contact 180a made of a second metal and formed around the second gate insulating film 175, the third contact 180a being connected to the contact electrode 169a; and a fourth contact 184a which is made of a third metal and which connects the upper portion of the third contact 180a to an upper portion of the second pillar-shaped semiconductor layer 130.

Therefore, the second diffusion layer 143a, the contact electrode 169a, the contact line 169b, the third contact 180a, and the fourth contact 184a are connected to each other.

The contact device in the first row and the second column includes the fin-shaped semiconductor layer 105 formed on the semiconductor substrate 101; the first insulating film 106 formed around the fin-shaped semiconductor layer 105; a second pillar-shaped semiconductor layer 133 formed on the fin-shaped semiconductor layer 105, the width of the second pillar-shaped semiconductor layer 133 in a direction perpendicular to a direction in which the fin-shaped semiconductor layer 105 extends being equal to the width of the fin-shaped semiconductor layer 105 in a direction perpendicular to the direction in which the fin-shaped semiconductor layer 105 extends; a contact electrode 169a made of a metal and formed around the second pillar-shaped semiconductor layer 133; the gate insulating film 166 formed between the second pillar-shaped semiconductor layer 133 and the contact electrode 169a; the contact line 169b which is made of a metal and which extends in a direction perpendicular to a direction in which the fin-shaped semiconductor layer 105 connected to the contact electrode 169a extends; the gate insulating film 164 formed around the contact electrode 169a and the contact line 169b, the outer width of the contact electrode 169a being equal to the width of the contact line 169b; and the second diffusion layer 143b formed in the fin-shaped semiconductor layer 105 and in a lower portion of the second pillar-shaped semiconductor layer 133, the contact electrode 169a being connected to the second diffusion layer 143b.

The contact device also includes a second gate insulating film 176 formed around an upper portion of the second pillar-shaped semiconductor layer 133; a third contact 180b made of a second metal and formed around the second gate insulating film 176, the third contact 180b being connected to the contact electrode 169a; and a fourth contact 184b which is made of a third metal and which connects the upper portion of the third contact 180b to an upper portion of the second pillar-shaped semiconductor layer 133.

Therefore, the second diffusion layer 143b, the contact electrode 169a, the contact line 169b, the third contact 180b, and the fourth contact 184b are connected to each other.

As a result of the presence of the contact line 169b which is parallel to the gate lines 168b and 170b and is connected to the second diffusion layers 143a and 143b, the second diffusion layers 143a and 143b are connected to each other. This can decrease the resistance of a source line and can suppress an increase in the source voltage caused by electric current at the time of the set operation. Regarding the contact line 169b which is parallel to the gate lines 168b and 170b, for example, one contact line 169b is preferably disposed for every 2 memory cells, 4 memory cells, 8 memory cells, 16 memory cells, 32 memory cells, or 64 memory cells arranged in a row in a direction in which the bit lines 208a and 208b extend.

A structure constituted by the second pillar-shaped semiconductor layers 130 and 133, the contact electrode 169a formed around the second pillar-shaped semiconductor layers 130 and 133, and the contact line 169b is the same as a transistor structure, except that the contact electrode 169a is connected to the second diffusion layers 143a and 143b. All source lines which are constituted by the second diffusion layers 143a and 143b and which extend in a direction parallel to a direction in which the gate lines 168b and 170b extend are connected to the contact line 169b. This can reduce the number of steps.

FIGS. 2A, 2B and 2C show a structure in which a second diffusion layer 143c is formed to a deep portion of the semiconductor substrate 101 so that the second diffusion layers 143a and 143b in FIGS. 1A, 1B and 1C are connected to each other. In this structure, the source resistance can be further decreased.

FIGS. 3A, 3B and 3C show a structure in which the fin-shaped semiconductor layer 105 in FIGS. 2A, 2B and 2C and the first insulating film 106 formed around the fin-shaped semiconductor layer 105 in FIGS. 2A, 2B and 2C are omitted and a second diffusion layer 143d is formed on the semiconductor substrate 101. In this structure, the source resistance can be further decreased.

A production process for forming a structure of a semiconductor device according to an embodiment of the present invention will be described below with reference to FIGS. 4A to 62C.

First, a first step will be described, the first step including forming a fin-shaped semiconductor layer on a semiconductor substrate and forming a first insulating film around the fin-shaped semiconductor layer. In this embodiment, a silicon substrate is employed, but any semiconductor substrate may be employed.

As shown in FIGS. 4A, 4B and 4C, first resists 102 and 103 for forming fin-shaped silicon layers are formed on a silicon substrate 101.

As shown in FIGS. 5A, 5B and 5C, the silicon substrate 101 is etched to form fin-shaped silicon layers 104 and 105. This time, the fin-shaped silicon layers are formed using a resist as a mask, but a hard mask such as an oxide film or a nitride film may be used.

As shown in FIGS. 6A, 6B and 6C, the first resists 102 and 103 are removed.

As shown in FIGS. 7A, 7B and 7C, a first insulating film 106 is deposited around the fin-shaped silicon layers 104 and 105. An oxide film formed by high-density plasma or an oxide film formed by low-pressure CVD (chemical vapor deposition) may be used as the first insulating film.

As shown in FIGS. 8A, 8B and 8C, the first insulating film 106 is etched back to expose upper portions of the fin-shaped silicon layers 104 and 105.

The first step has been described, the first step including forming a fin-shaped semiconductor layer on a semiconductor substrate and forming a first insulating film around the fin-shaped semiconductor layer.

Next, a second step will be described, the second step including, after the first step, forming a second insulating film around the fin-shaped semiconductor layer, depositing a first polysilicon on the second insulating film and planarizing the first polysilicon, forming a second resist for forming a first gate line, a first pillar-shaped semiconductor layer, a first contact line, and a second pillar-shaped semiconductor layer so that the second resist extends in a direction perpendicular to a direction in which the fin-shaped semiconductor layer extends, and etching the first polysilicon, the second insulating film, and the fin-shaped semiconductor layer to form a first pillar-shaped semiconductor layer, a first dummy gate constituted by the first polysilicon, a second pillar-shaped semiconductor layer, and a second dummy gate constituted by the first polysilicon.

Figure 9B:
FIG. 9B is a sectional view taken along line X-X' of FIG. 9A.
Figure 9C:
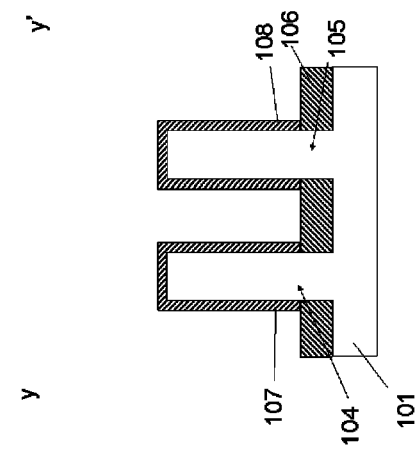
FIG. 9C is a sectional view taken along line Y-Y' of FIG. 9A.

As shown in FIGS. 9A, 9B and 9C, second insulating films 107 and 108 are formed around the fin-shaped silicon layers 104 and 105. The second insulating films 107 and 108 are preferably oxide films.

As shown in FIGS. 10A, 10B and 10C, a first polysilicon 109 is deposited on the second insulating films 107 and 108 and planarized.

Figure 11A:
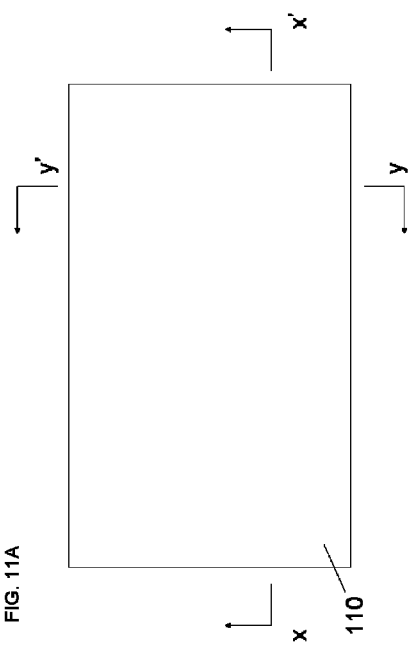
FIG. 11A is a plan view showing a method for producing a semiconductor device according to the present invention.
Figure 11C:
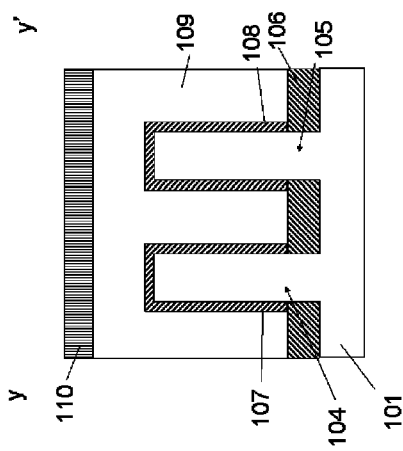
FIG. 11C is a sectional view taken along line Y-Y' of FIG. 11A.
Figure 11B:
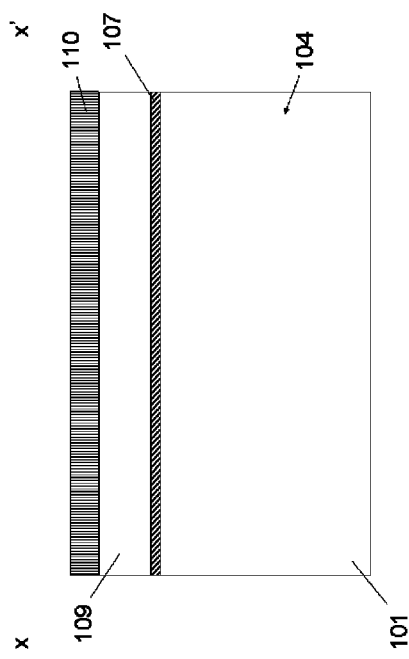
FIG. 11B is a sectional view taken along line X-X' of FIG. 11A.

As shown in FIGS. 11A, 11B and 11C, a third insulating film 110 is formed on the first polysilicon 109. The third insulating film 110 is preferably a nitride film.

Figure 12A:
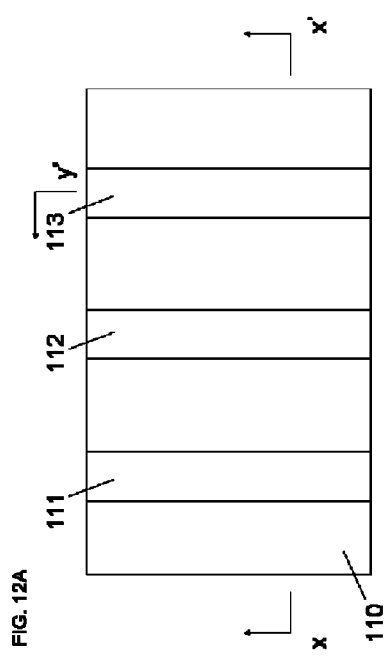
FIG. 12A is a plan view showing a method for producing a semiconductor device according to the present invention.
Figure 12C:
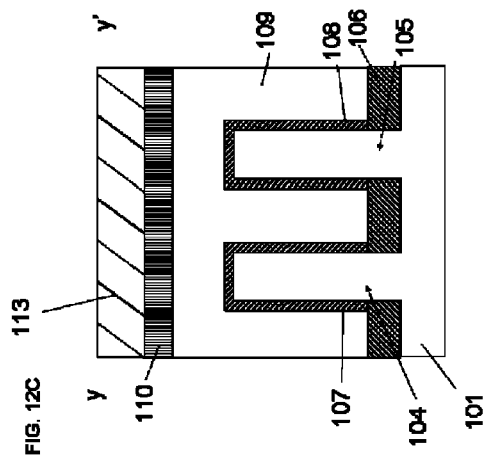
FIG. 12C is a sectional view taken along line Y-Y' of FIG. 12A.
Figure 12B:
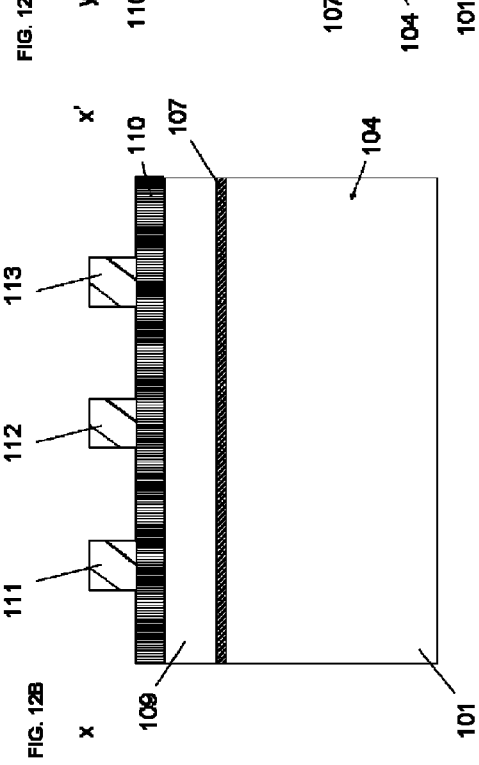
FIG. 12B is a sectional view taken along line X-X' of FIG. 12A.

As shown in FIGS. 12A, 12B and 2C, second resists 111, 112, and 113 for forming gate lines 168b and 170b, first pillar-shaped semiconductor layers 129, 131, 132, and 134, second pillar-shaped semiconductor layers 130 and 133, and a contact line 169b are formed so as to extend in a direction perpendicular to the direction in which the fin-shaped silicon layers 104 and 105 extend.

Figure 13A:
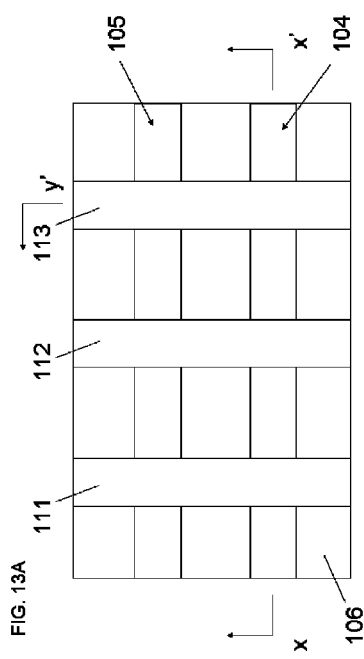
FIG. 13A is a plan view showing a method for producing a semiconductor device according to the present invention.
Figure 13C:
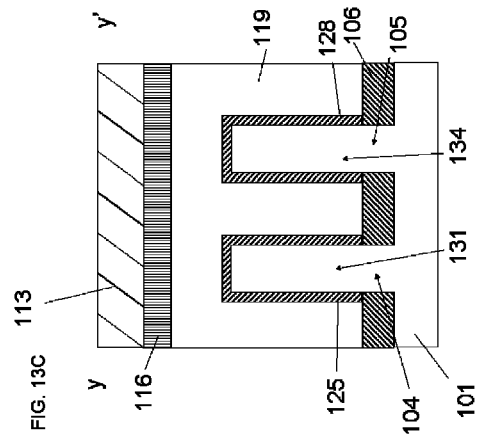
FIG. 13C is a sectional view taken along line Y-Y' of FIG. 13A.
Figure 13B:
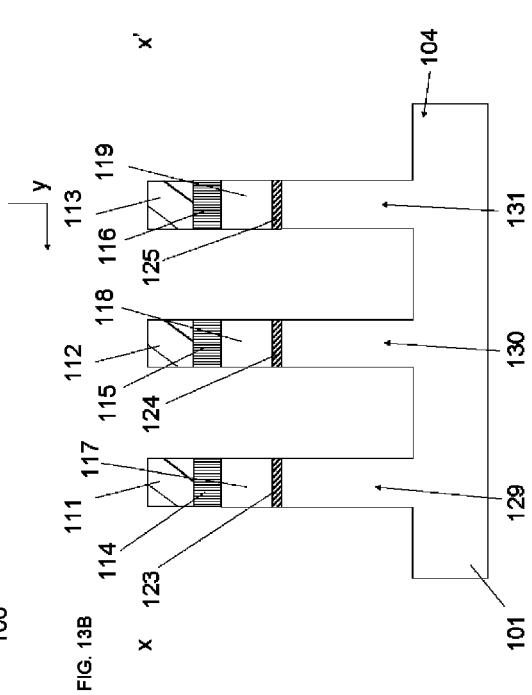
FIG. 13B is a sectional view taken along line X-X' of FIG. 13A.

As shown in FIGS. 13A, 13B and 13C, the third insulating film 110, the first polysilicon 109, the second insulating films 107 and 108, and the fin-shaped silicon layers 104 and 105 are etched to form first pillar-shaped silicon layers 129, 131, 132, and 134, first dummy gates 117 and 119 constituted by the first polysilicon, second pillar-shaped silicon layers 130 and 133, and a second dummy gate 118 constituted by the first polysilicon. Herein, the third insulating film 110 is separated into third insulating films 114, 115, and 116. The second insulating films 107 and 108 are separated into second insulating films 123, 124, 125, 126, 127, and 128. If the second resists 111, 112, and 113 are removed during the etching, the third insulating films 114, 115, and 116 function as hard masks. If the second resists are not removed during the etching, the third insulating film is not necessarily used.

As shown in FIGS. 14A, 14B and 14C, the second resists 111, 112, and 113 are removed.

The second step has been described, the second step including, after the first step, forming a second insulating film around the fin-shaped semiconductor layer, depositing a first polysilicon on the second insulating film and planarizing the first polysilicon, forming a second resist for forming a first gate line, a first pillar-shaped semiconductor layer, a first contact line, and a second pillar-shaped semiconductor layer so that the second resist extends in a direction perpendicular to a direction in which the fin-shaped semiconductor layer extends, and etching the first polysilicon, the second insulating film, and the fin-shaped semiconductor layer to form a first pillar-shaped semiconductor layer, a first dummy gate constituted by the first polysilicon, a second pillar-shaped semiconductor layer, and a second dummy gate constituted by the first polysilicon.

Next, a third step will be described, the third step including, after the second step, forming a fourth insulating film around the first pillar-shaped semiconductor layer, the second pillar-shaped semiconductor layer, the first dummy gate, and the second dummy gate, depositing a second polysilicon around the fourth insulating film, and forming a third dummy gate and a fourth dummy gate by etching the second polysilicon so that the second polysilicon is left on side walls of the first dummy gate, the first pillar-shaped semiconductor layer, the second dummy gate, and the second pillar-shaped semiconductor layer.

Figure 15C:
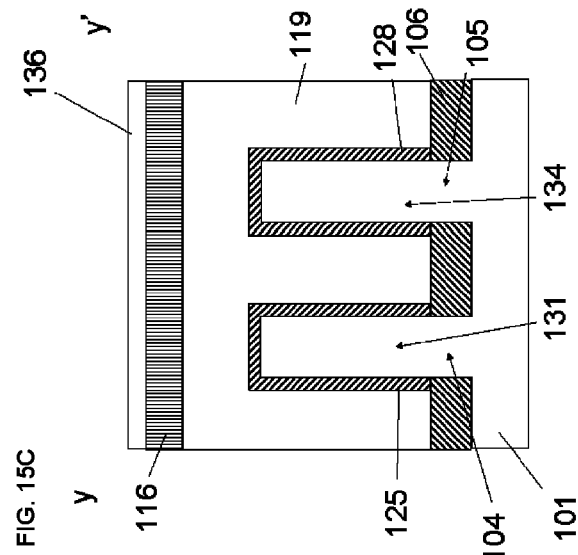
FIG. 15C is a sectional view taken along line Y-Y' of FIG. 15A.
Figure 15A:
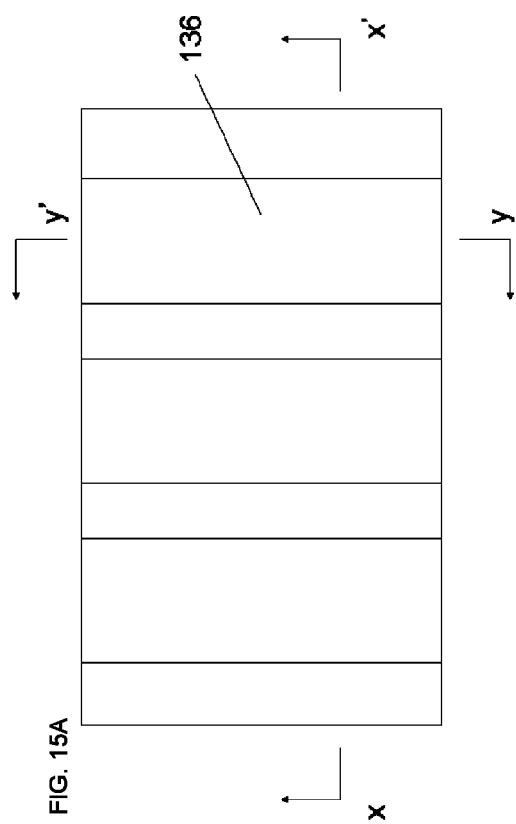
FIG. 15A is a plan view showing a method for producing a semiconductor device according to the present invention.
Figure 15B:
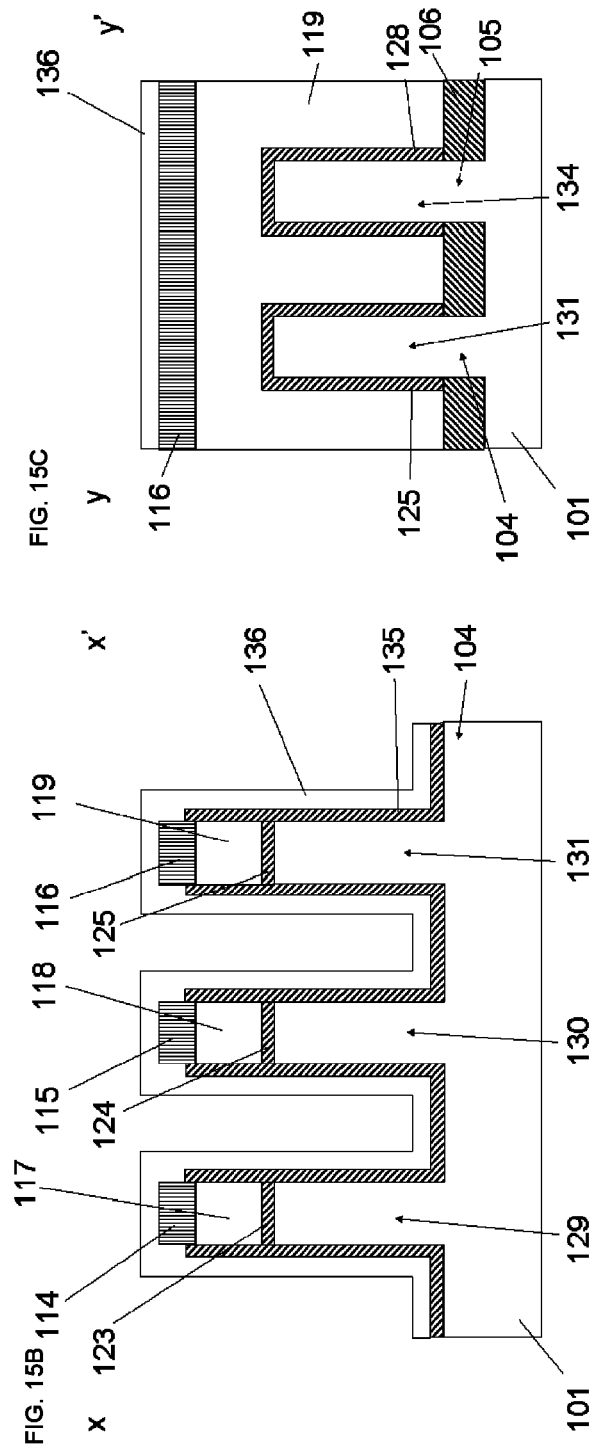
FIG. 15B is a sectional view taken along line X-X' of FIG. 15A.

As shown in FIGS. 15A, 15B and 15C, a fourth insulating film 135 is formed around the first pillar-shaped silicon layers 129, 131, 132, and 134, the second pillar-shaped silicon layers 130 and 133, the first dummy gates 117 and 119, and the second dummy gate 118. A second polysilicon 136 is deposited around the fourth insulating film 135.

Figure 16A:
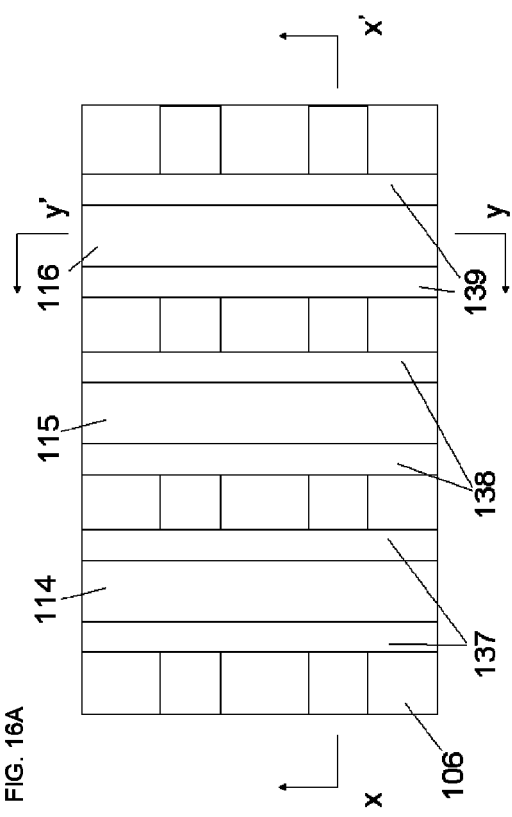
FIG. 16A is a plan view showing a method for producing a semiconductor device according to the present invention.
Figure 16B:
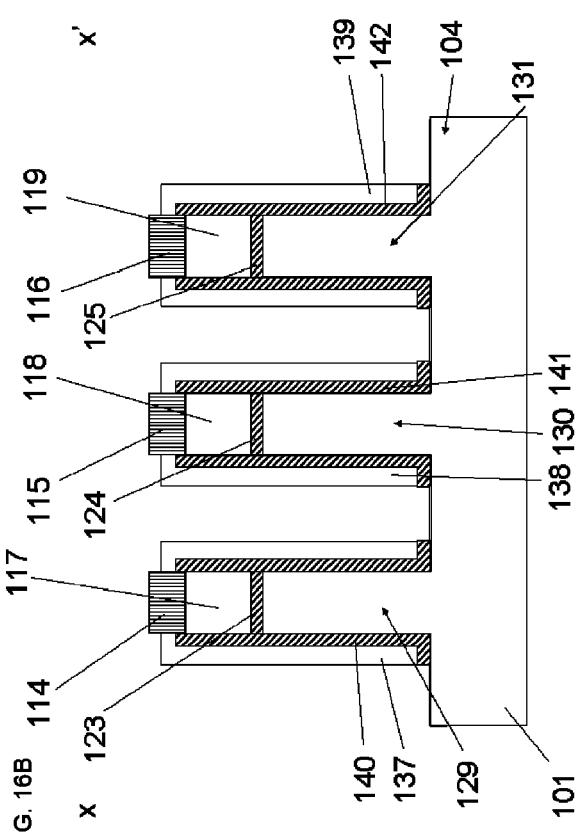
FIG. 16B is a sectional view taken along line X-X' of FIG. 16A.
Figure 16C:
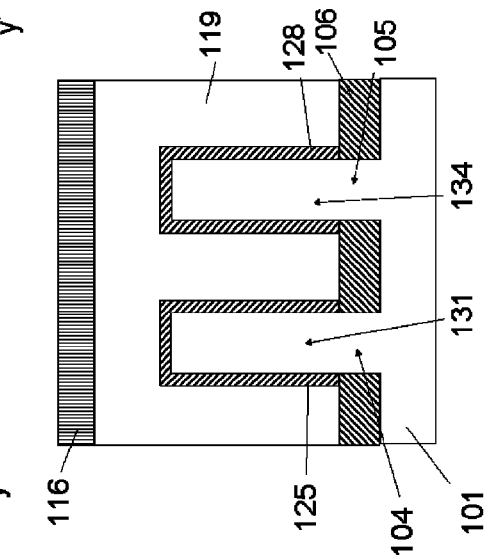
FIG. 16C is a sectional view taken along line Y-Y' of FIG. 16A.

As shown in FIGS. 16A, 16B and 16C, third dummy gates 137 and 139 and a fourth dummy gate 138 are formed by etching the second polysilicon 136 so that the second polysilicon 136 is left on side walls of the first dummy gates 117 and 119, the first pillar-shaped silicon layers 129, 131, 132, and 134, the second dummy gate 118, and the second pillar-shaped silicon layers 130 and 133. Herein, the fourth insulating film 135 may be separated into fourth insulating films 140, 141, and 142.

The third step has been described, the third step including, after the second step, forming a fourth insulating film around the first pillar-shaped semiconductor layer, the second pillar-shaped semiconductor layer, the first dummy gate, and the second dummy gate, depositing a second polysilicon around the fourth insulating film, and forming a third dummy gate and a fourth dummy gate by etching the second polysilicon so that the second polysilicon is left on side walls of the first dummy gate, the first pillar-shaped semiconductor layer, the second dummy gate, and the second pillar-shaped semiconductor layer.

Next, a fourth step will be described, the fourth step including forming a second diffusion layer in an upper portion of the fin-shaped semiconductor layer and lower portions of the first pillar-shaped semiconductor layer and the second pillar-shaped semiconductor layer, forming a fifth insulating film around the third dummy gate and the fourth dummy gate, etching the fifth insulating film to make the fifth insulating film remain as a side wall, and forming a metal and semiconductor compound in an upper portion of the second diffusion layer.

As shown in FIGS. 17A, 17B and 17C, an impurity is introduced to form second diffusion layers 143a and 143b in lower portions of the first pillar-shaped silicon layers 129, 131, 132, and 134 and the second pillar-shaped silicon layers 130 and 133. When n-type diffusion layers are formed, arsenic or phosphorus is preferably introduced. When p-type diffusion layers are formed, boron is preferably introduced. The formation of the diffusion layers may be performed after the formation of a side wall constituted by a fifth insulating film described below.

As shown in FIGS. 18A, 18B and 18C, a fifth insulating film 144 is formed around the third dummy gates 137 and 139 and the fourth dummy gate 138. The fifth insulating film 144 is preferably a nitride film.

Figure 19C:
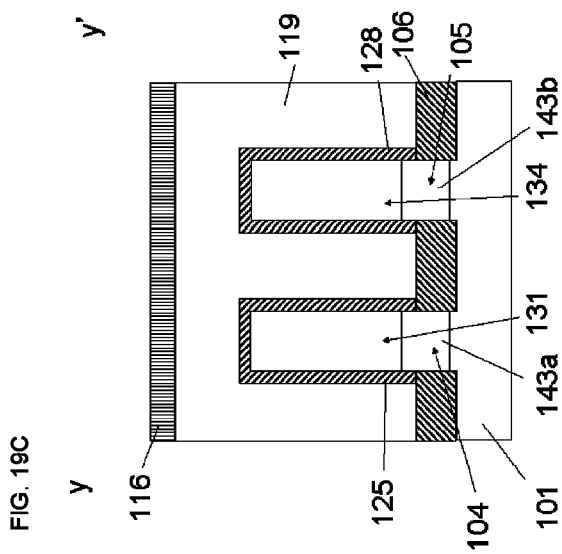
FIG. 19C is a sectional view taken along line Y-Y' of FIG. 19A.
Figure 19A:
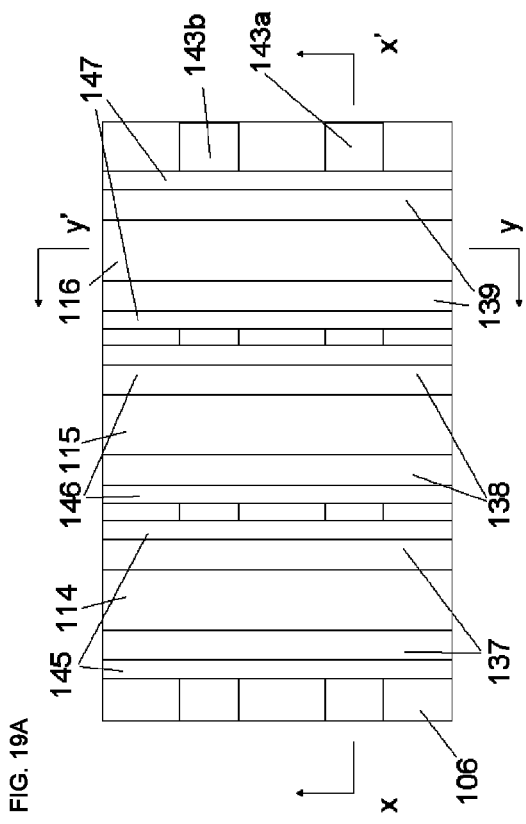
FIG. 19A is a plan view showing a method for producing a semiconductor device according to the present invention.
Figure 19B:
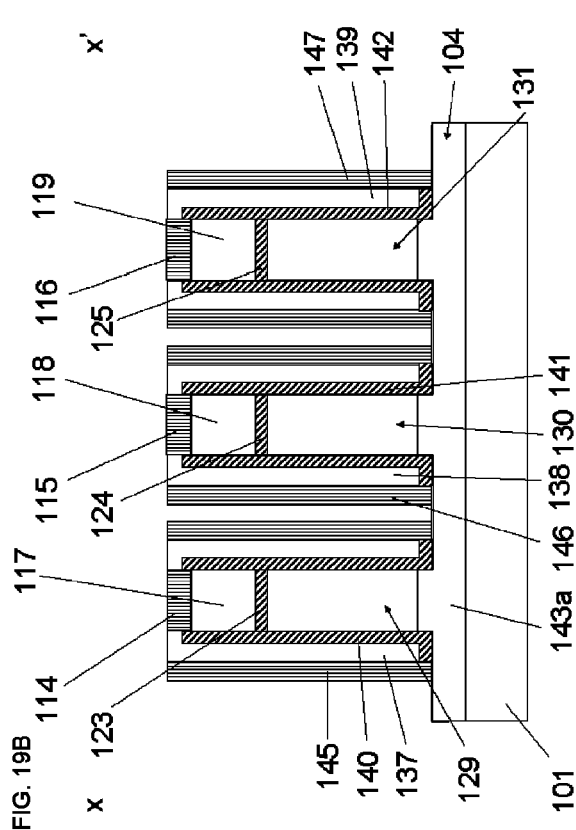
FIG. 19B is a sectional view taken along line X-X' of FIG. 19A.

As shown in FIGS. 19A, 19B and 19C, the fifth insulating film 144 is etched to make the fifth insulating film 144 remain as a side wall. Thus, side walls 145, 146, and 147 constituted by the fifth insulating film are formed.

Figure 20C:
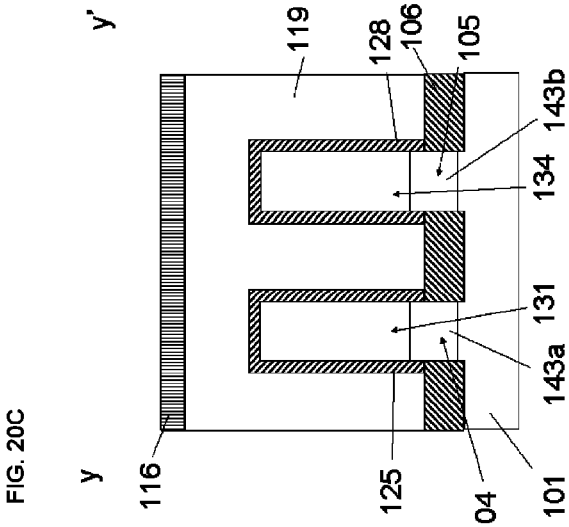
FIG. 20C is a sectional view taken along line Y-Y' of FIG. 20A.
Figure 20A:
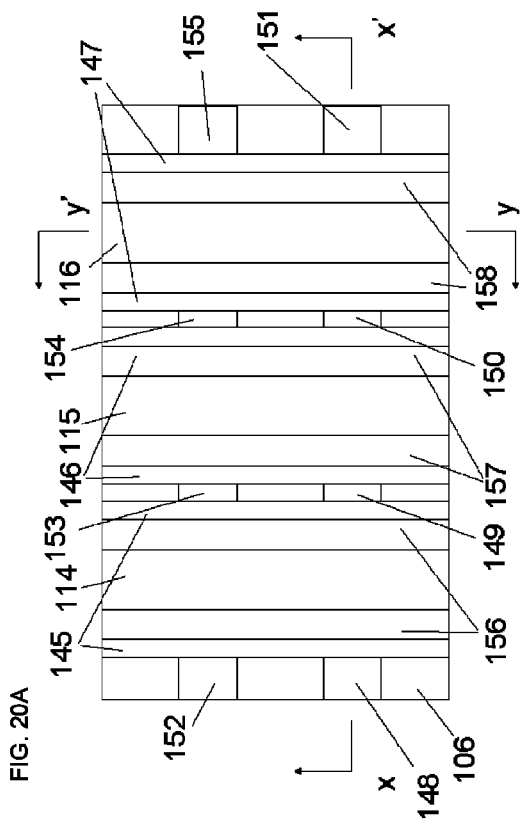
FIG. 20A is a plan view showing a method for producing a semiconductor device according to the present invention.
Figure 20B:
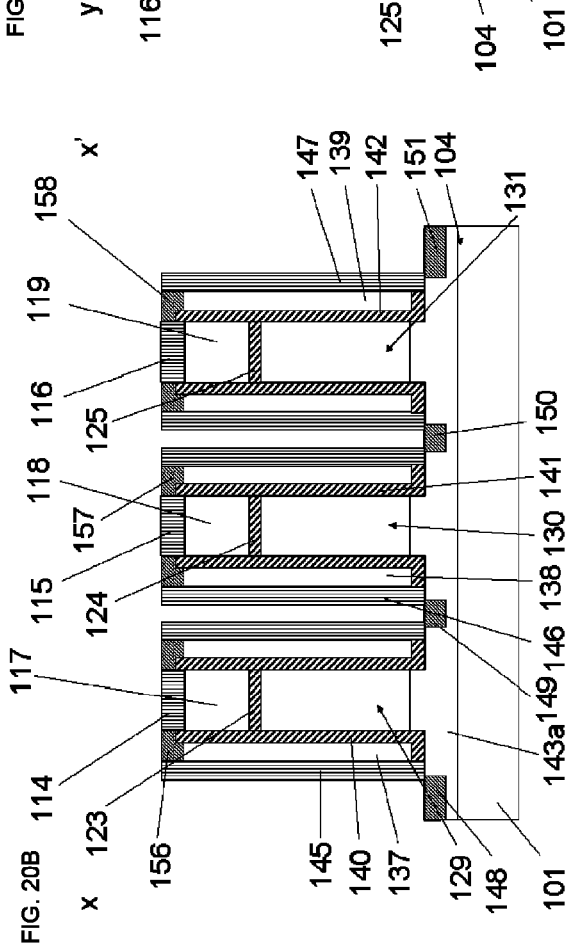
FIG. 20B is a sectional view taken along line X-X' of FIG. 20A.

As shown in FIGS. 20A, 20B and 20C, metal and semiconductor compounds 148, 149, 150, 151, 152, 153, 154, and 155 are formed in upper portions of the second diffusion layers 143a and 143b. Herein, metal and semiconductor compounds 156, 158, and 157 are also formed in upper portions of the third dummy gates 137 and 139 and an upper portion of the fourth dummy gate 138.

The fourth step has been described, the fourth step including forming a second diffusion layer in an upper portion of the fin-shaped semiconductor layer and lower portions of the first pillar-shaped semiconductor layer and the second pillar-shaped semiconductor layer, forming a fifth insulating film around the third dummy gate and the fourth dummy gate, etching the fifth insulating film to make the fifth insulating film remain as a side wall, and forming a metal and semiconductor compound in an upper portion of the second diffusion layer.

A fifth step will be described, the fifth step including, after the fourth step, depositing an interlayer insulating film, performing chemical mechanical polishing to expose upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film around the first pillar-shaped semiconductor layer and the second pillar-shaped semiconductor layer and on an inner side of the fifth insulating film, forming a third resist for removing a portion of the gate insulating film located in a periphery of a bottom portion of the second pillar-shaped semiconductor layer, removing the portion of the gate insulating film located in the periphery of the bottom portion of the second pillar-shaped semiconductor layer, and depositing a first metal and etching back the first metal to expose an upper portion of the first pillar-shaped semiconductor layer and an upper portion of the second pillar-shaped semiconductor layer, to form a gate electrode and a gate line around the first pillar-shaped semiconductor layer, and to form a contact electrode and a contact line around the second pillar-shaped semiconductor layer.

Figure 21A:
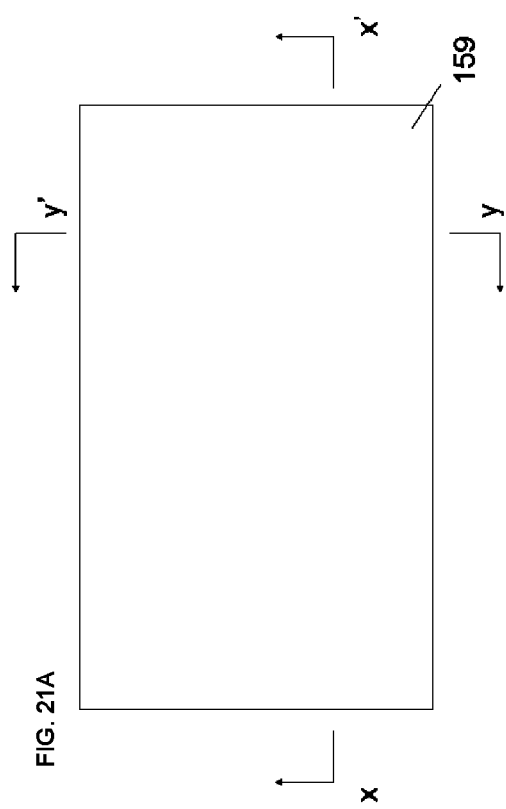
FIG. 21A is a plan view showing a method for producing a semiconductor device according to the present invention.
Figure 21C:
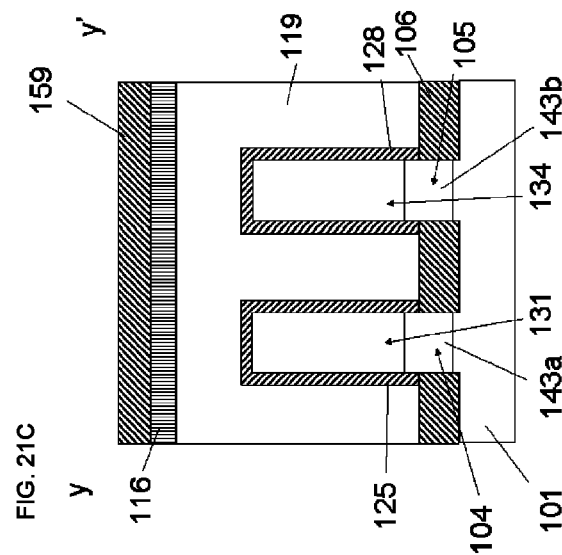
FIG. 21C is a sectional view taken along line Y-Y' of FIG. 21A.
Figure 21B:
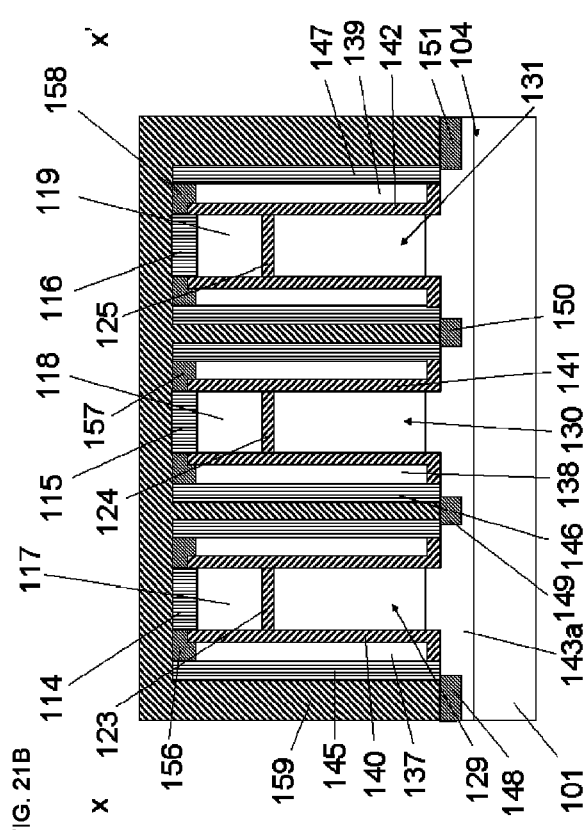
FIG. 21B is a sectional view taken along line X-X' of FIG. 21A.

As shown in FIGS. 21A, 21B and 21C, an interlayer insulating film 159 is deposited. A contact stopper film may be used.

As shown in FIGS. 22A, 22B and 22C, chemical mechanical polishing is performed to expose upper portions of the first dummy gates 117 and 119, the second dummy gate 118, the third dummy gates 137 and 139, and the fourth dummy gate 138. Herein, the metal and semiconductor compounds 156, 158, and 157 located in the upper portions of the third dummy gates 137 and 139 and the fourth dummy gate 138 are removed.

As shown in FIGS. 23A, 23B and 23C, the first dummy gates 117 and 119, the second dummy gate 118, the third dummy gates 137 and 139, and the fourth dummy gate 138 are removed.

As shown in FIGS. 24A, 24B and 24C, the second insulating films 123, 124, 125, 126, 127, and 128 and the fourth insulating films 140, 141, and 142 are removed.

Figure 25A:
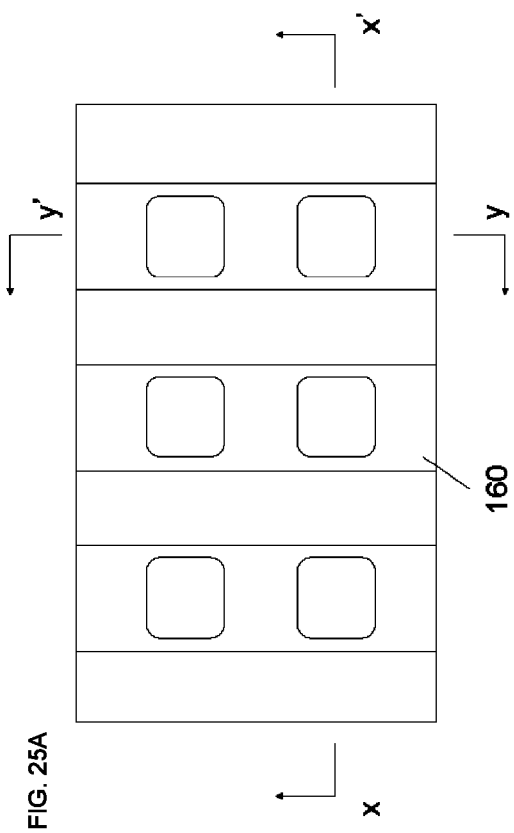
FIG. 25A is a plan view showing a method for producing a semiconductor device according to the present invention.
Figure 25B:
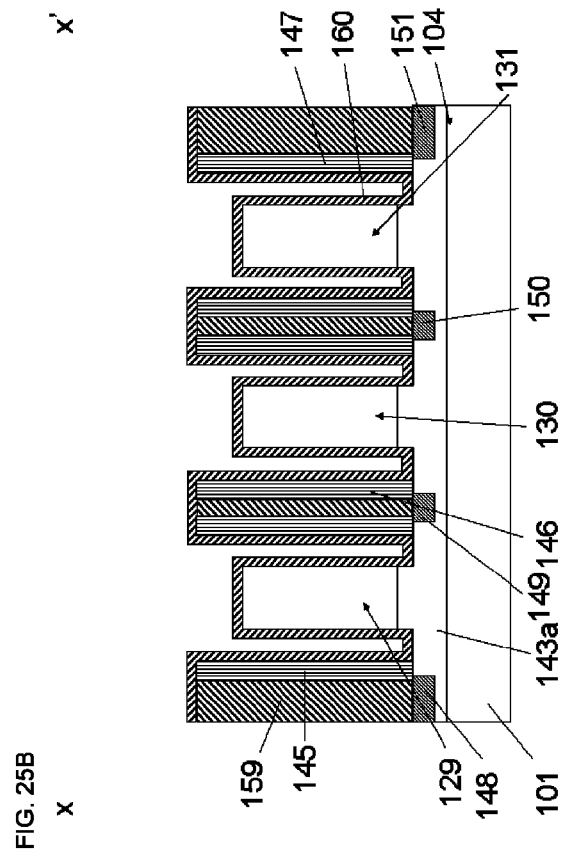
FIG. 25B is a sectional view taken along line X-X' of FIG. 25A.
Figure 25C:
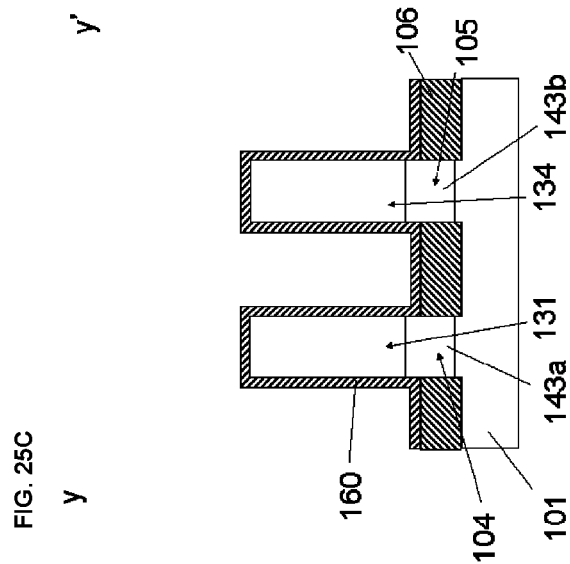
FIG. 25C is a sectional view taken along line Y-Y' of FIG. 25A.

As shown in FIGS. 25A, 25B and 25C, a gate insulating film 160 is formed around the first pillar-shaped silicon layers 129, 131, 132, and 134 and the second pillar-shaped silicon layers 130 and 133 and on the inner sides of the fifth insulating films 145, 146, and 147.

Figure 26A:
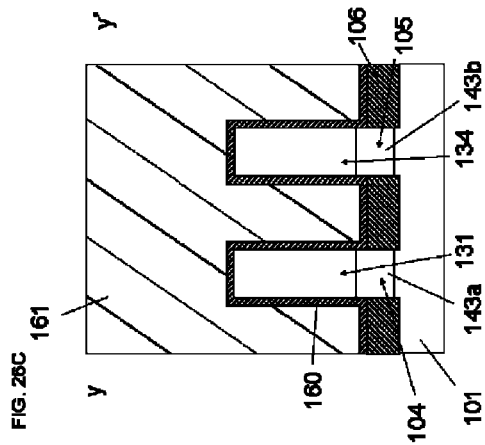
FIG. 26A is a plan view showing a method for producing a semiconductor device according to the present invention.
Figure 26B:
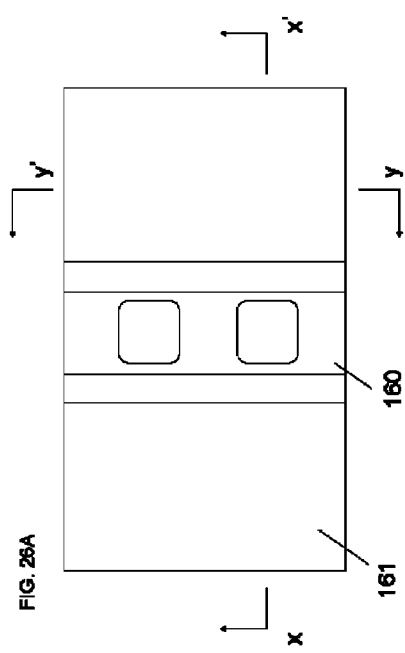
FIG. 26B is a sectional view taken along line X-X' of FIG. 26A.
Figure 26C:
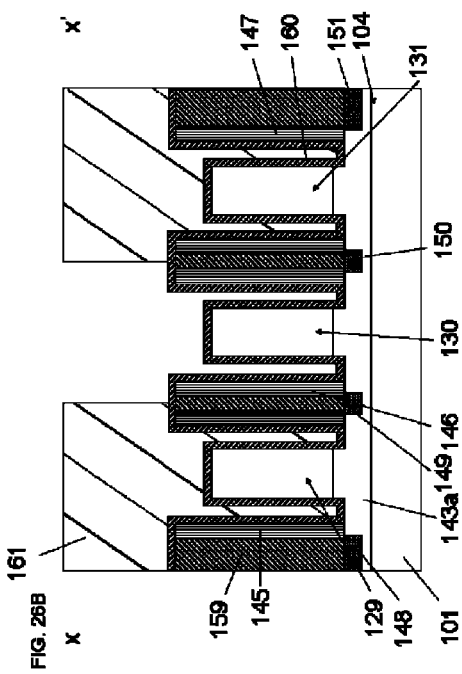
FIG. 26C is a sectional view taken along line Y-Y' of FIG. 26A.

As shown in FIGS. 26A, 26B and 26C, a third resist 161 for removing portions of the gate insulating film 160 located in peripheries of the bottom portions of the second pillar-shaped silicon layers 130 and 133 is formed.

As shown in FIGS. 27A, 27B and 27C, the portions of the gate insulating film 160 located in the peripheries of the bottom portions of the second pillar-shaped silicon layers 130 and 133 are removed. The gate insulating film is separated into gate insulating films 162, 163, 164, 165, and 166. Furthermore, the gate insulating films 164, 165, and 166 may be removed by isotropic etching.

Figure 28A:
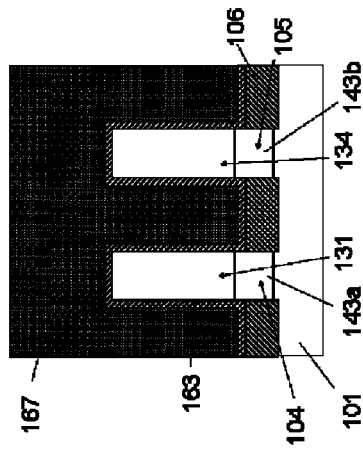
FIG. 28A is a plan view showing a method for producing a semiconductor device according to the present invention.
Figure 28C:
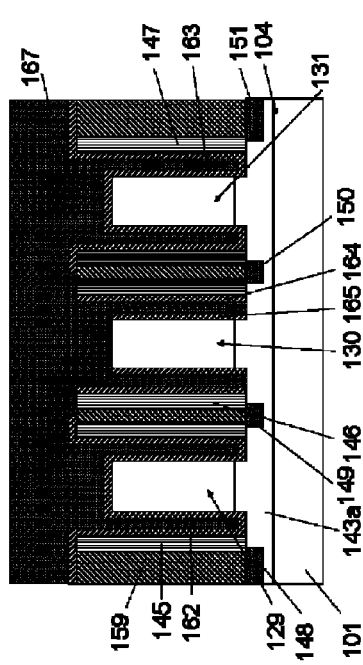
FIG. 28C is a sectional view taken along line Y-Y' of FIG. 28A.

As shown in FIGS. 28A, 28B and 28C, the third resist 161 is removed.

Figure 29B:
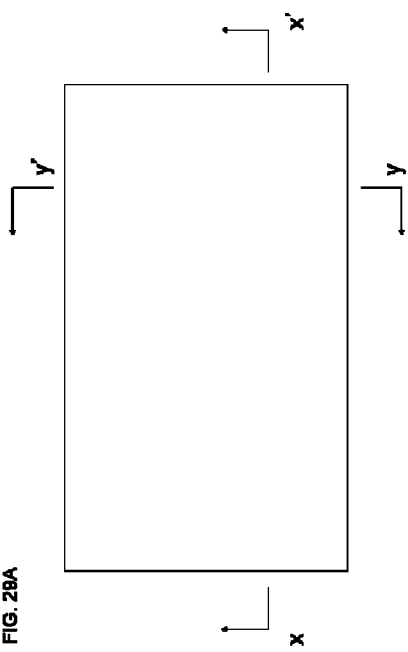
FIG. 29B is a sectional view taken along line X-X' of FIG. 29A.

As shown in FIGS. 29A, 29B and 29C, a metal 167 is deposited.

Figure 30C:
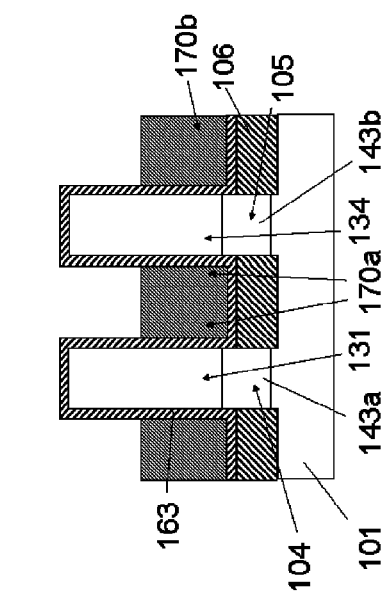
FIG. 30C is a sectional view taken along line Y-Y' of FIG. 30A.
Figure 30A:
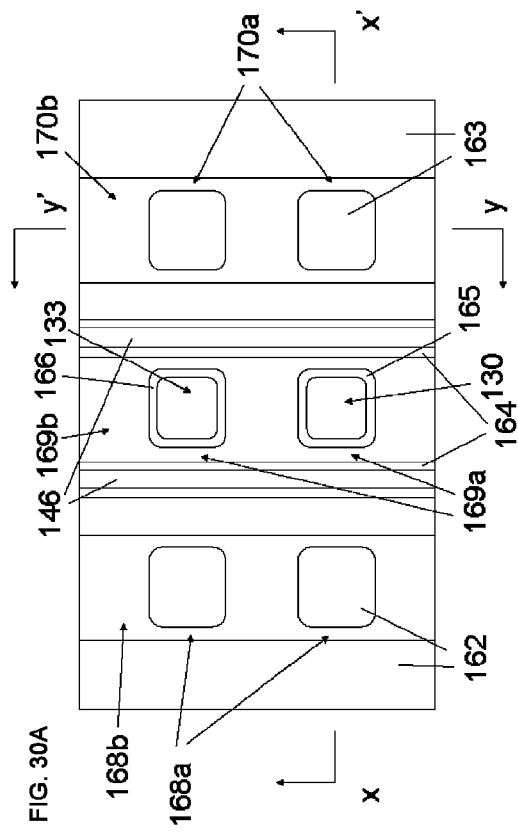
FIG. 30A is a plan view showing a method for producing a semiconductor device according to the present invention.
Figure 30B:
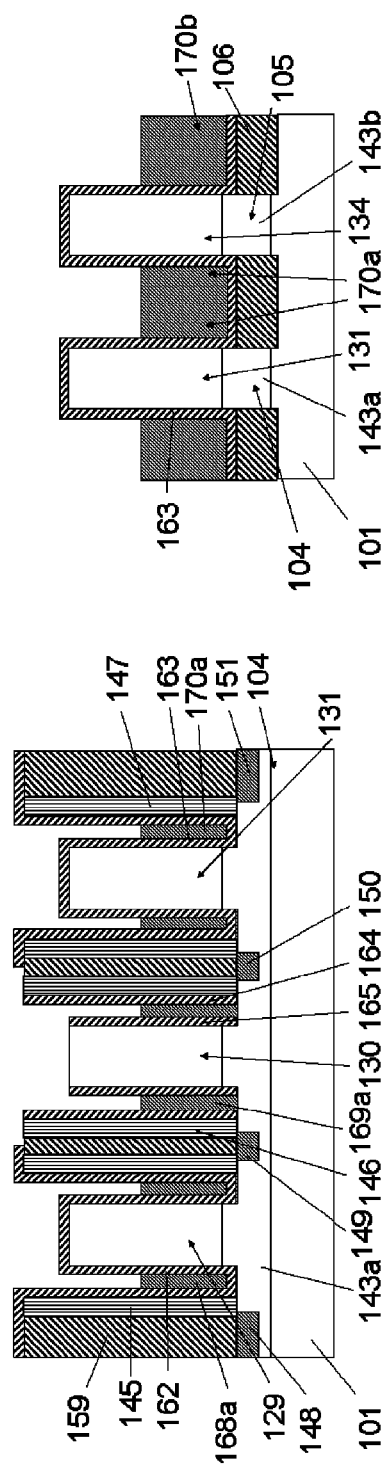
FIG. 30B is a sectional view taken along line X-X' of FIG. 30A.

As shown in FIGS. 30A, 30B and 30C, the metal 167 is etched back to form gate electrodes 168a and 170a and gate lines 168b and 170b around the first pillar-shaped silicon layers 129, 131, 132, and 134 and to form a contact electrode 169a and a contact line 169b around the second pillar-shaped silicon layers 130 and 133.

The fifth step has been described, the fifth step including, after the fourth step, depositing an interlayer insulating film, performing chemical mechanical polishing to expose upper portions of the first dummy gate, the second dummy gate, the third dummy gate, and the fourth dummy gate, removing the first dummy gate, the second dummy gate, the third dummy gate, and the fourth dummy gate, removing the second insulating film and the fourth insulating film, forming a gate insulating film around the first pillar-shaped semiconductor layer and the second pillar-shaped semiconductor layer and on an inner side of the fifth insulating film, forming a third resist for removing a portion of the gate insulating film located in a periphery of a bottom portion of the second pillar-shaped semiconductor layer, removing the portion of the gate insulating film located in the periphery of the bottom portion of the second pillar-shaped semiconductor layer, and depositing a first metal and etching back the first metal to expose an upper portion of the first pillar-shaped semiconductor layer and an upper portion of the second pillar-shaped semiconductor layer, to form a gate electrode and a gate line around the first pillar-shaped semiconductor layer, and to form a contact electrode and a contact line around the second pillar-shaped semiconductor layer.

Next, a sixth step will be described, the sixth step including, after the fifth step, depositing a second gate insulating film around the first pillar-shaped semiconductor layer, on the gate electrode and the gate line, around the second pillar-shaped semiconductor layer, and on the contact electrode and the contact line, depositing a second metal, exposing an upper portion of the first pillar-shaped semiconductor layer and an upper portion of the second pillar-shaped semiconductor layer, removing a portion of the second gate insulating film on the first pillar-shaped semiconductor layer, depositing a third metal, and etching the portions of the third metal and the second metal to form a first contact in which the second metal surrounds an upper side wall of the first pillar-shaped semiconductor layer and to form a second contact which connects an upper portion of the first contact to an upper portion of the first pillar-shaped semiconductor layer.

As shown in FIGS. 31A, 31B and 31C, the exposed gate insulating films 162, 163, 164, 165, and 166 are removed.

Figures 32A, 32B, 32C:
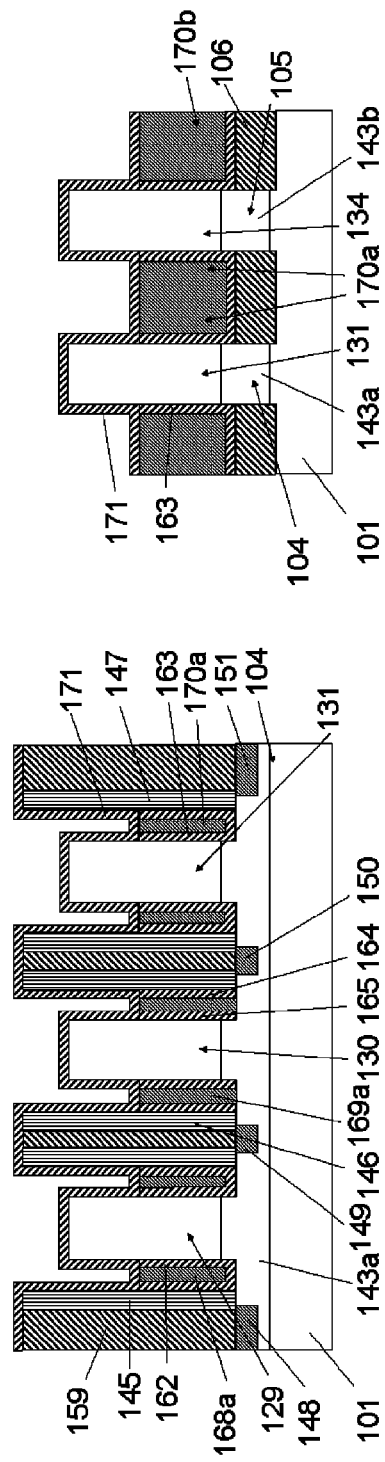
FIG. 32A is a plan view showing a method for producing a semiconductor device according to the present invention.
FIG. 32B is a sectional view taken along line X-X' of FIG. 32A.
FIG. 32C is a sectional view taken along line Y-Y' of FIG. 32A.

As shown in FIGS. 32A, 32B and 32C, a second gate insulating film 171 is deposited around the first pillar-shaped silicon layers 129, 131, 132, and 134, on the gate electrodes 168a and 170a and the gate lines 168b and 170b, around the second pillar-shaped silicon layers 130 and 133, and on the contact electrode 169a and the contact line 169b.

As shown in FIGS. 33A, 33B and 33C, a fourth resist 172 for removing at least a portion of the second gate insulating film 171 on the contact electrode 169a and the contact line 169b is formed.

As shown in FIGS. 34A, 34B and 34C, at least a portion of the second gate insulating film 171 on the contact electrode 169a and the contact line 169b is removed. The second gate insulating film 171 is separated into second gate insulating films 173, 174, 175, 176, and 177. The second gate insulating films 175, 176, and 177 may be removed by isotropic etching.

To form contacts, etching may be performed by a thickness of the first gate insulating film and by a thickness of the second gate insulating film, which does not require a step of forming a deep contact hole.

As shown in FIGS. 35A, 35B and 35C, the fourth resist 172 is removed.

Figure 36A:
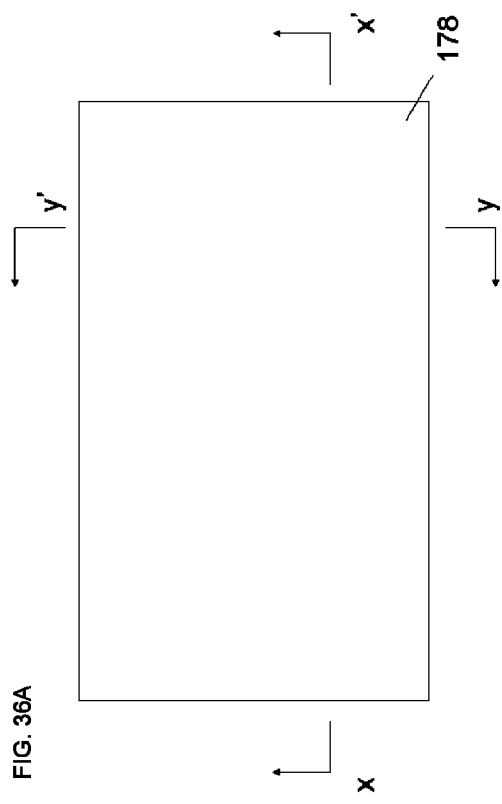
FIG. 36A is a plan view showing a method for producing a semiconductor device according to the present invention.
Figure 36B:
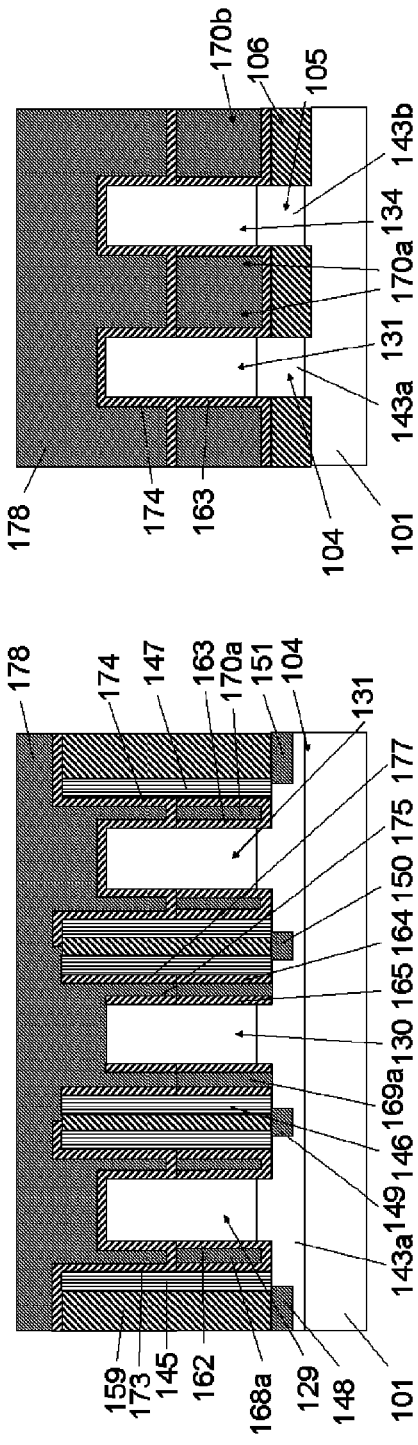
FIG. 36B is a sectional view taken along line X-X' of FIG. 36A.
Figure 36C:
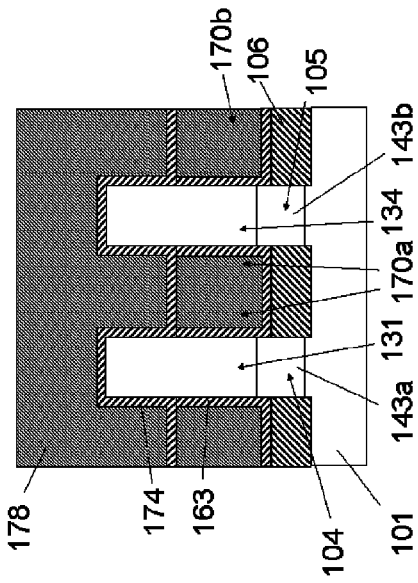
FIG. 36C is a sectional view taken along line Y-Y' of FIG. 36A.

As shown in FIGS. 36A, 36B and 36C, a second metal 178 is deposited. In the case of n-type transistors, the second metal 178 preferably has a work function of 4.0 eV to 4.2 eV. In the case of p-type transistors, the second metal 178 preferably has a work function of 5.0 eV to 5.2 eV.

As shown in FIGS. 37A, 37B and 37C, the second metal 178 is etched back to expose the upper portions of the first pillar-shaped silicon layers 129, 131, 132, and 134 and the upper portions of the second pillar-shaped silicon layers 130 and 133. Herein, the second metal 178 is changed into second metal lines 179, 180, and 181.

As shown in FIGS. 38A, 38B and 38C, portions of the second gate insulating films 173 and 174 on the exposed first pillar-shaped silicon layers 129, 131, 132, and 134 are removed.

Figure 39A:
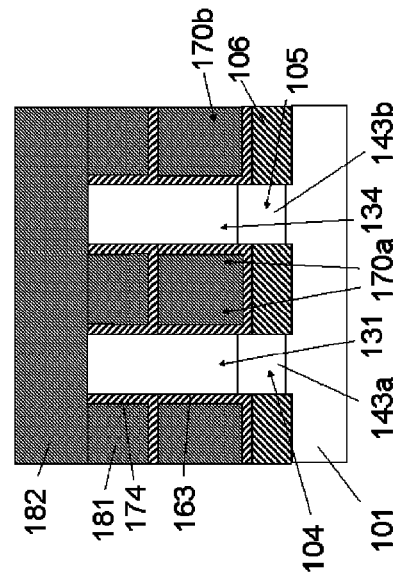
FIG. 39A is a plan view showing a method for producing a semiconductor device according to the present invention.
Figure 39B:
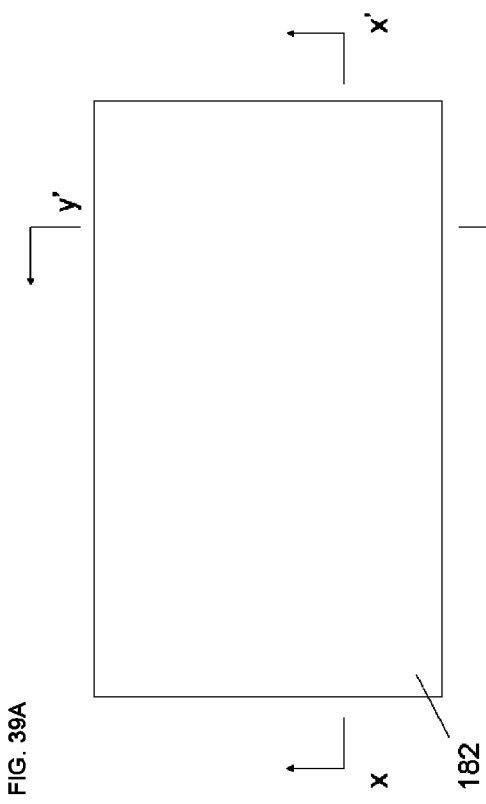
FIG. 39B is a sectional view taken along line X-X' of FIG. 39A.
Figure 39C:
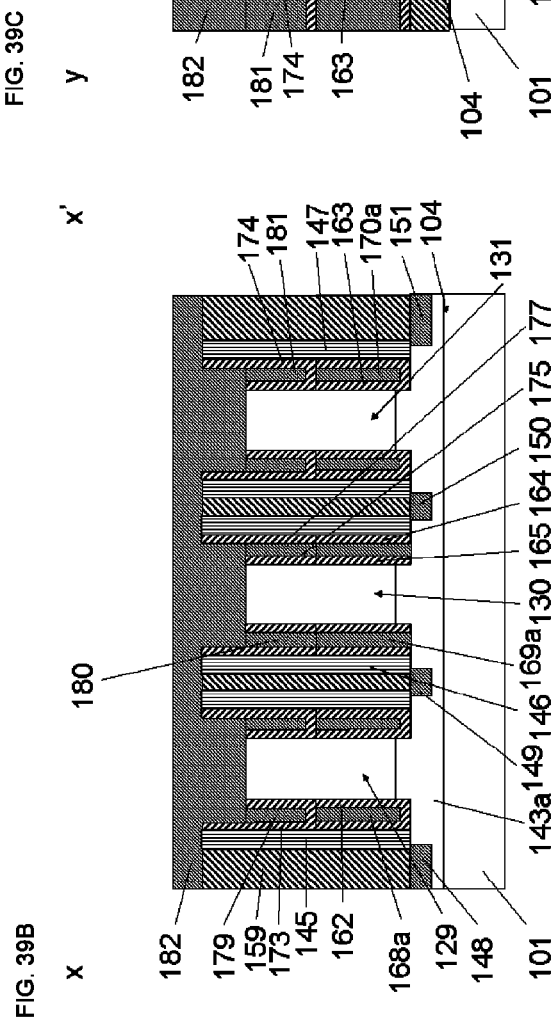
FIG. 39C is a sectional view taken along line Y-Y' of FIG. 39A.

As shown in FIGS. 39A, 39B and 39C, a third metal 182 is deposited. The third metal 182 may be the same metal as the second metal 178.

As shown in FIGS. 40A, 40B and 40C, the third metal 182 is etched back to form third metal lines 183, 184, and 185.

Figure 41A:
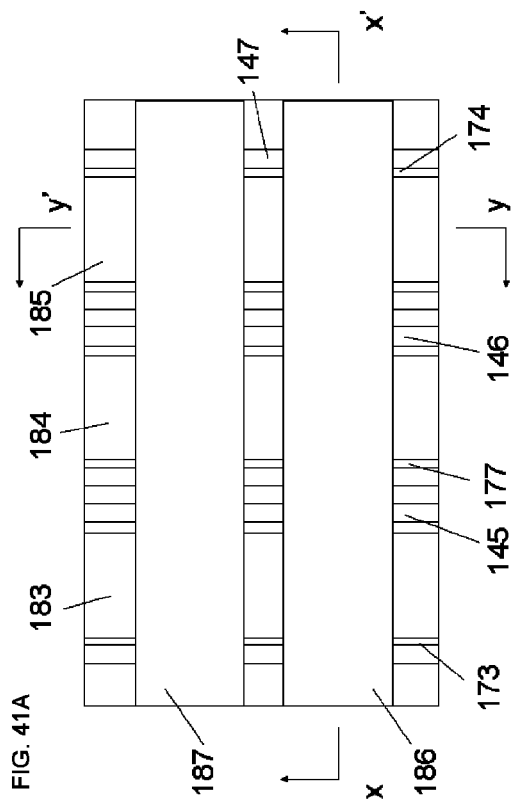
FIG. 41A is a plan view showing a method for producing a semiconductor device according to the present invention.
Figure 41C:
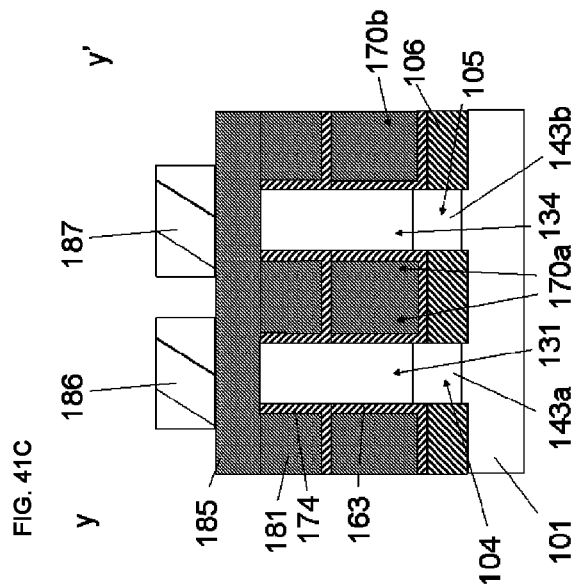
FIG. 41C is a sectional view taken along line Y-Y' of FIG. 41A.
Figure 41B:
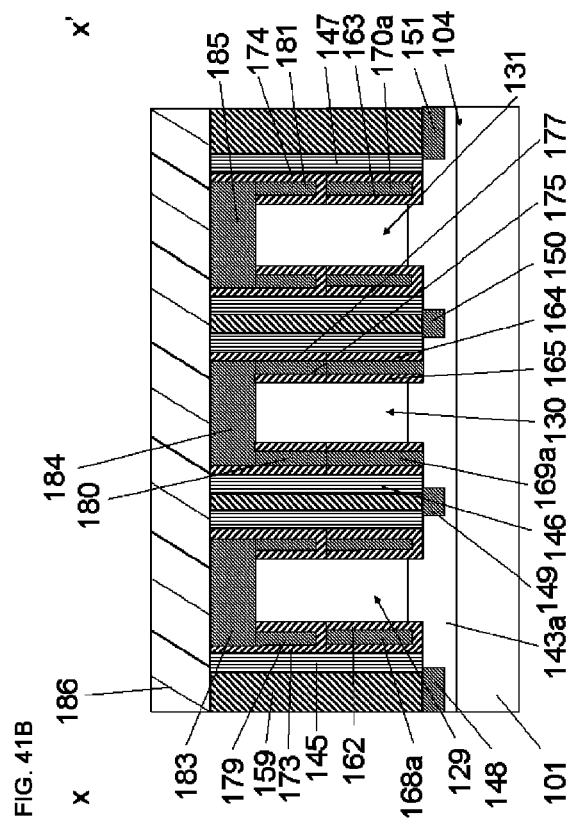
FIG. 41B is a sectional view taken along line X-X' of FIG. 41A.

As shown in FIGS. 41A, 41B and 41B, fifth resists 186 and 187 which extend so as to be perpendicular to the second metal lines 179, 180, and 181 and the third metal lines 183, 184, and 185 are formed.

Figure 42A:
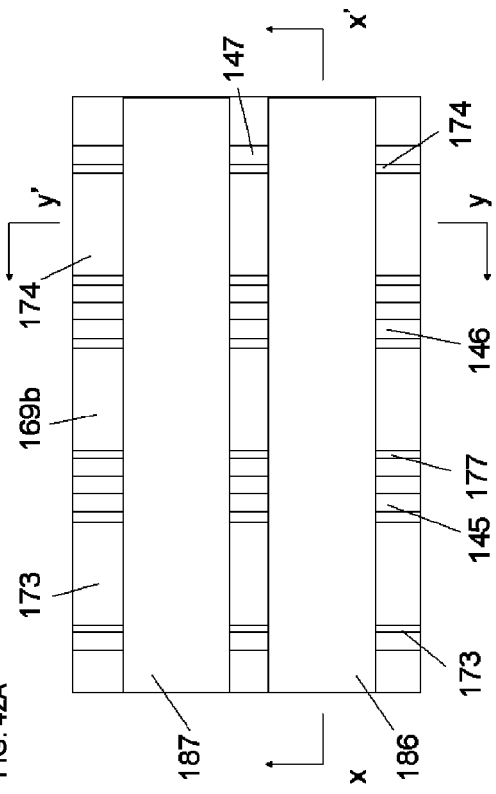
FIG. 42A is a plan view showing a method for producing a semiconductor device according to the present invention.
Figure 42C:
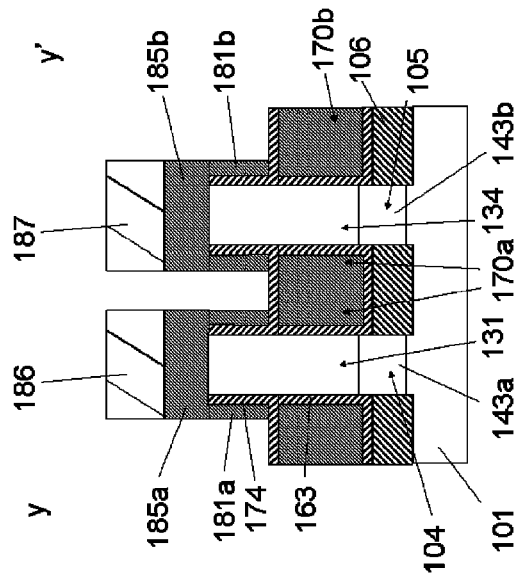
FIG. 42C is a sectional view taken along line Y-Y' of FIG. 42A.
Figure 42B:
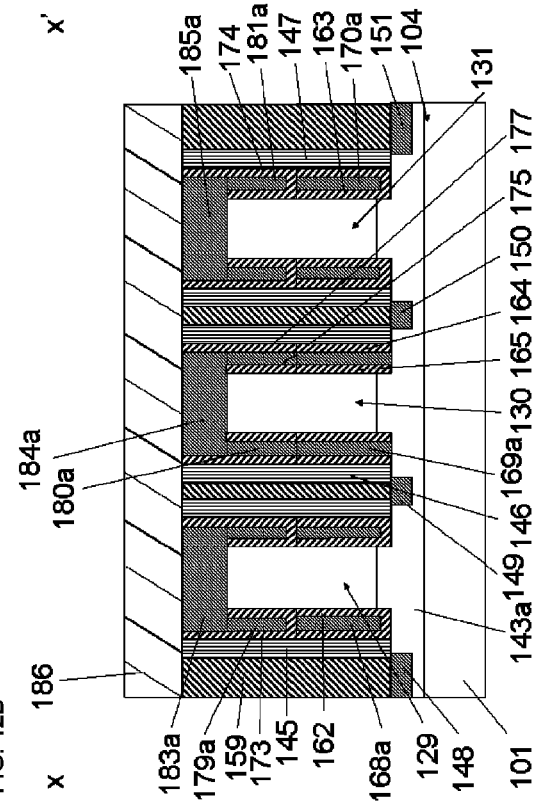
FIG. 42B is a sectional view taken along line X-X' of FIG. 42A.

As shown in FIGS. 42A, 42B and 42C, the second metal lines 179, 180, and 181 and the third metal lines 183, 184, and 185 are etched to form first contacts 179a, 179b, 181a, and 181b, second contacts 183a, 183b, 185a, and 185b, third contacts 180a and 180b, and fourth contacts 184a and 184b.

As shown in FIGS. 43A, 43B and 43C, the fifth resists 186 and 187 are removed.

The sixth step has been described, the sixth step including, after the fifth step, depositing a second gate insulating film around the first pillar-shaped semiconductor layer, on the gate electrode and the gate line, around the second pillar-shaped semiconductor layer, and on the contact electrode and the contact line, depositing a second metal, exposing an upper portion of the first pillar-shaped semiconductor layer and an upper portion of the second pillar-shaped semiconductor layer, removing a portion of the second gate insulating film on the first pillar-shaped semiconductor layer, depositing a third metal, and etching the portions of the third metal and the second metal to form a first contact in which the second metal surrounds an upper side wall of the first pillar-shaped semiconductor layer and to form a second contact which connects an upper portion of the first contact to an upper portion of the first pillar-shaped semiconductor layer.

Next, a seventh step will be described, the seventh step including, after the sixth step, depositing a second interlayer insulating film and planarizing the second interlayer insulating film to expose an upper portion of the second contact, forming a pillar-shaped resistance-changing layer and a lower electrode, forming a reset gate insulating film so that the reset gate insulating film surrounds the pillar-shaped resistance-changing layer and the lower electrode, and forming a reset gate.

As shown in FIGS. 44A, 44B and 44C, the second interlayer insulating film 194 is deposited and planarized to expose the upper portions of the second contacts 183a, 183b, 185a, and 185b. Herein, the upper portions of the fourth contacts 184a and 184b may be exposed.

Figure 45C:
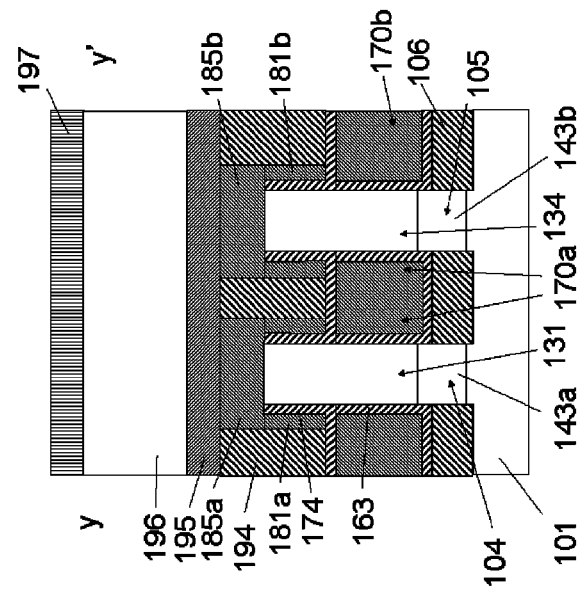
FIG. 45C is a sectional view taken along line Y-Y' of FIG. 45A.
Figure 45A:
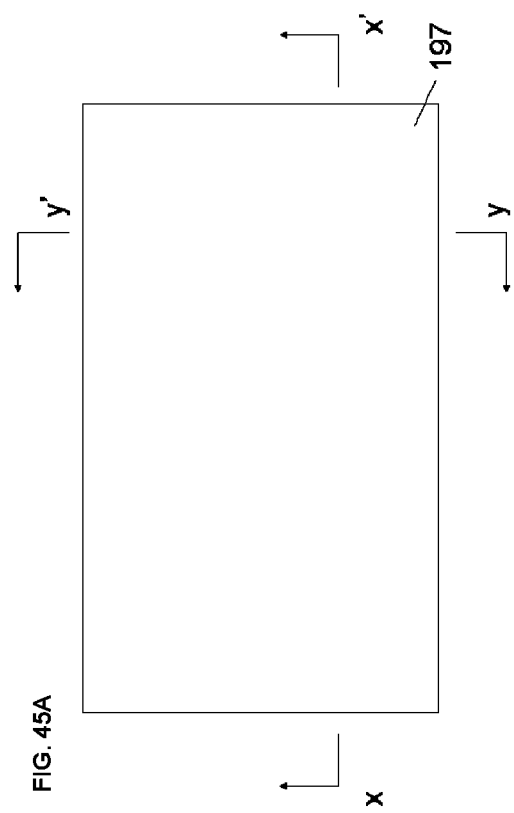
FIG. 45A is a plan view showing a method for producing a semiconductor device according to the present invention.
Figure 45B:
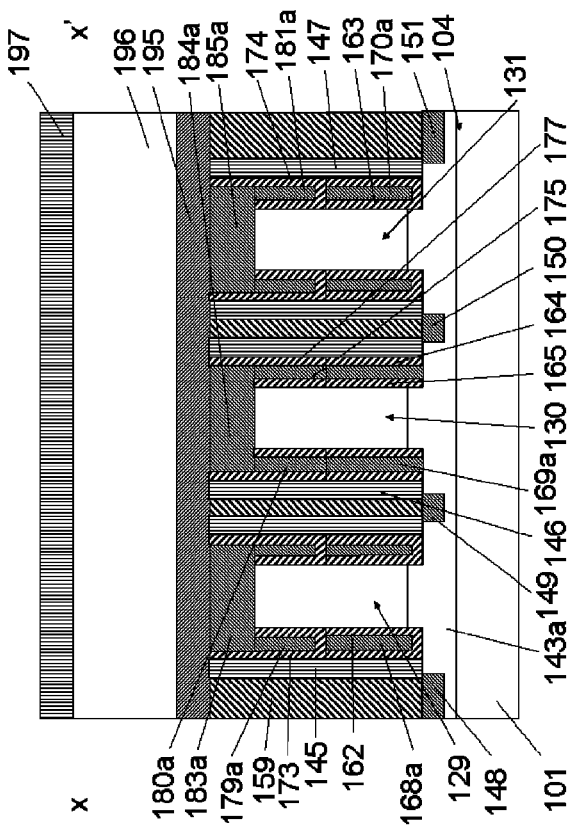
FIG. 45B is a sectional view taken along line X-X' of FIG. 45A.

As shown in FIGS. 45A, 45B and 45C, a metal 195 for a lower electrode, a resistance-changing film 196, and a nitride film 197 are deposited.

As shown in FIGS. 46A, 46B and 46C, sixth resists 198, 199, 200, and 201 for forming a pillar-shaped resistance-changing layer and a lower electrode are formed.

As shown in FIGS. 47A, 47B and 47C, the nitride film 197, the resistance-changing film 196, and the metal 195 are etched. The nitride film 197 is separated into nitride films 197a, 197b, 197c, and 197d. The resistance-changing film 196 is separated into pillar-shaped resistance-changing layers 196a, 196b, 196c, and 196d. The metal 195 is separated into lower electrodes 195a, 195b, 195c, and 195d.

As shown in FIGS. 48A, 48B and 48C, the sixth resists 198, 199, 200, and 201 are removed.

Figure 49C:
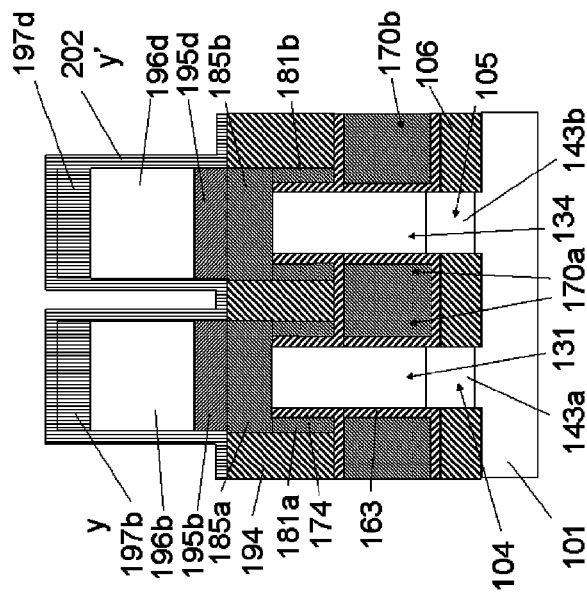
FIG. 49C is a sectional view taken along line Y-Y' of FIG. 49A.
Figure 49A:
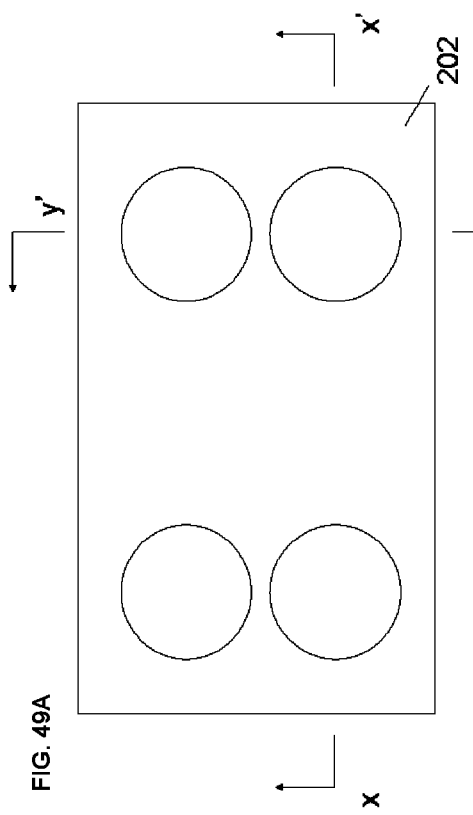
FIG. 49A is a plan view showing a method for producing a semiconductor device according to the present invention.
Figure 49B:
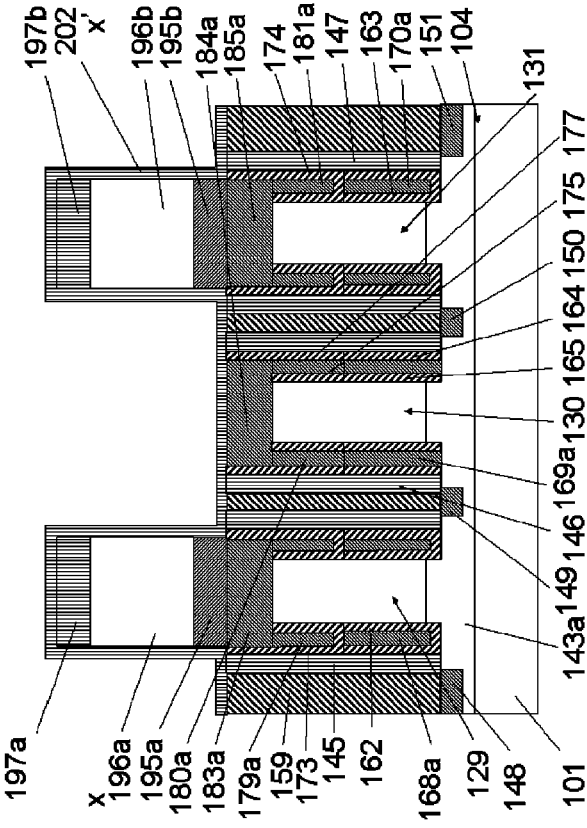
FIG. 49B is a sectional view taken along line X-X' of FIG. 49A.

As shown in FIGS. 49A, 49B and 49C, a reset gate insulating film 202 is deposited.

As shown in FIGS. 50A, 50B and 50C, a metal 203 to serve as a rest gate is deposited.

As shown in FIGS. 51A, 51B and 51C, the metal 203 is etched back.

Figure 52C:
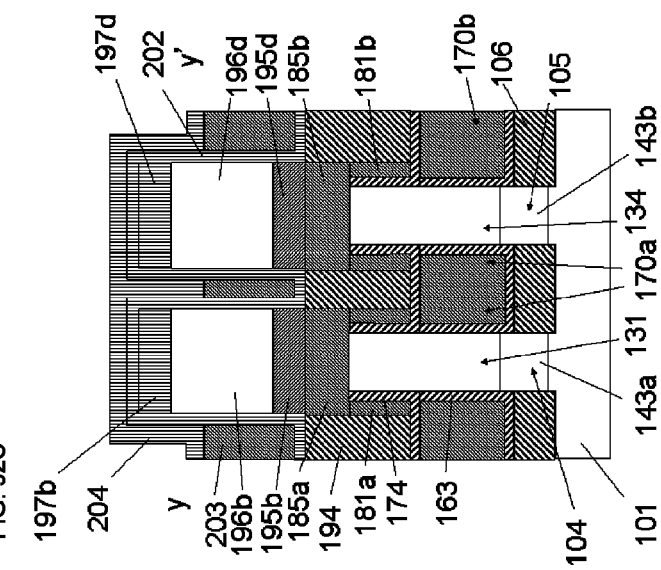
FIG. 52C is a sectional view taken along line Y-Y' of FIG. 52A.
Figure 52A:
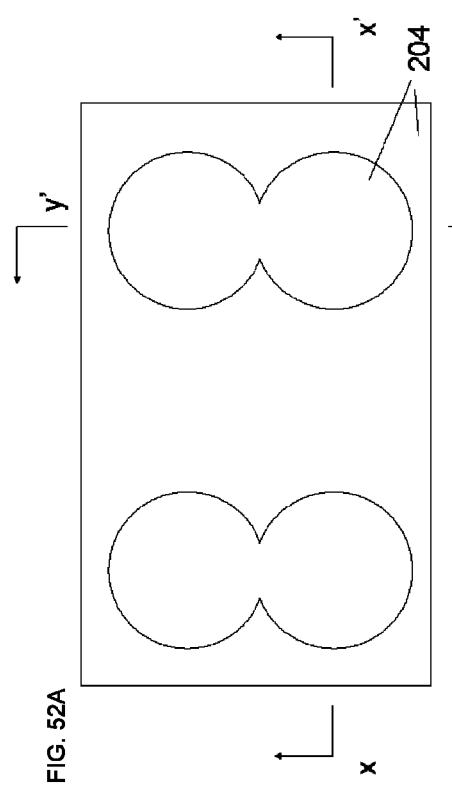
FIG. 52A is a plan view showing a method for producing a semiconductor device according to the present invention.
Figure 52B:
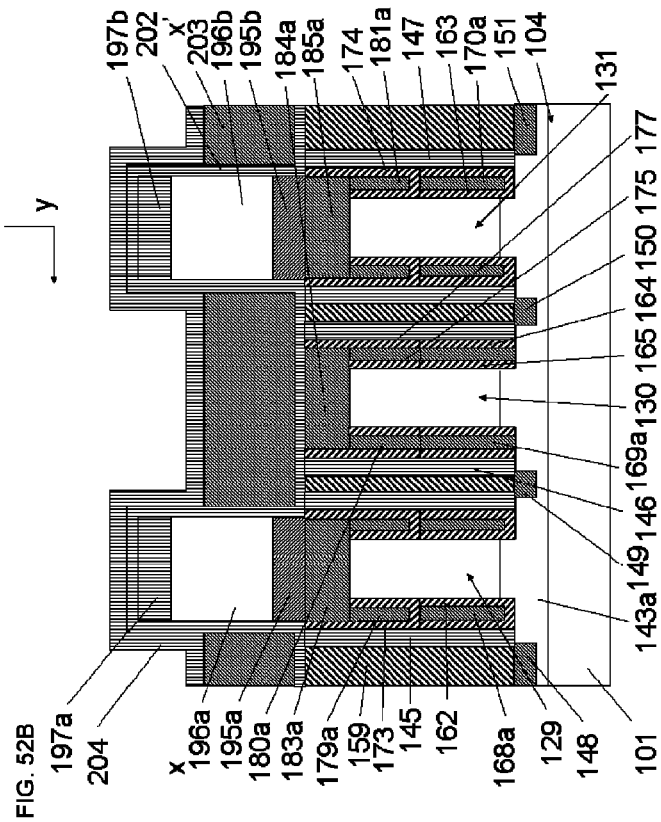
FIG. 52B is a sectional view taken along line X-X' of FIG. 52A.

As shown in FIGS. 52A, 52B and 52C, a nitride film 204 is deposited.

Figure 53A:
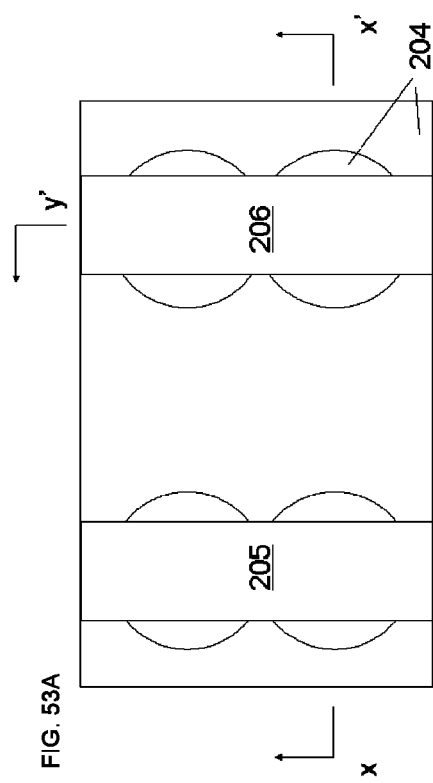
FIG. 53A is a plan view showing a method for producing a semiconductor device according to the present invention.
Figure 53B:
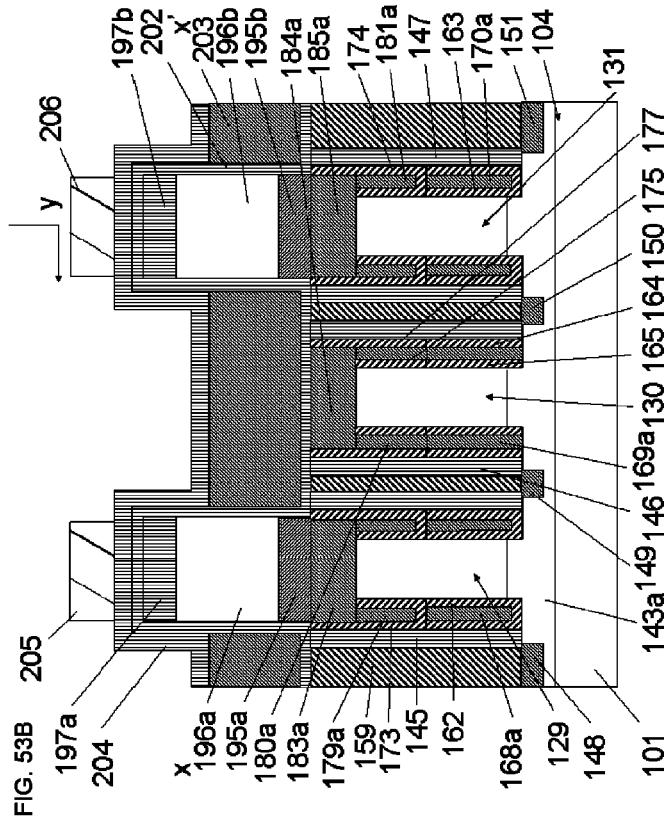
FIG. 53B is a sectional view taken along line X-X' of FIG. 53A.
Figure 53C:
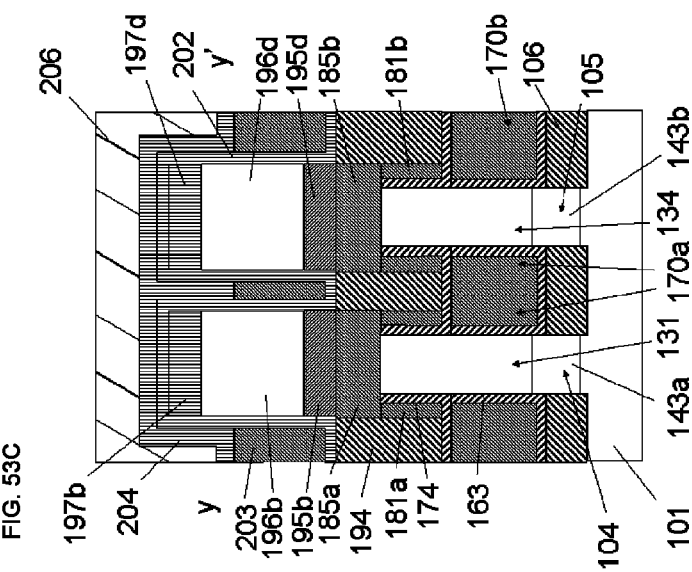
FIG. 53C is a sectional view taken along line Y-Y' of FIG. 53A.

As shown in FIGS. 53A, 53B and 53C, seventh resists 205 and 206 for forming reset gates are formed.

As shown in FIGS. 54A, 54B and 54C, the nitride film 204 is etched. The nitride film 204 is separated into nitride films 204a and 204b.

As shown in FIGS. 55A, 55B and 55C, the metal 203 is etched using the seventh resists 205 and 206 and the nitride films 204a and 204b as masks to form reset gates 203a and 203b.

As shown in FIGS. 56A, 56B and 56C, the seventh resists 205 and 206 are removed.

As shown in FIGS. 57A, 57B and 57C, a third interlayer insulating film 207 is deposited.

As shown in FIGS. 58A, 58B and 58C, the third interlayer insulating film 207 is planarized and the nitride films 197a, 197b, 197c, and 197d are removed to expose the upper portions of the pillar-shaped resistance-changing layers 196a, 196b, 196c, and 196d.

Figure 59A:
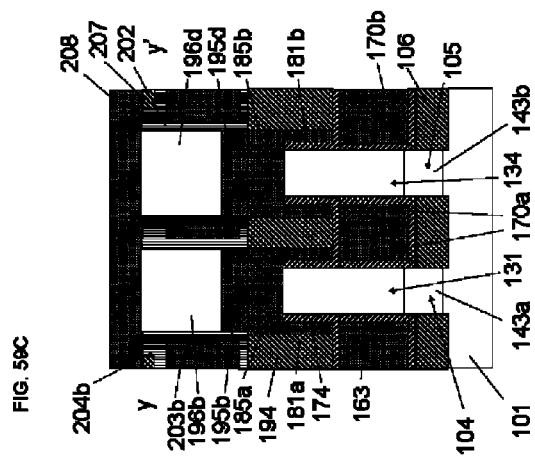
FIG. 59A is a plan view showing a method for producing a semiconductor device according to the present invention.
Figure 59B:
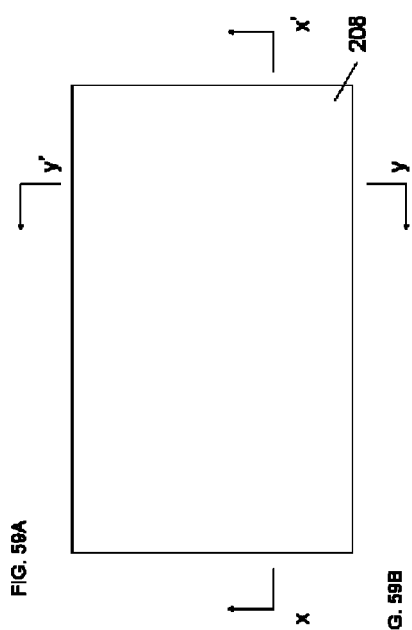
FIG. 59B is a sectional view taken along line X-X' of FIG. 59A.
Figure 59C:
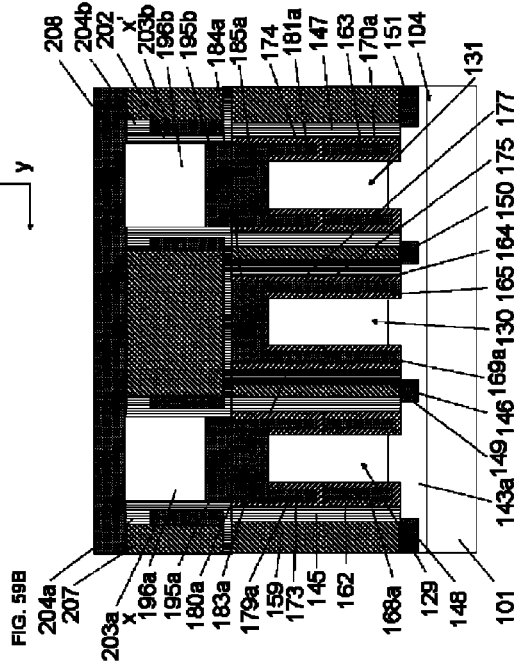
FIG. 59C is a sectional view taken along line Y-Y' of FIG. 59A.

As shown in FIGS. 59A, 59B and 59C, a metal 208 is deposited.

As shown in FIGS. 60A, 60B and 60C, eighth resists 209 and 210 for forming bit lines are formed.

Figure 61A:
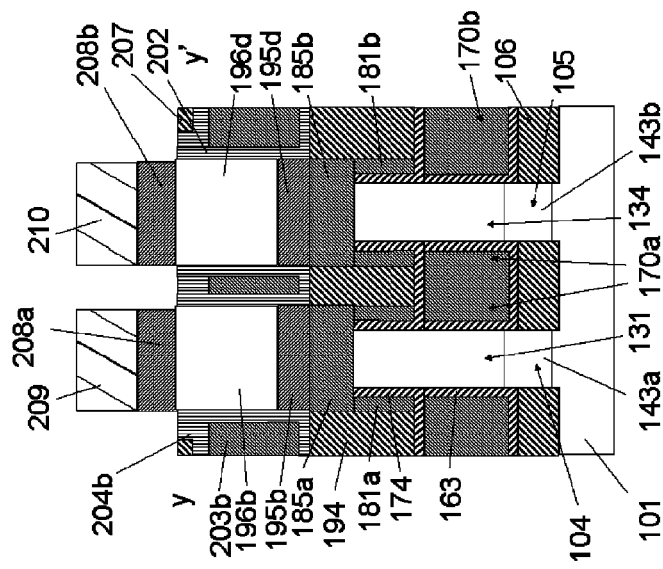
FIG. 61A is a plan view showing a method for producing a semiconductor device according to the present invention.
Figure 61B:
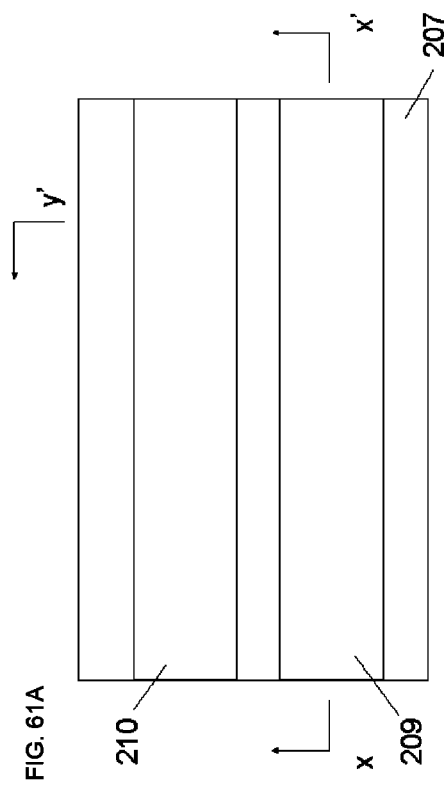
FIG. 61B is a sectional view taken along line X-X' of FIG. 61A.
Figure 61C:
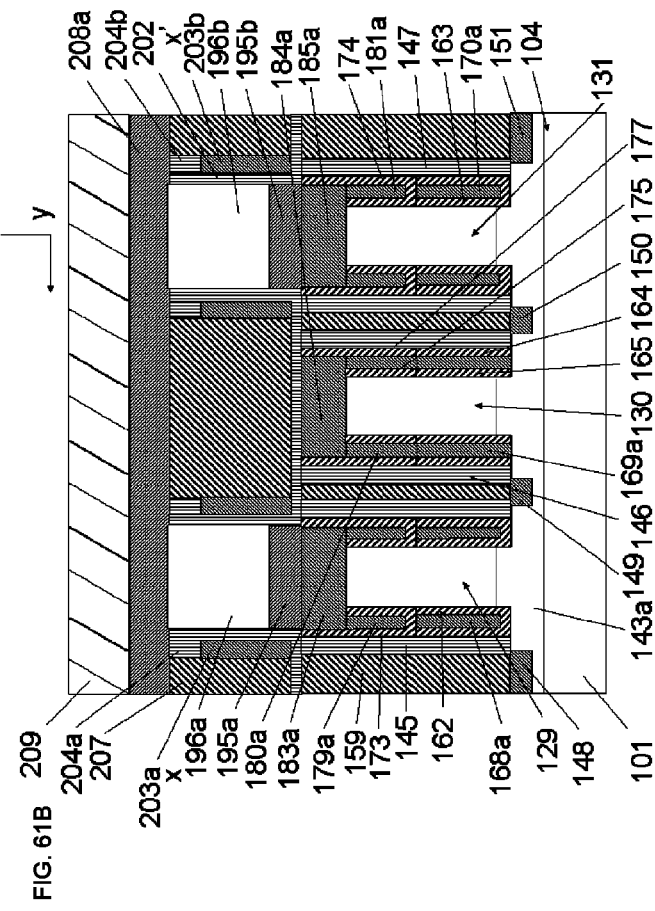
FIG. 61C is a sectional view taken along line Y-Y' of FIG. 61A.

As shown in FIGS. 61A, 61B and 61C, the metal 208 is etched to form bit lines 208a and 208b.

As shown in FIGS. 62A, 62B and 62C, the eighth resists 209 and 210 are removed.

The seventh step has been described, the seventh step including, after the sixth step, depositing a second interlayer insulating film and planarizing the second interlayer insulating film to expose an upper portion of the second contact, forming a pillar-shaped resistance-changing layer and a lower electrode, forming a reset gate insulating film so that the reset gate insulating film surrounds the pillar-shaped resistance-changing layer and the lower electrode, and forming a reset gate.

The production process for forming a structure of a semiconductor device according to an embodiment of the present invention has been described.

In the present invention, various embodiments and modifications can be made without departing from the broad sprit and scope of the present invention. Furthermore, the above-described embodiment is provided to describe one embodiment of the present invention, and the scope of the present invention is not limited thereto.

For example, a method for producing a semiconductor device in which the p-type (including the p$^+$-type) and the n-type (including the n$^+$-type) are each changed to the opposite conductivity type in the above embodiment, and a semiconductor device produced by the method are also obviously included in the technical scope of the present invention.

The invention claimed is:

1. A method for producing a semiconductor device, comprising:
a first step of forming a fin-shaped semiconductor layer on a semiconductor substrate and forming a first insulating film around the fin-shaped semiconductor layer;
after the first step, a second step of
forming a first pillar-shaped semiconductor layer, a first dummy gate constituted by a first polysilicon, a second pillar-shaped semiconductor layer, and a second dummy gate constituted by the first polysilicon;
after the second step, a third step of
forming a third dummy gate and a fourth dummy gate on side walls of the first dummy gate, the first pillar-shaped semiconductor layer, the second dummy gate, and the second pillar-shaped semiconductor layer;
after the third step, a fourth step of
forming a diffusion layer in an upper portion of the fin-shaped semiconductor layer, a lower portion of the first pillar-shaped semiconductor layer, and a lower portion of the second pillar-shaped semiconductor layer;
after the fourth step, a fifth step of
depositing a first interlayer insulating film,
exposing upper portions of the first dummy gate, the second dummy gate, the third dummy gate, and the fourth dummy gate,
removing the first dummy gate, the second dummy gate, the third dummy gate, and the fourth dummy gate,
forming a first gate insulating film around the first pillar-shaped semiconductor layer and the second pillar-shaped semiconductor layer,
removing a portion of the first gate insulating film located in a periphery of a bottom portion of the second pillar-shaped semiconductor layer,
depositing a first metal,
exposing an upper portion of the first pillar-shaped semiconductor layer and an upper portion of the second pillar-shaped semiconductor layer,
forming a gate electrode and a gate line around the first pillar-shaped semiconductor layer, and
forming a contact electrode and a contact line around the second pillar-shaped semiconductor layer;
after the fifth step, a sixth step of
depositing a second gate insulating film around the first pillar-shaped semiconductor layer, on the gate electrode and the gate line, around the second pillar-shaped semiconductor layer, and on the contact electrode and the contact line,
depositing a second metal,
exposing an upper portion of the first pillar-shaped semiconductor layer and an upper portion of the second pillar-shaped semiconductor layer,
removing a portion of the second gate insulating film on the first pillar-shaped semiconductor layer, the contact electrode and the contact line,
depositing a third metal, and
etching portions of the third metal and the second metal to form a first contact in which the second metal surrounds an upper side wall of the first pillar-shaped semiconductor layer and a second contact which connects an upper portion of the first contact to an upper portion of the first pillar-shaped semiconductor layer; and
after the sixth step, a seventh step of
depositing a second interlayer insulating film and planarizing the second interlayer insulating film to expose an upper portion of the second contact, and
forming a pillar-shaped resistance-changing layer and a lower electrode,
forming a reset gate insulating film so that the reset gate insulating film surrounds the pillar-shaped resistance-changing layer and the lower electrode, and
forming a reset gate.

2. The method for producing a semiconductor device according to claim 1, wherein the second step further includes:
forming a second insulating film around the fin-shaped semiconductor layer;
depositing the first polysilicon on the second insulating film and planarizing the first polysilicon;
forming a first resist for forming a first gate line, the first pillar-shaped semiconductor layer, a first contact line, and the second pillar-shaped semiconductor layer so that the first resist extends in a direction perpendicular to a direction in which the fin-shaped semiconductor layer extends; and
etching the first polysilicon, the second insulating film, and the fin-shaped semiconductor layer to form the first pillar-shaped semiconductor layer, the first dummy gate constituted by the first polysilicon, the second pillar-shaped semiconductor layer, and the second dummy gate constituted by the first polysilicon.

3. The method for producing a semiconductor device according to claim 2, further comprising, after depositing the first polysilicon on the second insulating film and planarizing the first polysilicon, forming a third insulating film on the first polysilicon.

4. The method for producing a semiconductor device according to claim 2, wherein the third step further comprises:
forming a fourth insulating film around the first pillar-shaped semiconductor layer, the second pillar-shaped semiconductor layer, the first dummy gate, and the second dummy gate, depositing a second polysilicon around the fourth insulating film, and
forming the third dummy gate and the fourth dummy gate by etching the second polysilicon so that the second polysilicon is left on side walls of the first dummy gate, the first pillar-shaped semiconductor layer, the second dummy gate, and the second pillar-shaped semiconductor layer.

5. The method for producing a semiconductor device according to claim 4, wherein the fourth step further comprises:
forming a fifth insulating film around the third dummy gate and the fourth dummy gate, etching the fifth insulating film to make the fifth insulating film remain as a side wall, and forming a metal-semiconductor compound in an upper portion of the diffusion layer.

6. The method for producing a semiconductor device according to claim 5, wherein the fifth step further comprises:

performing chemical mechanical polishing to expose the upper portions of the first dummy gate, the second dummy gate, the third dummy gate, and the fourth dummy gate, removing the second insulating film and the fourth insulating film, forming the first gate insulating film on an inner side of the fifth insulating film, forming a second resist for removing a portion of the gate insulating film located in a periphery of a bottom portion of the second pillar-shaped semiconductor layer, removing the portion of the gate insulating film located in the periphery of the bottom portion of the second pillar-shaped semiconductor layer, and etching back the first metal to expose an upper portion of the first pillar-shaped semiconductor layer and an upper portion of the second pillar-shaped semiconductor layer, to form the gate electrode and the gate line around the first pillar-shaped semiconductor layer, and to form the contact electrode and the contact line around the second pillar-shaped semiconductor layer.

* * * * *